(12) United States Patent
Cohen et al.

(10) Patent No.: US 7,517,462 B2
(45) Date of Patent: *Apr. 14, 2009

(54) ELECTROCHEMICAL FABRICATION METHODS INCORPORATING DIELECTRIC MATERIALS AND/OR USING DIELECTRIC SUBSTRATES

(75) Inventors: Adam L. Cohen, Los Angeles, CA (US); Michael S. Lockard, Lake Elizabeth, CA (US); Kieun Kim, Pasadena, CA (US); Qui T. Le, Anaheim, CA (US); Gang Zhang, Monterey Park, CA (US); Uri Frodis, Los Angeles, CA (US); Dale S. McPherson, Kissimmee, FL (US); Dennis R. Smalley, Newhall, CA (US)

(73) Assignee: Microfabrica Inc., Van Nuys, CA (US)

( * ) Notice: Subject to any disclaimer, the term of this patent is extended or adjusted under 35 U.S.C. 154(b) by 161 days.

This patent is subject to a terminal disclaimer.

(21) Appl. No.: 11/029,014

(22) Filed: Jan. 3, 2005

(65) Prior Publication Data
US 2005/0173374 A1    Aug. 11, 2005

Related U.S. Application Data

(63) Continuation-in-part of application No. 10/841,300, filed on May 7, 2004, and a continuation-in-part of application No. 10/607,931, filed on Jun. 27, 2003, now Pat. No. 7,239,219.

(60) Provisional application No. 60/574,733, filed on May 26, 2004, provisional application No. 60/533,891, filed on Dec. 31, 2003, provisional application No. 60/534,157, filed on Dec. 31, 2003, provisional application No. 60/533,932, filed on Dec. 31, 2003.

(51) Int. Cl.
*B81C 1/00* (2006.01)

(52) U.S. Cl. ................... 216/2; 216/13; 216/38; 216/39; 216/56; 205/118; 205/223

(58) Field of Classification Search ............. None
See application file for complete search history.

(56) References Cited

U.S. PATENT DOCUMENTS 5,190,637 A * 3/1993 Guckel ............... 205/118

(Continued)

OTHER PUBLICATIONS

Cohen, et al., "EFAB: Batch Production of Functional, Fully-Dense Metal Parts with Micron-Scale Features", Proc. 9th Solid Freeform Fabrication, The University of Texas at Austin, Aug. 1998, pp. 161.

(Continued)

*Primary Examiner*—Anita K Alanko
(74) *Attorney, Agent, or Firm*—Dennis R. Smalley

(57) ABSTRACT

Some embodiments of the present invention are directed to techniques for building up single layer or multi-layer structures on dielectric or partially dielectric substrates. Certain embodiments deposit seed layer material directly onto substrate materials while other embodiments use an intervening adhesion layer material. Some embodiments use different seed layer materials and/or adhesion layer materials for sacrificial and structural conductive building materials. Some embodiments apply seed layer and/or adhesion layer materials in what are effectively selective manners while other embodiments apply the materials in blanket fashion. Some embodiments remove extraneous depositions (e.g. depositions to regions unintended to form part of a layer) via planarization operations while other embodiments remove the extraneous material via etching operations. Other embodiments are directed to the electrochemical fabrication of multilayer mesoscale or microscale structures which are formed using at least one conductive structural material, at least one conductive sacrificial material, and at least one dielectric material. In some embodiments the dielectric material is a UV-curable photopolymer.

13 Claims, 34 Drawing Sheets

U.S. PATENT DOCUMENTS

| | | | | |
|---|---|---|---|---|
| 5,287,619 | A | * | 2/1994 | Smith et al. .................. 29/852 |
| 5,298,687 | A | * | 3/1994 | Rapoport et al. ............ 174/261 |
| 6,008,102 | A | | 12/1999 | Alford et al. ................ 438/381 |
| 6,027,630 | A | * | 2/2000 | Cohen ......................... 205/135 |
| 6,245,249 | B1 | * | 6/2001 | Yamada et al. ................ 216/33 |
| 6,596,624 | B1 | * | 7/2003 | Romankiw .................. 438/619 |
| 7,239,219 | B2 | | 7/2007 | Brown ......................... 333/156 |
| 7,259,640 | B2 | | 8/2007 | Brown ......................... 333/160 |
| 7,271,022 | B2 | * | 9/2007 | Tang et al. ..................... 438/48 |
| 2002/0098677 | A1 | * | 7/2002 | Ahn et al. .................... 438/622 |
| 2002/0115292 | A1 | * | 8/2002 | Andricacos et al. .......... 438/687 |
| 2003/0077871 | A1 | * | 4/2003 | Cheng et al. ................ 438/381 |
| 2005/0032375 | A1 | | 2/2005 | Lockard et al. ............... 216/41 |

OTHER PUBLICATIONS

Adam L. Cohen, et al., "EFAB: Rapid, Low-Cost Desktop Micromachining of High Aspect Ratio True 3-D MEMS", Proc. 12th IEEE Micro Electro Mechanical Systems Workshop, IEEE, Jan. 17-21, 1999, pp. 244-251.

"Microfabrication—Rapid Prototyping's Killer Application", Rapid Prototyping Report, CAD/CAM Publishing, Inc., Jun. 1999, pp. 1-5.

Adam L. Cohen, "3-D Micromachining by Electrochemical Fabrication", Micromachine Devices, Mar. 1999, pp. 6-7.

Gang Zhang, et al., "EFAB: Rapid Desktop Manufacturing of True 3-D Microstructures", Proc. 2nd International Conference on Integrated MicroNanotechnology for Space Applications, The Aerospace Co., Apr. 1999.

F. Tseng, et al., "EFAB: High Aspect Ratio, Arbitrary 3-D Metal Microstructures Using a Low-Cost Automated Batch Process", 3rd International Workshop on High Aspect Ratio Microstructure Technology (HARMST'99), Jun. 1999.

Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.

F. Tseng, et al., "EFAB: High Aspect Ratio, Arbitrary 3-D Metal Microstructures Using a Low-Cost Automated Batch Process", MEMS Symposium, ASME 1999 International Mechanical Engineering Congress and Exposition, Nov. 1999.

Adam L. Cohen, "Electrochemical Fabrication (EFABTM)", Chapter 19 of the MEMS Handbook, edited by Mohamed Gad-El-Hak, CRC Press, 2002, pp. 19/1-19/23.

* cited by examiner

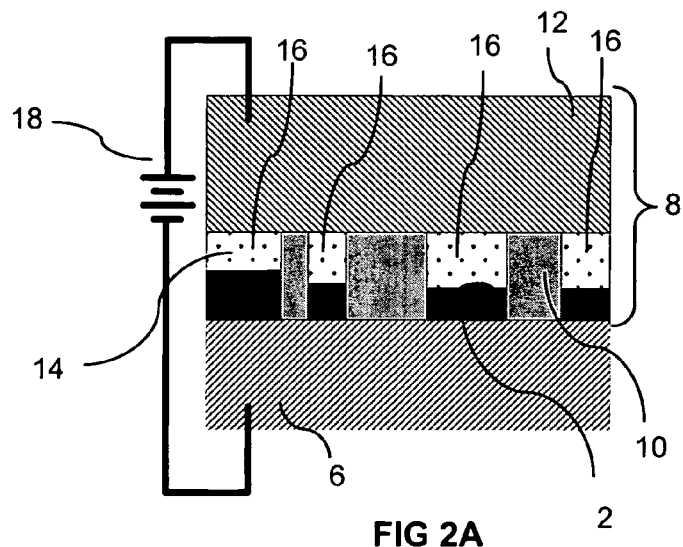
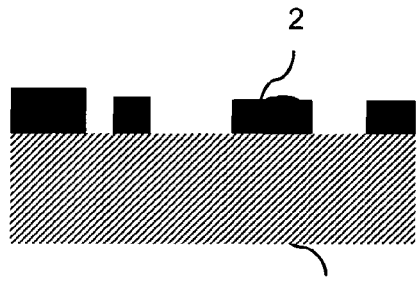
FIG 2A  FIG 2B
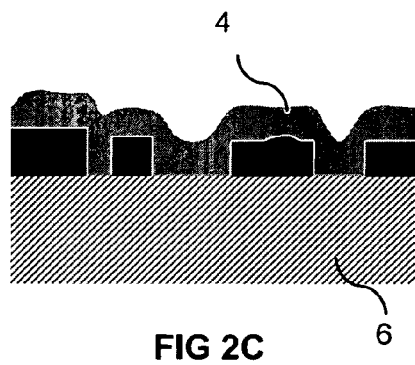
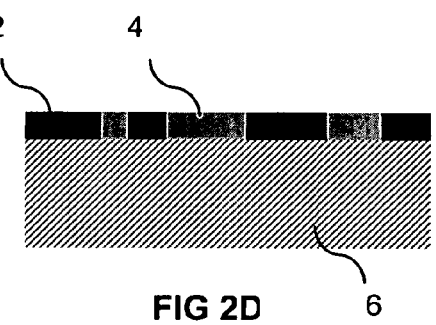
FIG 2C  FIG 2D
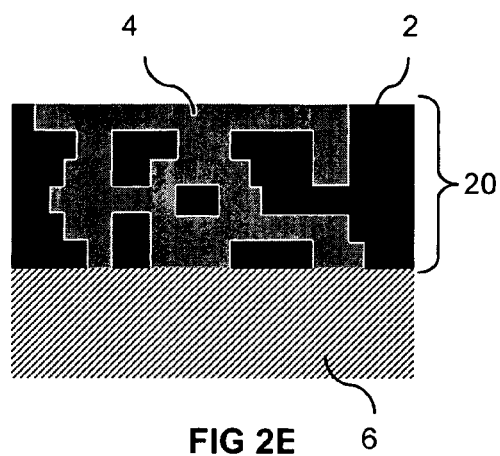
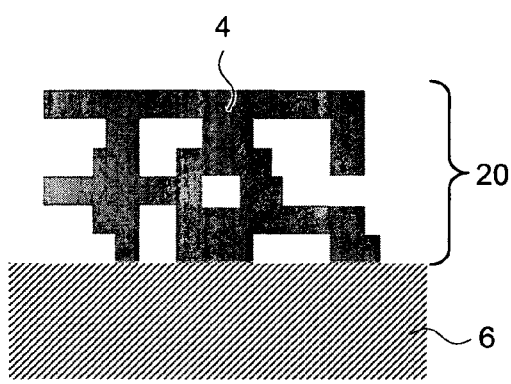
FIG 2E  FIG 2F

Both an SLM and a ALM blanket the whole substrate (i.e. they are initially located under both the SacMat and the StrMat regions ⟵ 142

→ Remove exposed portions of the SLM and ALM after formation of the last layer and after removal of the SacMat ⟵ 144

→ Remove exposed portions of the SLM prior to formation of the last layer (e.g. prior to formation of a next layer) and apply a different SLM ⟵ 146

→ Remove exposed portions of a first SLM and an associated ALM prior to formation of the last layer and reapply the ALM or a different ALM in a blanket fashion and the same or a different SLM in a blanket or selective manner ⟵ 148

→ Remove exposed portions of SLM and ALM after deposition of a StrMat, then deposit an SLM for the SacMat and deposit the SacMat ⟵ 150

FIG 5D

ALM covers the substrate while a 1st SLM covers only one of the StrMat or SacMat regions and a separately applied 2nd SLM covers the other regions ⟵ 152

→ Apply an SLM over StrMat regions, selectively deposit StrMat, deposit a different SLM into voids in the StrMat, and then deposit SacMat ⟵ 154

→ Apply an SLM over SacMat regions, deposit SacMat, deposit a different SLM into the voids in SacMat, and then deposit StrMat ⟵ 156

→ SLM is applied to only the SacMat region while a nickel strike is applied to a StrMat region ⟵ 162

→ Deposit StrMat prior to depositing SacMat ⟵ 164

→ Deposit SacMat prior to depositing StrMat ⟵ 166

FIG 5E

Apply a 1st seed layer stack to a 1st portion of a substrate to allow deposition of a 1st selected material to the 1st portion and thereafter a apply a 2nd seed layer stack to a 2nd portion of a substrate to allow deposition of a 2nd selected material to the 2nd portion ~172

Use a patterned material (e.g. a dielectric) to define regions where a 1st seed layer stack and a 1st material will be deposited and then use those deposited materials to provide a pattern for deposition of a 2nd seed layer stack and a 2nd material ~174

If the SLM for the 1st and 2nd seed layer stacks are the same - removal of the SLM associated the sacrificial material may occur without damaging the SLM for the structural by ensuring that the design of the structure of the 2nd Layer of StrMat covers and more preferably extends over the boundary regions separating the StrMat from the SacMat on the 1st layer ~176

If the SLM for the 1st and 2nd seed layer stacks are different and the SacMat, the SLM, and the ALM for the SacMat can be separated from the SLM and ALM of the StrMat without damaging them, there are no restrictions on the design of the 2nd layer relative to the 1st layer ~178

FIG 5F

Use both an SLM and an ALM for one of the StrMat and SacMat and use only an SLM in association with deposition of the other of the StrMat or SacMat. ~182

~184

Use ALM & SLM for StrMat and a different SLM for SacMat but no separate ALM

Use ALM & SLM for SacMat and a different SLM for StrMat but no separate ALM

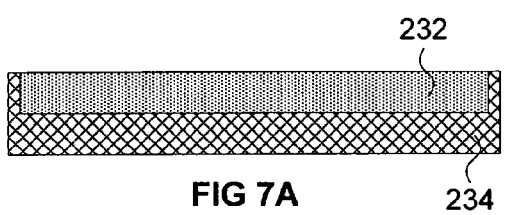
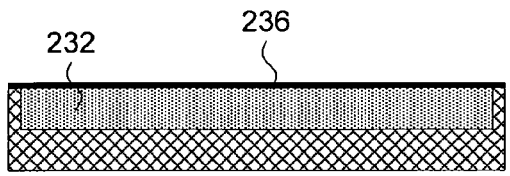
FIG 7A
FIG 7B
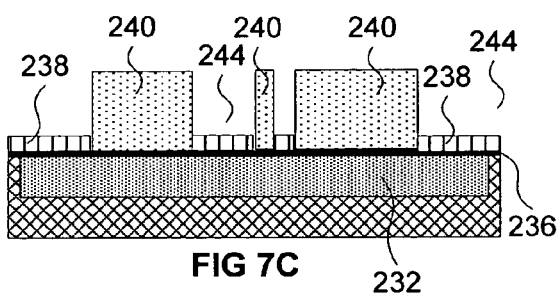
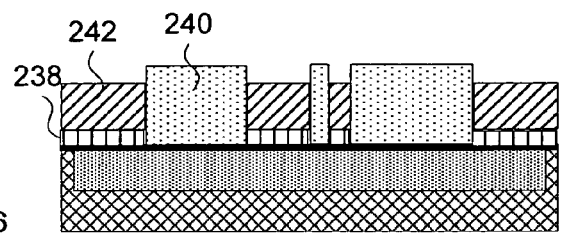
FIG 7C
FIG 7D
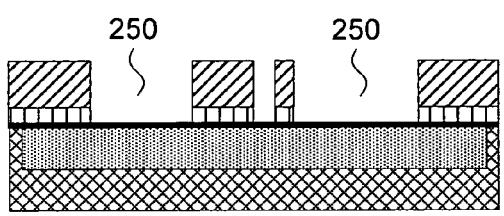
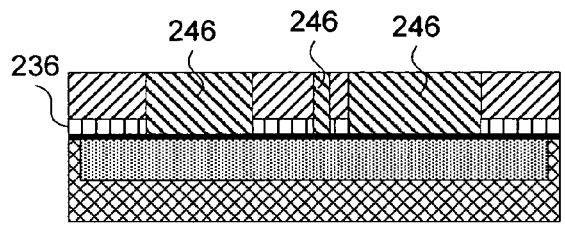
FIG 7E
FIG 7F
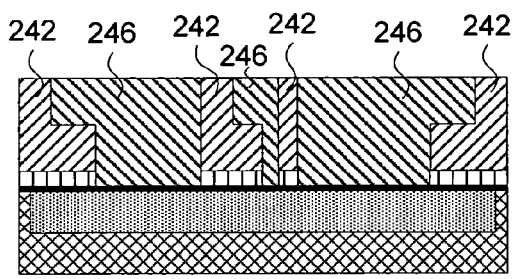
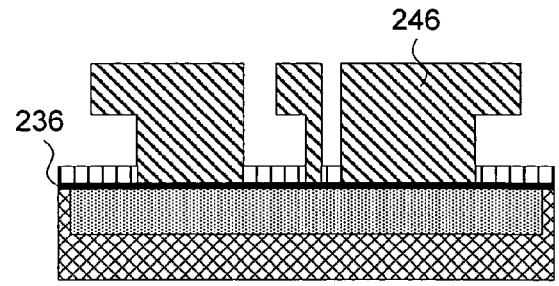
FIG 7G
FIG 7H
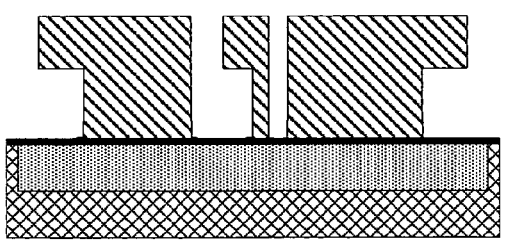
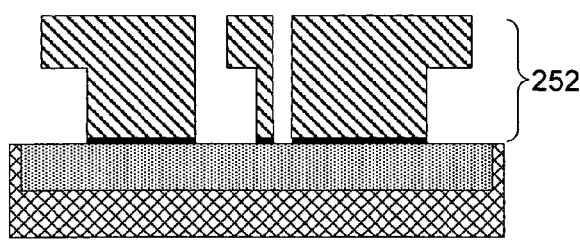
FIG 7I
FIG 7J

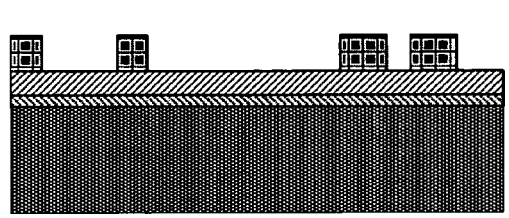
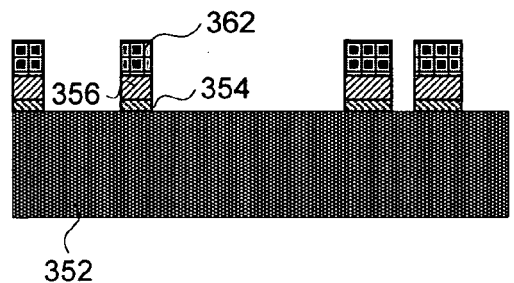
FIG 11GFIG 11H
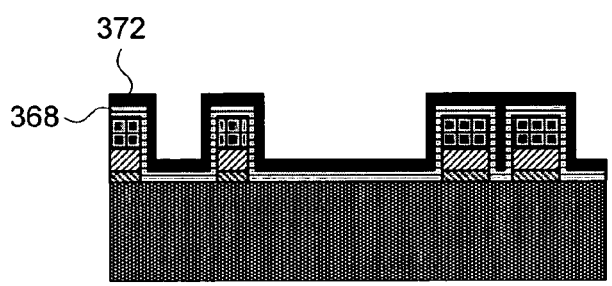
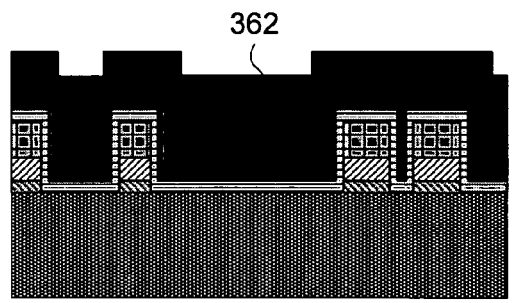
FIG 11IFIG 11J
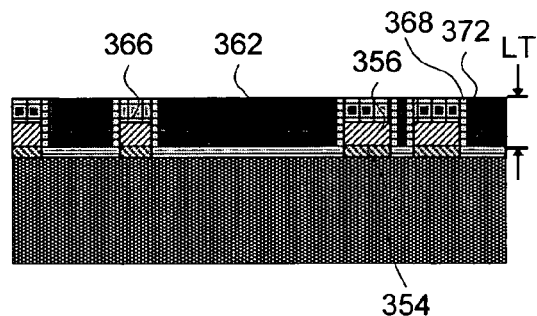
FIG 11K

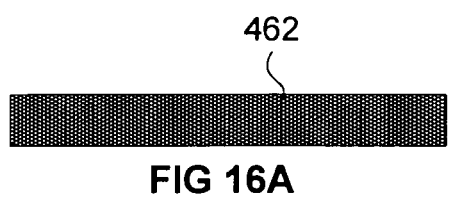
FIG 16A
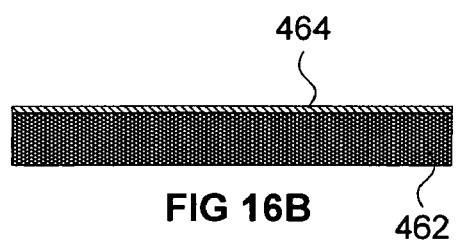
FIG 16B
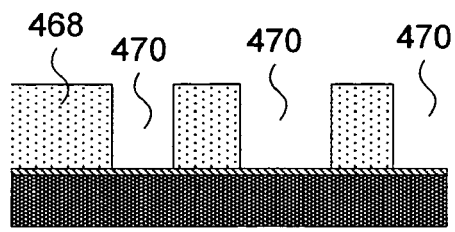
FIG 16C
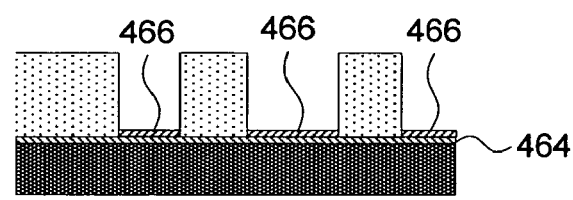
FIG 16D
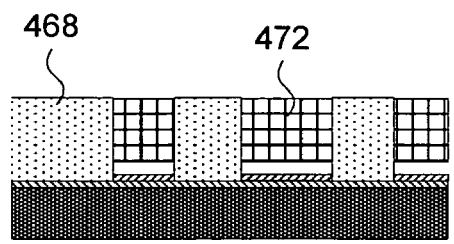
FIG 16E
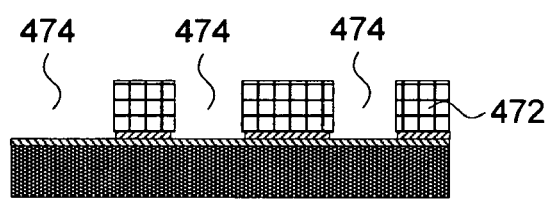
FIG 16F
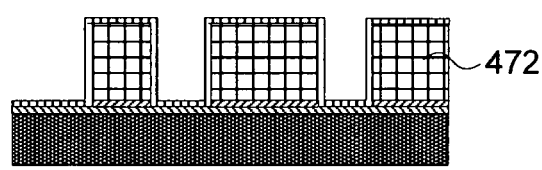
FIG 16G
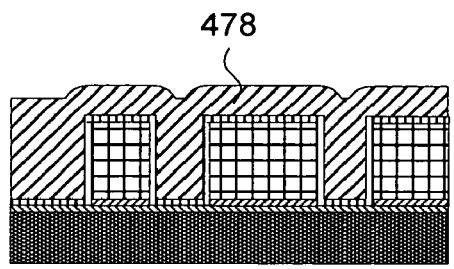
FIG 16H
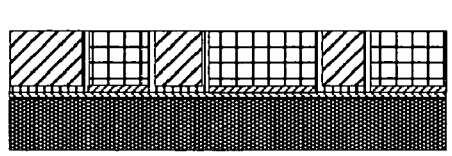
FIG 16I
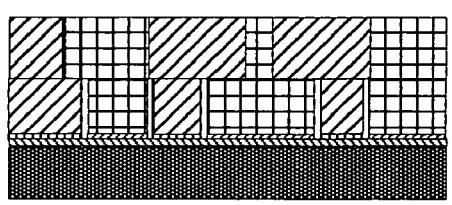
FIG 16J

ELECTROCHEMICAL FABRICATION METHODS INCORPORATING DIELECTRIC MATERIALS AND/OR USING DIELECTRIC SUBSTRATES

RELATED APPLICATIONS

This application claims benefit of U.S. Provisional Patent Application Nos. 60/533,932, 60/534,157, 60/533,891, and 60/574,733, filed on Dec. 31, 2003, Dec. 31, 2003, Dec. 31, 2003, and May 26, 2004. This application is a continuation in part of U.S. Non-Provisional patent application Ser. Nos. 10/841,300, and 10/607,931 now U.S. Pat. No. 7,239,219 filed on May 7, 2004 and Jun. 27, 2003, respectively. Each of the above noted priority applications are hereby incorporated herein by reference as if set forth in full.

FIELD OF THE INVENTION

The present invention relates generally to the field of Electrochemical Fabrication and the associated formation of three-dimensional structures (e.g. microscale or mesoscale structures). More particularly, it relates to the electrochemical fabrication methods that form structures on dielectric substrates and/or forms structures from layers that incorporate dielectrics.

BACKGAROUND OF THE INVENTION

A technique for forming three-dimensional structures (e.g. parts, components, devices, and the like) from a plurality of adhered layers was invented by Adam L. Cohen and is known as Electrochemical Fabrication. It is being commercially pursued by Microfabrica Inc. (formerly MEMGen® Corporation) of Burbank, Calif. under the name EFAB™. This technique was described in U.S. Pat. No. 6,027,630, issued on Feb. 22, 2000. This electrochemical deposition technique allows the selective deposition of a material using a unique masking technique that involves the use of a mask that includes patterned conformable material on a support structure that is independent of the substrate onto which plating will occur. When desiring to perform an electrodeposition using the mask, the conformable portion of the mask is brought into contact with a substrate while in the presence of a plating solution such that the contact of the conformable portion of the mask to the substrate inhibits deposition at selected locations. For convenience, these masks might be generically called conformable contact masks; the masking technique may be generically called a conformable contact mask plating process. More specifically, in the terminology of Microfabrica Inc. (formerly MEMGen® Corporation) of Burbank, Calif. such masks have come to be known as INSTANT MASKS™ and the process known as INSTANT MASKINGTM or INSTANT MASKTM plating. Selective depositions using conformable contact mask plating may be used to form single layers of material or may be used to form multi-layer structures. The teachings of the '630 patent are hereby incorporated herein by reference as if set forth in full herein. Since the filing of the patent application that led to the above noted patent, various papers about conformable contact mask plating (i.e. INSTANT MASKING) and electrochemical fabrication have been published:

(1) A. Cohen, G. Zhang, F. Tseng, F. Mansfeld, U. Frodis and P. Will, "EFAB: Batch production of functional, fully-dense metal parts with micro-scale features", Proc. 9th Solid Freeform Fabrication, The University of Texas at Austin, p161, August 1998.

(2) A. Cohen, G. Zhang, F. Tseng, F. Mansfeld, U. Frodis and P. Will, "EFAB: Rapid, Low-Cost Desktop Micromachining of High Aspect Ratio True 3-D MEMS", Proc. 12th IEEE Micro Electro Mechanical Systems Workshop, IEEE, p244, January 1999.

(3) A. Cohen, "3-D Micromachining by Electrochemical Fabrication", Micromachine Devices, March 1999.

(4) G. Zhang, A. Cohen, U. Frodis, F. Tseng, F. Mansfeld, and P. Will, "EFAB: Rapid Desktop Manufacturing of True 3-D Microstructures", Proc. 2nd International Conference on Integrated MicroNanotechnology for Space Applications, The Aerospace Co., April 1999.

(5) F. Tseng, U. Frodis, G. Zhang, A. Cohen, F. Mansfeld, and P. Will, "EFAB: High Aspect Ratio, Arbitrary 3-D Metal Microstructures using a Low-Cost Automated Batch Process", 3rd International Workshop on High Aspect Ratio MicroStructure Technology (HARMST'99), June 1999.

(6) A. Cohen, U. Frodis, F. Tseng, G. Zhang, F. Mansfeld, and P. Will, "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, September 1999.

(7) F. Tseng, G. Zhang, U. Frodis, A. Cohen, F. Mansfeld, and P. Will, "EFAB: High Aspect Ratio, Arbitrary 3-D Metal Microstructures using a Low-Cost Automated Batch Process", MEMS Symposium, ASME 1999 International Mechanical Engineering Congress and Exposition, November, 1999.

(8) A. Cohen, "Electrochemical Fabrication (EFABTM)", Chapter 19 of The MEMS Handbook, edited by Mohamed Gad-El-Hak, CRC Press, 2002.

(9) Microfabrication—Rapid Prototyping's Killer Application", pages 1-5 of the Rapid Prototyping Report, CAD/CAM Publishing, Inc., June 1999.

The disclosures of these nine publications are hereby incorporated herein by reference as if set forth in full herein.

The electrochemical deposition process may be carried out in a number of different ways as set forth in the above patent and publications. In one form, this process involves the execution of three separate operations during the formation of each layer of the structure that is to be formed:

1. Selectively depositing at least one material by electrodeposition upon one or more desired regions of a substrate.

2. Then, blanket depositing at least one additional material by electrodeposition so that the additional deposit covers both the regions that were previously selectively deposited onto, and the regions of the substrate that did not receive any previously applied selective depositions.

3. Finally, planarizing the materials deposited during the first and second operations to produce a smoothed surface of a first layer of desired thickness having at least one region containing the at least one material and at least one region containing at least the one additional material.

After formation of the first layer, one or more additional layers may be formed adjacent to the immediately preceding layer and adhered to the smoothed surface of that preceding layer. These additional layers are formed by repeating the first through third operations one or more times wherein the formation of each subsequent layer treats the previously formed layers and the initial substrate as a new and thickening substrate.

Once the formation of all layers has been completed, at least a portion of at least one of the materials deposited is generally removed by an etching process to expose or release the three-dimensional structure that was intended to be formed.

The preferred method of performing the selective electrodeposition involved in the first operation is by conformable contact mask plating. In this type of plating, one or more conformable contact (CC) masks are first formed. The CC masks include a support structure onto which a patterned conformable dielectric material is adhered or formed. The conformable material for each mask is shaped in accordance with a particular cross-section of material to be plated. At least one CC mask is needed for each unique cross-sectional pattern that is to be plated.

The support for a CC mask is typically a plate-like structure formed of a metal that is to be selectively electroplated and from which material to be plated will be dissolved. In this typical approach, the support will act as an anode in an electroplating process. In an alternative approach, the support may instead be a porous or otherwise perforated material through which deposition material will pass during an electroplating operation on its way from a distal anode to a deposition surface. In either approach, it is possible for CC masks to share a common support, i.e. the patterns of conformable dielectric material for plating multiple layers of material may be located in different areas of a single support structure. When a single support structure contains multiple plating patterns, the entire structure is referred to as the CC mask while the individual plating masks may be referred to as "submasks". In the present application such a distinction will be made only when relevant to a specific point being made.

In preparation for performing the selective deposition of the first operation, the conformable portion of the CC mask is placed in registration with and pressed against a selected portion of the substrate (or onto a previously formed layer or onto a previously deposited portion of a layer) on which deposition is to occur. The pressing together of the CC mask and substrate occur in such a way that all openings, in the conformable portions of the CC mask contain plating solution. The conformable material of the CC mask that contacts the substrate acts as a barrier to electrodeposition while the openings in the CC mask that are filled with electroplating solution act as pathways for transferring material from an anode (e.g. the CC mask support) to the non-contacted portions of the substrate (which act as a cathode during the plating operation) when an appropriate potential and/or current are supplied.

An example of a CC mask and CC mask plating are shown in FIGS. 1A-1C. FIG. 1A shows a side view of a CC mask 8 consisting of a conformable or deformable (e.g. elastomeric) insulator 10 patterned on an anode 12. The anode has two functions. FIG. 1A also depicts a substrate 6 separated from mask 8. One is as a supporting material for the patterned insulator 10 to maintain its integrity and alignment since the pattern may be topologically complex (e.g., involving isolated "islands" of insulator material). The other function is as an anode for the electroplating operation. CC mask plating selectively deposits material 22 onto a substrate 6 by simply pressing the insulator against the substrate then electrodepositing material through apertures 26a and 26b in the insulator as shown in FIG. 1B. After deposition, the CC mask is separated, preferably non-destructively, from the substrate 6 as shown in FIG. 1C. The CC mask plating process is distinct from a "through-mask" plating process in that in a through-mask plating process the separation of the masking material from the substrate would occur destructively. As with through-mask plating, CC mask plating deposits material selectively and simultaneously over the entire layer. The plated region may consist of one or more isolated plating regions where these isolated plating regions may belong to a single structure that is being formed or may belong to multiple structures that are being formed simultaneously. In CC mask plating as individual masks are not intentionally destroyed in the removal process, they may be usable in multiple plating operations.

Another example of a CC mask and CC mask plating is shown in FIGS. 1D-1F. FIG. 1D shows an anode 12' separated from a mask 8' that includes a patterned conformable material 10' and a support structure 20. FIG. 1D also depicts substrate 6 separated from the mask 8'. FIG. 1E illustrates the mask 8' being brought into contact with the substrate 6. FIG. 1F illustrates the deposit 22' that results from conducting a current from the anode 12' to the substrate 6. FIG. 1G illustrates the deposit 22' on substrate 6 after separation from mask 8'. In this example, an appropriate electrolyte is located between the substrate 6 and the anode 12' and a current of ions coming from one or both of the solution and the anode are conducted through the opening in the mask to the substrate where material is deposited. This type of mask may be referred to as an anodeless INSTANT MASK™ (AIM) or as an anodeless conformable contact (ACC) mask.

Unlike through-mask plating, CC mask plating allows CC masks to be formed completely separate from the fabrication of the substrate on which plating is to occur (e.g. separate from a three-dimensional (3D) structure that is being formed). CC masks may be formed in a variety of ways, for example, a photolithographic process may be used. All masks can be generated simultaneously, prior to structure fabrication rather than during it. This separation makes possible a simple, low-cost, automated, self-contained, and internally-clean "desktop factory" that can be installed almost anywhere to fabricate 3D structures, leaving any required clean room processes, such as photolithography to be performed by service bureaus or the like.

An example of the electrochemical fabrication process discussed above is illustrated in FIGS. 2A-2F. These figures show that the process involves deposition of a first material 2 which is a sacrificial material and a second material 4 which is a structural material. The CC mask 8, in this example, includes a patterned conformable material (e.g. an elastomeric dielectric material) 10 and a support 12 which is made from deposition material 2. The conformal portion of the CC mask is pressed against substrate 6 with a plating solution 14 located within the openings 16 in the conformable material 10. An electric current, from power supply 18, is then passed through the plating solution 14 via (a) support 12 which doubles as an anode and (b) substrate 6 which doubles as a cathode. FIG. 2A illustrates that the passing of current causes material 2 within the plating solution and material 2 from the anode 12 to be selectively transferred to and plated on the cathode 6. After electroplating the first deposition material 2 onto the substrate 6 using CC mask 8, the CC mask 8 is removed as shown in FIG. 2B. FIG. 2C depicts the second deposition material 4 as having been blanket-deposited (i.e. non-selectively deposited) over the previously deposited first deposition material 2 as well as over the other portions of the substrate 6. The blanket deposition occurs by electroplating from an anode (not shown), composed of the second material, through an appropriate plating solution (not shown), and to the cathode/substrate 6. The entire two-material layer is then planarized to achieve precise thickness and flatness as shown in FIG. 2D. After repetition of this process for all layers, the multi-layer structure 20 formed of the second material 4 (i.e.

structural material) is embedded in first material 2 (i.e. sacrificial material) as shown in FIG. 2E. The embedded structure is etched to yield the desired device, i.e. structure 20, as shown in FIG. 2F.

Various components of an exemplary manual electrochemical fabrication system 32 are shown in FIGS. 3A-3C. The system 32 consists of several subsystems 34, 36, 38, and 40. The substrate holding subsystem 34 is depicted in the upper portions of each of FIGS. 3A-3C and includes several components: (1) a carrier 48, (2) a metal substrate 6 onto which the layers are deposited, and (3) a linear slide 42 capable of moving the substrate 6 up and down relative to the carrier 48 in response to drive force from actuator 44. Subsystem 34 also includes an indicator 46 for measuring differences in vertical position of the substrate which may be used in setting or determining layer thicknesses and/or deposition thicknesses. The subsystem 34 further includes feet 68 for carrier 48 which can be precisely mounted on subsystem 36.

The CC mask subsystem 36 shown in the lower portion of FIG. 3A includes several components: (1) a CC mask 8 that is actually made up of a number of CC masks (i.e. submasks) that share a common support/anode 12, (2) precision X-stage 54, (3) precision Y-stage 56, (4) frame 72 on which the feet 68 of subsystem 34 can mount, and (5) a tank 58 for containing the electrolyte 16. Subsystems 34 and 36 also include appropriate electrical connections (not shown) for connecting to an appropriate power source for driving the CC masking process.

The blanket deposition subsystem 38 is shown in the lower portion of FIG. 3B and includes several components: (1) an anode 62, (2) an electrolyte tank 64 for holding plating solution 66, and (3) frame 74 on which the feet 68 of subsystem 34 may sit. Subsystem 38 also includes appropriate electrical connections (not shown) for connecting the anode to an appropriate power supply for driving the blanket deposition process.

The planarization subsystem 40 is shown in the lower portion of FIG. 3C and includes a lapping plate 52 and associated motion and control systems (not shown) for planarizing the depositions.

The '630 patent further indicates that the electroplating methods and articles disclosed therein allow fabrication of devices from thin layers of materials such as, e.g., metals, polymers, ceramics, and semiconductor materials. It further indicates that although the electroplating embodiments described therein have been described with respect to the use of two metals, a variety of materials, e.g., polymers, ceramics and semiconductor materials, and any number of metals can be deposited either by the electroplating methods therein, or in separate processes that occur throughout the electroplating method. It indicates that a thin plating base can be deposited, e.g., by sputtering, over a deposit that is insufficiently conductive (e.g., an insulating layer) so as to enable subsequent electroplating. It also indicates that multiple support materials (i.e. sacrificial materials) can be included in the electroplated element allowing selective removal of the support materials.

Another method for forming microstructures from electroplated metals (i.e. using electrochemical fabrication techniques) is taught in U.S. Pat. No. 5,190,637 to Henry Guckel, entitled "Formation of Microstructures by Multiple Level Deep X-ray Lithography with Sacrificial Metal layers". This patent teaches the formation of metal structure utilizing mask exposures. A first layer of a primary metal is electroplated onto an exposed plating base to fill a void in a photoresist, the photoresist is then removed and a secondary metal is electroplated over the first layer and over the plating base. The exposed surface of the secondary metal is then machined down to a height which exposes the first metal to produce a flat uniform surface extending across the both the primary and secondary metals. Formation of a second layer may then begin by applying a photoresist layer over the first layer and then repeating the process used to produce the first layer. The process is then repeated until the entire structure is formed and the secondary metal is removed by etching. The photoresist is formed over the plating base or previous layer by casting and the voids in the photoresist are formed by exposure of the photoresist through a patterned mask via X-rays or UV radiation.

The '637 patent teaches the locating of a plating base onto a substrate in preparation for electroplating materials onto the substrate. The plating base is indicated as typically involving the use of a sputtered film of an adhesive metal, such as chromium or titanium, and then a sputtered film of the metal that is to be plated. It is also taught that the plating base may be applied over an initial sacrificial layer of material on the substrate so that the structure and substrate may be detached if desired. In such cases after formation of the structure the plating base may be patterned and removed from around the structure and then the sacrificial layer under the plating base may be dissolved to free the structure. Substrate materials mentioned in the '637 patent include silicon, glass, metals, and silicon with protected processed semiconductor devices. A specific example of a plating base includes about 150 angstroms of titanium and about 300 angstroms of nickel, both of which are sputtered at a temperature of 160° C. In another example it is indicated that the plating base may consist of 150 angstroms of titanium and 150 angstroms of nickel where both are applied by sputtering.

Even though electrochemical fabrication as taught and practiced to date, has greatly enhanced the capabilities of microfabrication, and in particular added greatly to the number of metal layers that can be incorporated into a structure and to the speed and simplicity in which such structures can be made, and even to the incorporation of some dielectric materials, room for enhancing dielectric incorporation and/or building on dielectric substrates exists.

SUMMARY OF THE INVENTION

It is an object of some embodiments of the invention to provide improved methods for incorporating dielectrics into a multi-layer electrochemical fabrication process.

It is an object of some embodiments of the invention to provide improved methods for incorporating dielectrics into multi-layer electrochemically fabricated structures.

It is an object of some embodiments of the invention to provide improved methods for electrochemically fabricating multi-layer structures on a dielectric substrate.

Other objects and advantages of various embodiments and aspects of the invention will be apparent to those of skill in the art upon review of the teachings herein. Various embodiments of the invention, set forth explicitly herein or otherwise ascertained from the teachings herein, may address one or more of the above objects alone or in combination, or alternatively they may address some other object of the invention ascertained from the teachings herein. It is not necessarily intended that all objects be addressed by any single aspect of the invention even though that may be the case with regard to some aspects.

In a first aspect of the invention a process for forming a multilayer three-dimensional structure, comprising: (a) forming and adhering a first layer of material to a dielectric substrate or to a substrate containing at least one region of dielectric material; (b) forming an adhering at least one layer to a previously formed layer to build up a three-dimensional structure from a plurality of adhered layers; wherein the formation of the first layer of material comprises: (i) depositing an adhesion layer material and/or a seed layer material onto at least a portion of a surface of the substrate; (ii) depositing at least one of a structural material and/or sacrificial material onto at least a portion of an adhesion layer and/or seed layer material; wherein prior to completion of formation of a last layer of the structure, removing portions of any adhesion layer material and/or seed layer material from the substrate that is not covered by structural material.

In a second aspect of the invention a process for forming a multilayer three-dimensional structure, comprising: (a) forming and adhering a first layer of material to a substrate; (b) forming an adhering at least one layer to a previously formed layer to build up a three-dimensional structure from a plurality of adhered layers; wherein the formation of an nth layer comprises: (i) depositing an adhesion layer material and/or a seed layer material onto a surface of the (n-1)th layer; (ii) depositing at least one of a first material and/or a second material onto at least a portion of the adhesion layer material and/or seed layer material; wherein at least one of the first or second materials comprises a structural material, and wherein prior to completion of formation of a last layer of the structure, removing portions of any adhesion layer material and/or seed layer material located on the surface of the (n-1)th layer that is not covered by structural material.

In a third aspect of the invention a process for forming a multilayer three-dimensional structure, comprising: (a) forming and adhering a first layer of material to a dielectric substrate or to a substrate containing at least one region of dielectric material; (b) forming an adhering at least one layer to a previously formed layer to build up a three-dimensional structure from a plurality of adhered layers; wherein the formation of the first layer of material comprises: (i) depositing an adhesion layer material and/or a seed layer material onto at least a portion of a surface of the substrate; (ii) depositing at least one of a structural material and/or sacrificial material onto at least a portion of an adhesion layer and/or seed layer material; (III) wherein prior to completion of formation of the first layer of the structure, removing portions of any adhesion layer material and/or seed layer material from the substrate that is not covered by structural material.

In a fourth aspect of the invention a process for forming a multilayer three-dimensional structure, comprising: (a) forming and adhering a first layer of material to a substrate; (b) forming an adhering at least one layer to a previously formed layer to build up a three-dimensional structure from a plurality of adhered layers; wherein the formation of an nth layer comprises: (i) depositing an adhesion layer material and/or a seed layer material onto a surface of the (n-1)th layer; (ii) depositing at least one of a first material and/or a second material onto at least a portion of the adhesion layer material and/or seed layer material; wherein at least one of the first or second materials comprises a structural material, and wherein prior to completion of formation of the nth layer of the structure, removing portions of any adhesion layer material and/or seed layer material located on the surface of the (n-1)th layer that is not covered by structural material.

In a fifth aspect of the invention a process for forming a multilayer three-dimensional structure, comprising: (a) forming and adhering a first layer of material to a dielectric substrate or to a substrate containing at least one region of dielectric material; (b) forming an adhering at least one layer to a previously formed layer to build up a three-dimensional structure from a plurality of adhered layers; wherein the formation of the first layer of material comprises: (i) depositing an adhesion layer material and/or a seed layer material to form a non-planar coating of which a portion defines a region of the substrate that is to receive an electrodeposition of a selected one of a structural material or of a sacrificial material.

In a sixth aspect of the invention a process for forming a multilayer three-dimensional structure, comprising: (a) forming and adhering a first layer of material to a substrate; (b) forming an adhering at least one layer to a previously formed layer to build up a three-dimensional structure from a plurality of adhered layers; wherein the formation of an nth layer comprises: (i) depositing an adhesion layer material and/or a seed layer material to form a non-planar coating of which a portion defines a region of an (n-1)th layer that is to receive a deposition of a selected one of a first or second material.

In a seventh aspect of the invention a process for forming a multilayer three-dimensional structure, comprising: (a) forming and adhering a first layer of material to a dielectric substrate or to a substrate containing at least one region of dielectric material; (b) forming an adhering at least one layer to a previously formed layer to build up a three-dimensional structure from a plurality of adhered layers; wherein the formation of the first layer of material comprises: (i) depositing a first adhesion layer material and/or a first seed layer material to only a portion of a surface of the substrate that is to receive either structural material or sacrificial material.

In an eighth aspect of the invention a process for forming a multilayer three-dimensional structure, comprising: (a) forming and adhering a first layer of material to a substrate; (b) forming an adhering at least one layer to a previously formed layer to build up a three-dimensional structure from a plurality of adhered layers; wherein the formation of an nth layer comprises: (i) depositing a first adhesion layer material and/or a first seed layer material to only a portion of a surface of the (n-1)th layer, wherein the portion is that portion which is to receive either the first or second material.

In a tenth aspect of the invention a process for forming a multilayer three-dimensional structure, comprising: (a) forming and adhering a first layer of material to a substrate; (b) forming an adhering at least one layer to a previously formed layer to build up a three-dimensional structure from a plurality of adhered layers; wherein the formation of an nth layer comprises: (i) locating a first adhesion layer material and/or a first seed layer material to only a portion of a surface of the (n-1)th layer that is to receive either the first or second material.

In an eleventh aspect of the invention a process for forming a multilayer three-dimensional structure on a dielectric substrate, comprising: (a) forming and adhering a first layer of material to a dielectric substrate or to a substrate containing at least one region of dielectric material; (b) forming and adhering at least one layer to a previously formed layer to build up a three-dimensional structure from a plurality of adhered layers; wherein the formation of the first layer of material comprises: (i) depositing a first seed layer material onto those portions of a substrate that are to receive a selected one of structural material or a sacrificial material; (ii) depositing the selected one of structural material or a sacrificial material onto the first seed layer material over those portions of the substrate that are to receive the selected one of structural material or a sacrificial material; (iii) removing portions of the first seed layer material that are not located between the selected one and the substrate or located adjacent to the selected one; (iv) depositing a second seed layer material onto those portions of the substrate that are to receive a non-selected one of the structural material and sacrificial material;

(v) depositing a the non-selected one of structural material or a sacrificial material onto the second seed layer material over those portions of the substrate that are to receive the non-selected one of structural material or a sacrificial material; (vi) planarizing the deposited materials to a height corresponding to a desired thickness of the first layer.

In a twelfth aspect of the invention a process for forming and adhering a layer of material to a dielectric substrate or to a substrate having at least one region of dielectric material, comprising: (a) depositing a first seed layer material onto those portions of a substrate that are to receive a selected one of structural material or a sacrificial material; (b) depositing the selected one of structural material or a sacrificial material onto the first seed layer material over those portions of the substrate that are to receive the selected one of structural material or a sacrificial material; (c) removing portions of the first seed layer material that are not located between the selected one and the substrate or located adjacent to the selected one; (d) depositing a second seed layer material onto those portions of the substrate that are to receive a non-selected one of the structural material and sacrificial material; (e) depositing a the non-selected one of structural material or a sacrificial material onto the second seed layer material over those portions of the substrate that are to receive the non-selected one of structural material or a sacrificial material; (f) planarizing the deposited materials to a height corresponding to a desired thickness of the first layer.

In a thirteenth aspect of the invention a fabrication process for forming a multi-layer three-dimensional structure that comprises at least one conductive structural material and at least one dielectric material, comprising: (a) forming and adhering a layer of material to a previously formed layer and/or to a substrate, wherein the layer comprises a desired pattern of at least one material; and (b) repeating the forming and adhering operation of (a) a plurality of times to build up the three-dimensional structure from a plurality of adhered layers, wherein formation of at least one layer comprises: (i) preparing a surface of the substrate or a previously deposited material to for accepting an electrodeposited conductive material; (ii) depositing a first conductive material; (ii) depositing a curable dielectric material on to the surface of the substrate or previously deposited material; (iii) curing the dielectric material; and (iv) planarizing at least one of the deposited materials.

In a fourteenth aspect of the invention a fabrication process for forming a multi-layer three-dimensional structure that comprises at least one conductive structural material and at least one dielectric material, comprising: (a) forming and adhering a layer of material to a previously formed layer and/or to a substrate, wherein the layer comprises a desired pattern of at least one material; and (b) repeating the forming and adhering operation of (a) a plurality of times to build up the three-dimensional structure from a plurality of adhered layers, wherein formation of at least one layer comprises: (i) preparing a surface of the substrate or a previously deposited material to for accepting an deposited conductive material; (ii) depositing a first conductive material; (ii) depositing a dielectric material on to the surface of the substrate or previously deposited material; and (iv) planarizing at least one of the deposited materials.

In a fifteenth aspect of the invention a process for forming a multilayer three-dimensional structure, comprising: (a) forming and adhering a first layer of material to a substrate; (b) forming an adhering at least one layer to a previously formed layer to build up a three-dimensional structure from a plurality of adhered layers; wherein the formation of an nth layer comprises the following time ordered operations: (i) applying a photoresist to a previously deposited material; (ii) exposing the photoresist in a first pattern corresponding to a pattern of a first material to be deposited; (iii) developing the photoresist to yield opening in the photoresist for receiving the first material; (iv) exposing the remaining photoresist in a second pattern corresponding to a second material to be deposited; (v) depositing the first material; (vi) developing the photoresist to create openings corresponding to the second pattern; and then (vii) depositing the second material.

In a sixteenth aspect of the invention a process for forming a multilayer three-dimensional structure, comprising: (a) supplying a source of a depositable first structural material; (b) supplying a source of a depositable second structural material; (c) supplying a source of a depositable third material that may function as a sacrificial material or as a structural material; (d) forming and adhering a plurality of layers to previously formed layers to build up a three-dimensional structure comprising all three materials wherein on any given layer only two of the three materials are deposited; wherein the structure is formed such that at least a portion of third depositable material is encapsulated by one or all of the first depositable structural material, the second depositable structural material and any substrate on which layer formation initiates, and wherein after formation of the layers, at least a portion of the third material is removed to at least partially release the structure.

Further aspects of the invention will be understood by those of skill in the art upon review of the teachings herein. Other aspects of the invention may involve combinations of the above noted aspects of the invention. Other aspects of the invention may involve apparatus that can be used in implementing one or more of the above method aspects of the invention or may involve structures formed by the method aspects of the invention. These other aspects of the invention may provide various combinations of the aspects presented above as well as provide other configurations, structures, functional relationships, and processes that have not been specifically set forth above.

BRIEF DESCRIPTION OF THE DRAWINGS

FIGS. 2A-2F schematically depict side views of various stages of an electrochemical fabrication process as applied to the formation of a particular structure where a sacrificial material is selectively deposited while a structural material is blanket deposited.

FIGS. 7A-7J provide schematic illustrations of side views at various stages of the process of a second embodiment of the invention which provides a first implementation of the example of block 124 of FIG. 5B.

FIGS. 11A-11K provide schematic illustrations of side views at various stages of the process of a sixth embodiment of the invention which provides a first implementation of the example of block 148 of FIG. 5D.

FIGS. 16A-16M provide schematic illustrations of side views at various stages of the process of an eleventh embodiment of the invention which provides a first implementation of the example of block 164 of FIG. 5F.

DETAILED DESCRIPTION OF PREFERRED EMBODIMENTS OF THE INVENTION

FIGS. 1A-1G, 2A-2F, and 3A-3C illustrate various features of one form of electrochemical fabrication that are known. Other electrochemical fabrication techniques are set forth in the '630 patent referenced above, in the various previously incorporated publications, in various other patents and patent applications incorporated herein by reference, still others may be derived from combinations of various approaches described in these publications, patents, and applications, or are otherwise known or ascertainable by those of skill in the art from the teachings set forth herein. All of these techniques may be combined with those of the various embodiments of various aspects of the invention to yield enhanced embodiments. Still other embodiments may be derived from combinations of the various embodiments explicitly set forth herein.

Figure 1A:
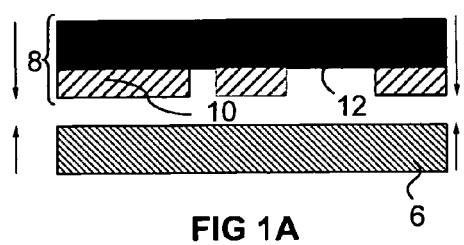
FIGS. 1A-1C schematically depict side views of various stages of a CC mask plating process, while FIGS. 1D-1G schematically depict a side views of various stages of a CC mask plating process using a different type of CC mask.
Figure 1B:
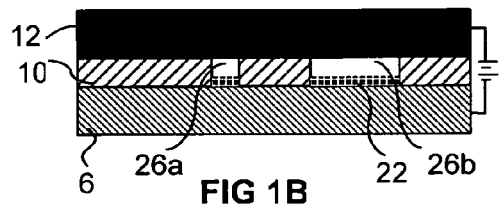
Figure 1C:
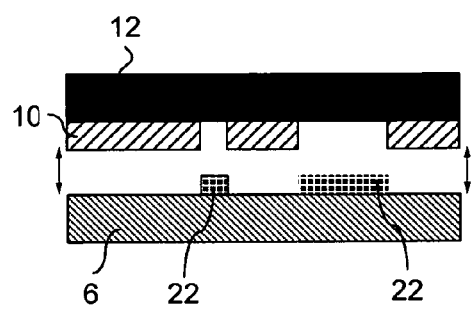
Figure 1D:
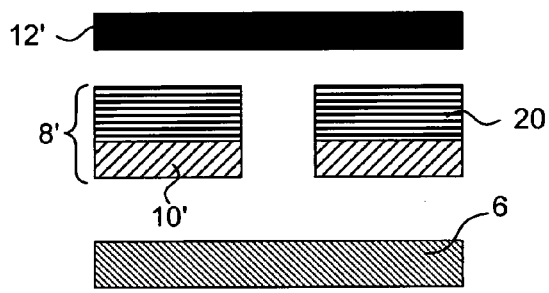
Figure 1E:
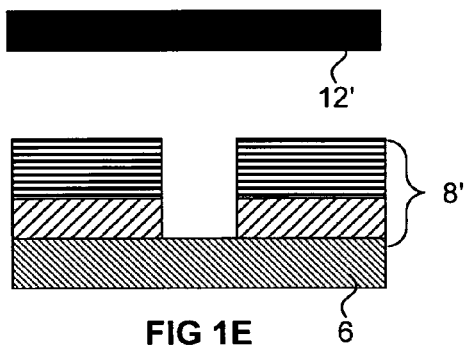
Figure 1F:
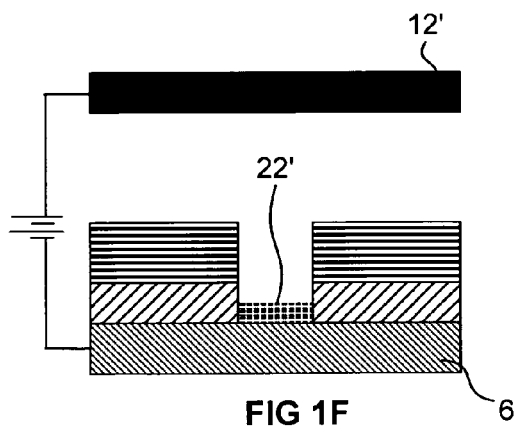
Figure 1G:
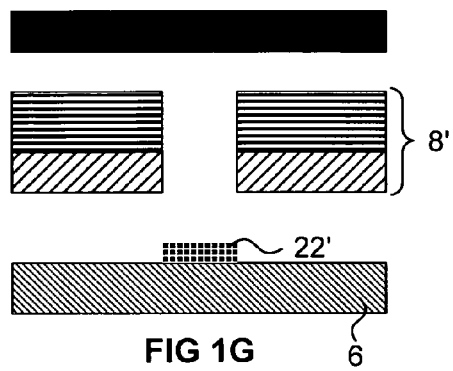
Figure 3A:
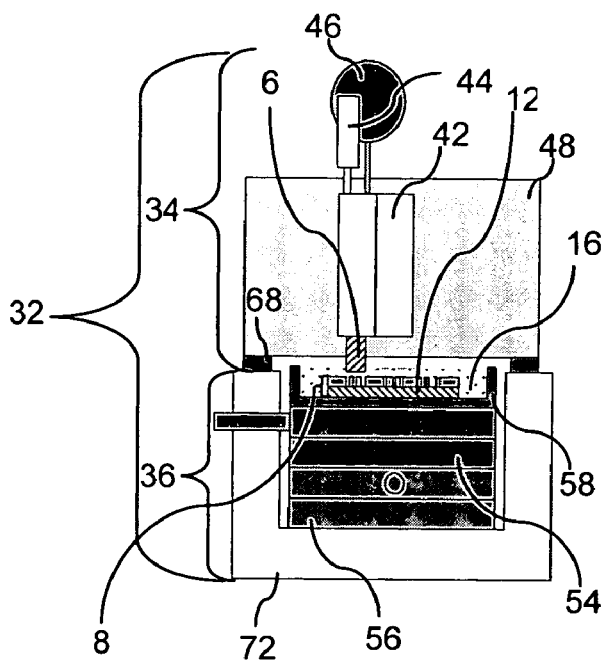
FIGS. 3A-3C schematically depict side views of various example subassemblies that may be used in manually implementing the electrochemical fabrication method depicted in FIGS. 2A-2F.
Figure 3B:
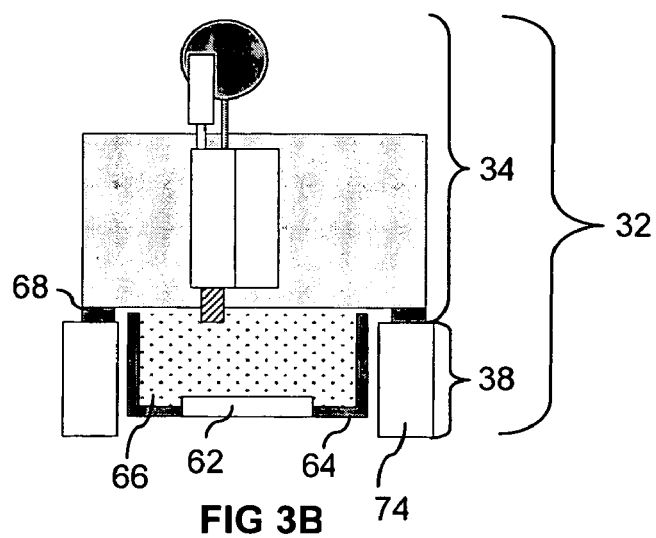
Figure 3C:
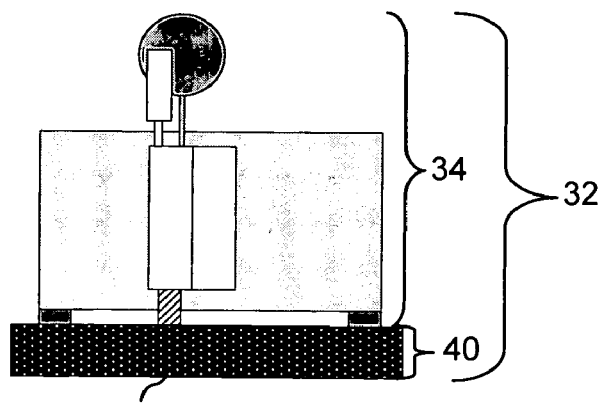
Figure 4A:
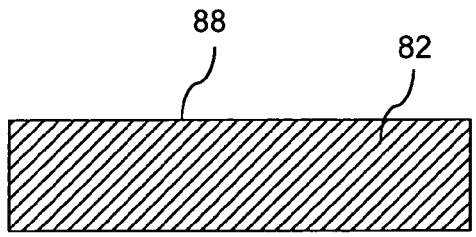
FIGS. 4A-4I schematically depict the formation of a first layer of a structure using adhered mask plating where the blanket deposition of a second material overlays both the openings between deposition locations of a first material and the first material itself.
Figure 4B:
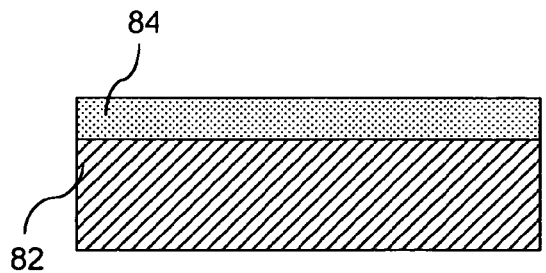
Figure 4C:
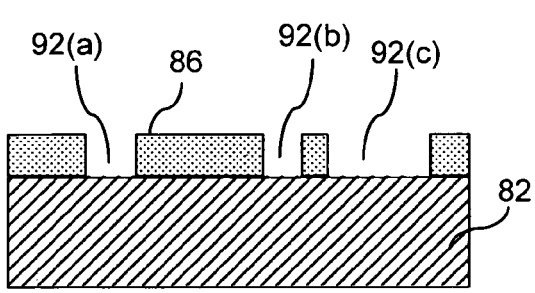
Figure 4D:
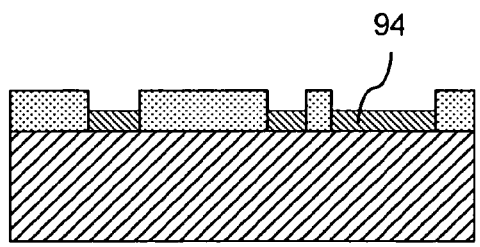
Figure 4E:
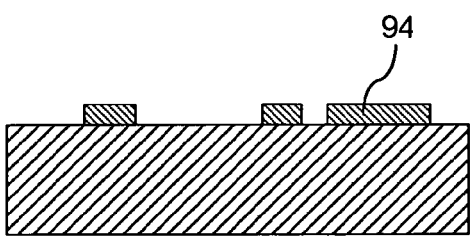
Figure 4F:
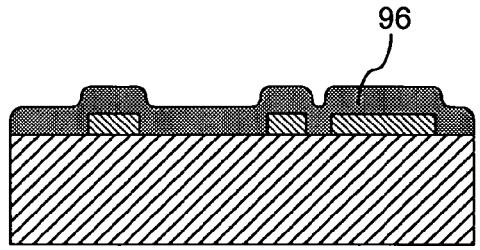
Figure 4G:
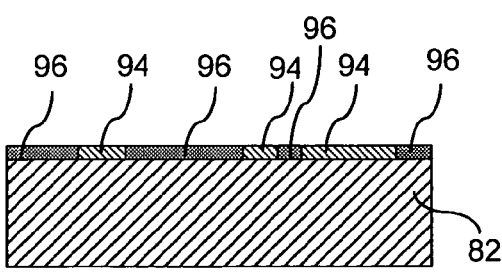
Figure 4H:
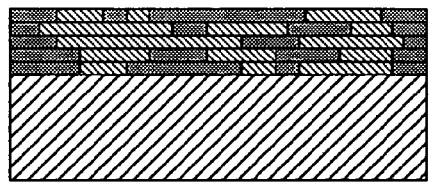
Figure 4I:
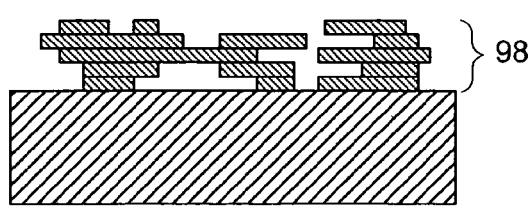

FIGS. 4A-4I illustrate various stages in the formation of a single layer of a multi-layer fabrication process where a second metal is deposited on a first metal as well as in openings in the first metal where its deposition forms part of the layer. In FIG. 4A, a side view of a substrate 82 is shown, onto which patternable photoresist 84 is cast as shown in FIG. 4B. In FIG. 4C, a pattern of resist is shown that results from the curing, exposing, and developing of the resist. The patterning of the photoresist 84 results in openings or apertures 92(a)-92(c) extending from a surface 86 of the photoresist through the thickness of the photoresist to surface 88 of the substrate 82. In FIG. 4D, a metal 94 (e.g. nickel) is shown as having been electroplated into the openings 92(*a*)-92(*c*). In FIG. 4E, the photoresist has been removed (i.e. chemically stripped) from the substrate to expose regions of the substrate 82 which are not covered with the first metal 94. In FIG. 4F, a second metal 96 (e.g., silver) is shown as having been blanket electroplated over the entire exposed portions of the substrate 82 (which is conductive) and over the first metal 94 (which is also conductive). FIG. 4G depicts the completed first layer of the structure which has resulted from the planarization of the first and second metals down to a height that exposes the first metal and sets a thickness for the first layer. In FIG. 4H the result of repeating the process steps shown in FIGS. 4B-4G several times to form a multi-layer structure are shown where each layer consists of two materials. For most applications, one of these materials is removed as shown in FIG. 4I to yield a desired 3-D structure 98 (e.g. component or device).

The various embodiments, alternatives, and techniques disclosed herein may form multi-layer structures using a single patterning technique on all layers or using different patterning techniques on different layers. For example, different types of patterning masks and masking techniques may be used or even techniques that perform direct selective depositions without the need for masking may be used. For example, the methods disclosed herein for incorporating dielectrics may be used in combination with conformable contact masks and/or non-conformable contact masks and masking operations on all, some, or even no layers. Proximity masks and masking operations (i.e. operations that use masks that at least partially selectively shield a substrate by their proximity to the substrate even if contact is not made) may be used, and/or adhered masks and masking operations (masks and operations that use masks that are adhered to a substrate onto which selective deposition or etching is to occur as opposed to only being contacted to it) may be used.

Figure 5A:
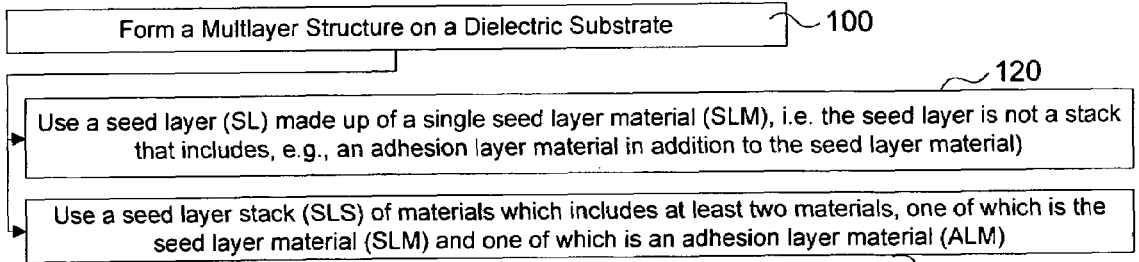
FIG. 5A provides a block diagram indicating the two main approaches for building on a dielectric or partially dielectric substrate according to various embodiments of the invention.

FIG. 5A provides a block diagram indicating the two main approaches for building on a dielectric or partially dielectric substrate according to various embodiments of the invention. FIG. 5A provides a first block 100 that sets forth the goal of various embodiments of the present invention and that is to form a multi-layer structure on a dielectric substrate or substrate where at least part of the surface is dielectric.

From block 100 two alternative processes 120 and 140 exist. A first such process uses a seed layer (SL) that is made up of a single material or single seed layer material (SLM). In such embodiments a relationship between the material to be deposited and the substrate exists such that a single seed layer material may function as a surface onto which electrochemical operations may be performed (e.g. electroplating) as well as providing adequate adhesion to the substrate material.

The second major alternative represented by block 140 calls for the use of a seed layer stack (SLS) which includes at least two materials. One of the materials is a seed layer material itself (i.e. a layer, a coating, a deposit upon which electrochemical operations may be performed, e.g. upon which electroplating operations may be performed). The other material is an adhesion layer material which is to be located between the substrate and the seed layer material. The adhesion layer material is typically very thin (e.g. between about 100-1,000 angstroms in thickness) but in some cases thinner or thicker adhesion layers may be used. Adhesion layer materials may consist of a variety of pure or mixed metals such as, for example, titanium, chromium, or titanium-tungsten (Ti—W).

In these alternatives seed layer thicknesses typically range from about 0.1 microns to 1 micron but in certain cases thinner or thicker seed layers may be useable and appropriate. In various embodiments to be discussed hereafter seed layer material may take on many different forms and may actually be different in different portions of a layer and particularly depending on what materials the seed layers are intended to bound. For example, in some embodiments seed layers may consist of material that is supplied, for example, by sputtering, electroless deposition, or direct metallization. In other embodiments the seed layer material may be applicable by use of an electroplating strike (e.g. a nickel strike such as a Woods strike). The seed layer material may, for example, include one of the metals that will eventually be electrodeposited such as the conductive structural material or the conductive sacrificial material. In other embodiments the seed layer material may be different from the metals that will form the bulk of the structural material or the bulk of the sacrificial material. For example, in some embodiments the structural material may be nickel while the sacrificial material is copper and the seed layer material is gold.

In still other embodiments the seed layer material may be a mixture of both the conductive structural and conductive sacrificial materials such as, for example, a copper nickel alloy.

Figure 5B:
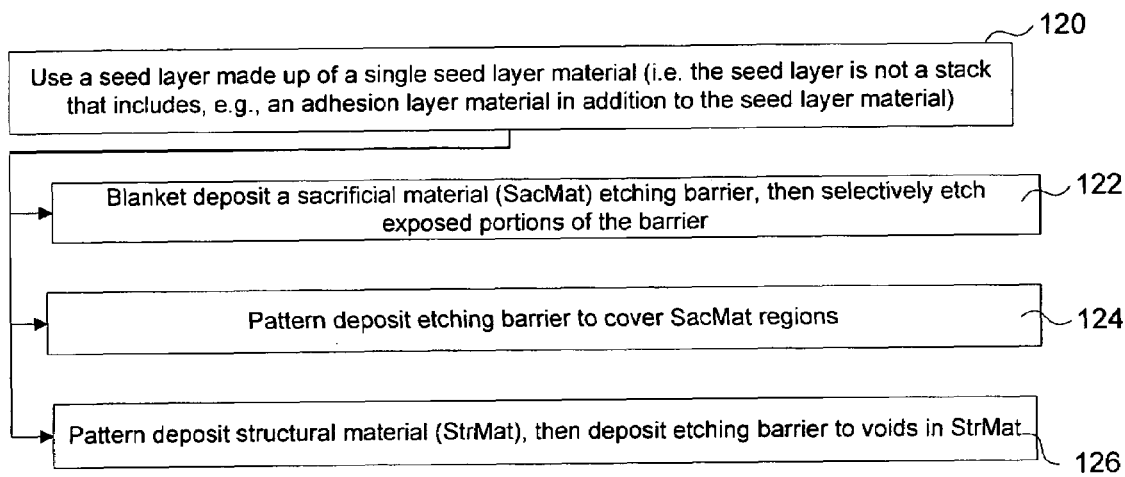
FIG. 5B provides a block diagram indicating three example implementations associated with the first of the main approaches set forth in FIG. 5A FIG. 5C provides a block diagram indicating four example implementations associated with the second of the main approaches set forth in FIG. 5A.

FIG. 5B provides a block diagram indicating three example implementations associated with the first of the main approaches set forth in FIG. 5A.

Blocks 122, 124, and 126 of FIG. 5B provide example implementations that fall within the scope of the first main approach of block 120 of FIG. 5A. Each of the example implementations 122-126 call for the use of an etch stop or sacrificial material etching barrier layer in addition to the use of a seed layer material. The seed layer in these example implementations is a copper nickel alloy, the sacrificial material is copper and the structural material is nickel. In these embodiments the seed layer material exists between the substrate and the structural material and as the seed layer is relatively thick and is attackable by the etchant used to remove the sacrificial material a barrier layer will be made to exist between the sacrificial material and the seed layer material in those regions of the layer not occupied by structural material.

The alternative of block 122 is based on the blanket deposition of a sacrificial material etching barrier followed by selective etching of the etching barrier in those portions of the layer to be occupied by structural material. The alternative of block 124 achieves the same result of that of block 122 but is based on the pattern deposition of the etching barrier material. The alternative of block 126 also achieves the same result but is based on the patterned deposition of a structural material followed by the deposition of the etching barrier material into the voids of the sacrificial material. More specifically the process of block 122 includes:

(1) Supply a dielectric substrate on which a multi-layer structure is to be formed.

(2) Apply a seed layer of a thin film of a copper alloy such as a copper nickel alloy. The thin film may be deposited by sputtering or by some other appropriate means. The film thickness is preferably less then about 1,000 angstroms and more preferably between about 300-500 angstroms. In some embodiments the thickness may be as low as 100 angstroms or potentially even lower while other embodiments the thickness may exceed 1,000 angstroms. It is preferred that the seed layer be thin enough so as to affectively limit its etching in areas where it is sandwiched between structural material and the substrate. The seed layer material is also thin enough such that excessive stress in the deposit is not allowed to build up.

(3) Next an etch stop material is plated over the seed layer material. The etch stop material may have a thickness in the range of 3 to 5 microns in some embodiments and less in other embodiments or even greater in still other embodiments. For a nickel structural material and a copper sacrificial material a potential etching barrier material is tin—as copper may be etched from tin without damaging it.

(4) After deposition of the barrier layer a sacrificial material (SacMat) is selectively plated onto a portion of the etch stop material. The selective plating of the sacrificial material may occur via an adhered mask or a contact mask or in some other manner.

(5) Next, before or after removing any mask, regions of the etch stop material (ESM) that are not covered by deposited sacrificial material (i.e. the exposed regions of the ESM) are removed to expose the seed layer material in those regions. The removal of the ESM may occur, for example, by chemical etching or by electrochemical etching. The etching must be performed in a controlled manner so that excessive undercutting of the sacrificial material is avoided.

(6) Next structural material is plated onto the seed layer material in the void regions of the sacrificial and barrier materials.

(7) The formation of the first layer over the substrate is completed by planarizing the deposited materials to a height corresponding to the layer thickness (LT) of the structure. Planarization may occur in a variety of ways, for example, by lapping, by chemical mechanical polishing, grinding, other machining operations and the like.

(8) After completion of the first layer additional layers are added as appropriate. In the present embodiment those additional layers are considered to consist of a conductive structural material and a conductive sacrificial material. In other embodiments the added layers may consist of multiple conductive structural materials, multiple conductive sacrificial materials, and/or one or more dielectric structural or sacrificial materials.

(9) After formation of a desired number of layers, sacrificial material is removed, for example, by chemical or electrochemical etching such that the etch stop material is exposed.

(10) Next the etch stop material is removed, for example, by chemical or electrochemical etching so as to expose portions of the seed layer material located between regions where structural material overlays the seed layer material.

(11) Finally, the exposed portions of the seed layer material are removed, for example, via chemical or electrochemical etching. Once this seed layer is removed, separate regions of conductive structural material become electrically isolated from one another. With a copper nickel alloy seed layer material the etching may occur via the same chemical etchant that may be used to remove the copper sacrificial material. For example, copper etchant C-38, from Enthone of West Haven, Conn. with or without an added corrosion inhibitor that minimizes damage to the nickel structural material.

(12) Various alternatives of this process are possible. For example, instead of using a single seed layer material, a seed layer stack may be used such as a titanium or chromium adhesion layer and a gold seed layer.

FIGS. 6A-6J provide schematic illustrations of side views of a sample structure at various stages of fabrication according to the process of the first embodiment of the invention.

Figure 6A:
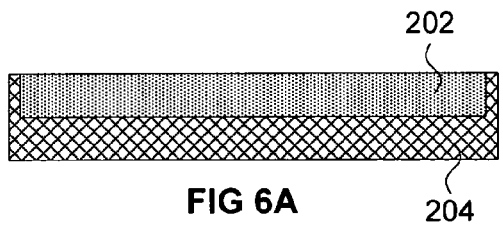
FIGS. 6A-6J provide schematic illustrations of side views at various stages of the process of a first embodiment of the invention which provides a first implementation of the example of block 122 of FIG. 5B.

FIG. 6A shows the state of the process after a dielectric substrate 202 has been supplied. For illustrative purposes the dielectric substrate 202 is shown as resting upon and being surrounded by a conductive material 204 to which electrical contact may be made for the purposes of performing plating operations and the like.

Figure 6B:
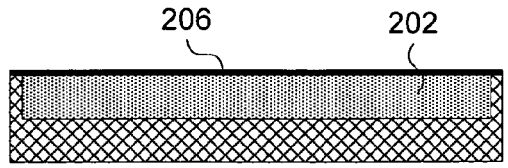

FIG. 6B shows the state of the process after a seed layer material 206 has been blanket deposited over the surface of the dielectric substrate 202.

Figure 6C:
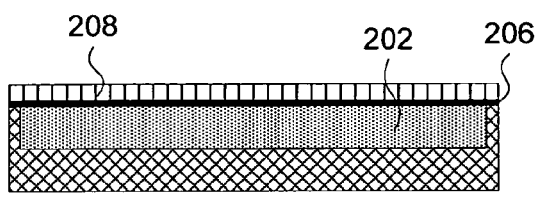

FIG. 6C shows the state of the process after a barrier layer or etch stop layer 208 has been blanket deposited over seed layer material 206.

Figure 6D:
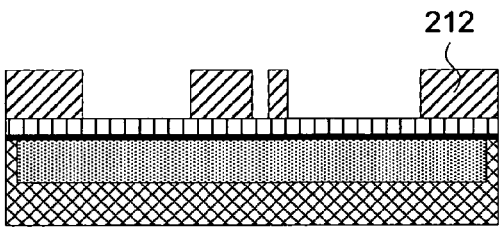

FIG. 6D shows the state of the process after a sacrificial material 212 has been selectively deposited onto the barrier layer and any mask used during the selective deposition process has been removed.

Figure 6E:
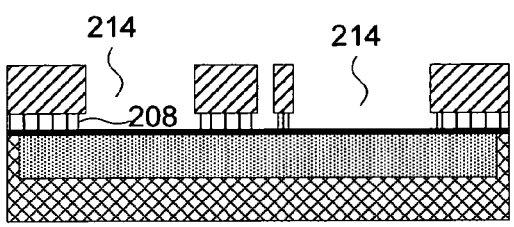

FIG. 6E shows the state of the process after exposed portions of the etch stop material 208 have been removed from voids 214.

Figure 6F:
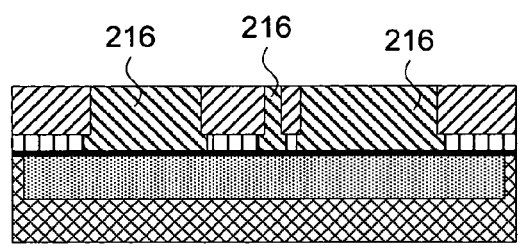

FIG. 6F shows the state of the process after a conductive material 216 has been deposited onto exposed regions of seed layer material that existed within voids 214.

Figure 6G:
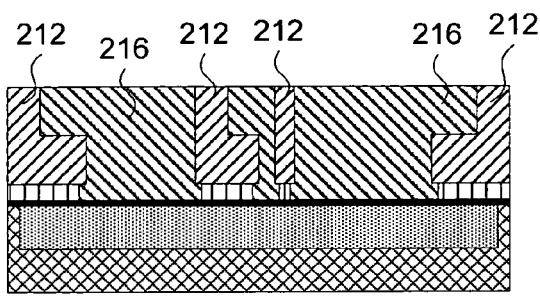

FIG. 6G shows the state of the process after at least one additional layer of structural and sacrificial conductive materials have been deposited.

Figure 6H:
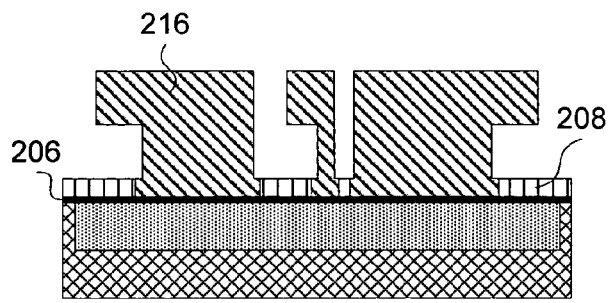

FIG. 6H shows the state of the process after sacrificial material 212 has been removed leaving behind a substantially released structure consisting of structural material 208 which has isolated regions still in conductive contact with one another via seed layer 206 and etch stop material 208.

Figure 6I:
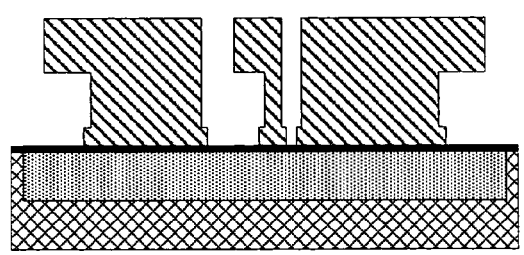

FIG. 6I shows the state of the process after the etch stop material 208 has been removed, for example, via chemical etching.

Figure 6J:
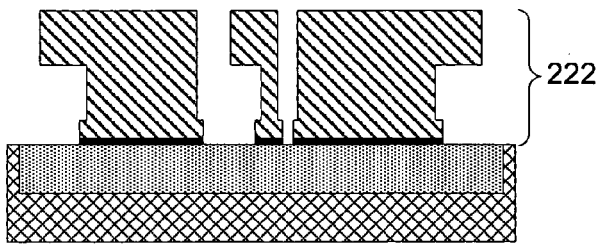

FIG. 6J shows the state of the process after the structure 222 has been fully released from the sacrificial material and from the intervening areas of the etch stop material and the seed layer material.

Turning back to FIG. 5B block 124 indicates that a second approach to the process of block 120 involves the patterned deposition of the etching barrier material to regions that will be overlaid by sacrificial material. A process for implementing this approach may include the following operations:

(1) Supply a dielectric substrate.
(2) Apply a seed layer of a copper nickel alloy.
(3) Locate a patterned mask on the surface of the substrate such that openings in the mask material exist over regions to be occupied by sacrificial material.
(4) Plate an etch stop material onto the seed layer material in the regions of the voids in the masking material.
(5) Plate sacrificial material into the regions of the voids in the mask. The depth of deposition is preferably somewhat greater then one layer thickness (LT).
(6) Next the mask material used in the selective depositions of operations 4 and 5 is removed.
(7) Deposit a structural material into the voids in the sacrificial and barrier materials.
(8) Planarize the deposits of material to a level corresponding to LT.
(9) Add additional layers onto the first layer that was completed by the planarization of operation 8.
(10) After formation of a desired number of layers (e.g. those necessary to form the complete structure), remove the sacrificial material by, for example, chemical etching so as to expose the etch stop material.

(11) Remove the etch stop material, for example, by chemical etching to expose portions of the seed layer material.

(12) Remove the exposed portions of the seed layer material, for example, by chemical etching so as to complete the release and electrical isolation of separate portions of the structure.

FIGS. 7A-7J provide schematic illustrations of side views of a sample structure at various stages of fabrication according to the process of the second embodiment of the invention.

FIG. 7A depicts the state of the process after a substrate 232 supported by conductive carrier 234 is supplied.

FIG. 7B shows the state of the process after a seed layer 236 is blanket deposited onto the surface of substrate 232.

FIG. 7C shows the state of the process after a patterned mask 210 is applied to the surface of the seed layer material located on substrate 232 and after a barrier layer material 238 has been deposited to the seed layer material in the regions of voids 244.

FIG. 7D depicts the state of the process after a sacrificial material 242 has been deposited over etch stop material 238.

FIG. 7E shows the state of the process after the masking material 210 has been removed resulting in formation of voids 250 over portions of the seed layer material where structural material is to be plated.

FIG. 7F depicts the state of the process after a structural material 246 has been deposited onto seed layer 236 and the deposits planarized to a level corresponding to the layer thickness.

FIG. 7G-7J are analogous to FIG. 6G-6J and as such no further description of these figures will be provided at this time.

Turning back to FIG. 5B, block 126 indicates that the third approach to the process of block 120 involves the patterned deposition of a structural material followed by the deposition of an etching barrier or etch stop material into the voids located adjacent to the selectively deposited structural material. A process implementing the approach of block 126 may include the following operations:

(1) Supply a dielectric substrate.

(2) Blanket deposit a seed layer of a copper nickel alloy.

(3) Apply and pattern a mask on the copper nickel alloy seed layer so its internal regions to be occupied by structural material are exposed via openings or voids in the mask material.

(4) Plate the structural material onto the seed layer material via the voids in the mask. The plating depth is preferably equal to or greater than the layer thickness plus an incremental amount δ.

(5) Remove the mask from the partially formed structure to reveal exposed regions of the seed layer material via voids in the structural material.

(6) Plate an etch stop material onto the seed layer via the voids in the structural material. This plating operation may be of a selective type or may be a blanket deposition operation that results in the plating of the etch stop material over the structural material as well as into the void regions. The height of deposition of the etch stop material is preferably as thin as possible but sufficient to yield the desired property that its presence can act as a barrier to an etchant used to remove the sacrificial material from reaching the seed layer material. The thickness of the etch stop material, for example, may be on the order of a tenth of a micron to about a micron and a half but is more preferably in the range of about 0.3 microns to 0.5 microns.

(7) After the plating of the etch stop material the sacrificial conductive material is plated above the etch stop material and potentially over the structural material. The height of deposition in the void regions of the structural material results in the depositions reaching a height of preferably at least one layer thickness plus an incremental amount δ.

(8) After deposition of the sacrificial material the formation of the first layer over the substrate is completed by planarizing the deposits to a height equal to that of the layer thickness.

(9)-(12) After formation of the first layer the process continues in a similar manner to that described above with regard to the first and second embodiments. In other words the process continues with the addition of one or more layers of material, the etching of the sacrificial material to expose the etch stop material, the etching through the etch stop material to expose the seed layer material and finally the etching of the exposed portions of the seed layer material to produce a released structure with separate regions of structural material being conductively uncoupled from one another.

FIGS. 8A-8J provide schematic illustrations of side views of a sample structure at various stages of fabrication according to the process of the third embodiment of the invention.

Figure 8A:
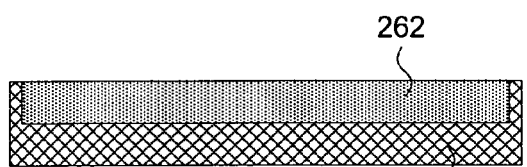
FIGS. 8A-8J provide schematic illustrations of side views at various stages of the process of a third embodiment of the invention which provides a first implementation of the example of block 126 of FIG. 5B.

FIG. 8A depicts the state of the process after a dielectric substrate 262 and a conductive carrier 264 is supplied.

Figure 8B:
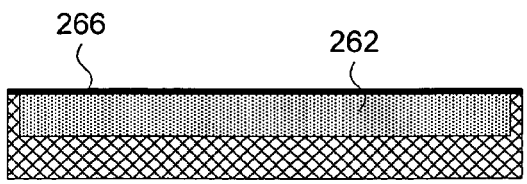

FIG. 8B depicts the state of the process after a seed layer material (e.g. a copper nickel alloy) is supplied to the surface of substrate 262.

Figure 8C:
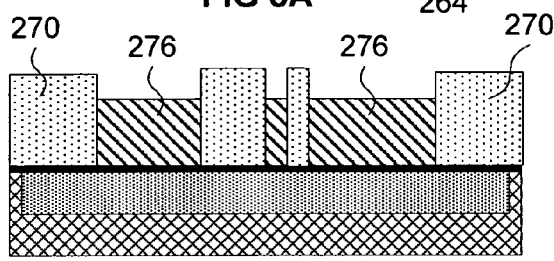

FIG. 8C shows the state of the process after a masking material 270 is applied and patterned on the surface of seed layer material 266 and structural material 276 is deposited onto the seed layer via the openings in mask material 270.

Figure 8D:
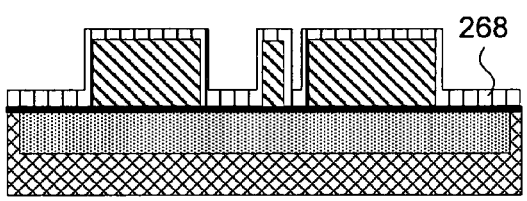

FIG. 8D depicts the state of the process after the masking material has been removed and an etch stop material 268 has been plated over exposed regions of the seed layer as well as over the deposited structural material.

Figure 8E:
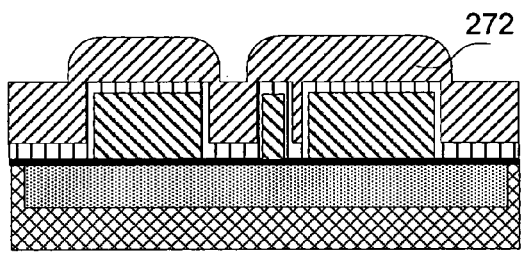

FIG. 8E shows the state of the process after a sacrificial material 272 has been blanket deposited over the etch stop material.

Figure 8F:
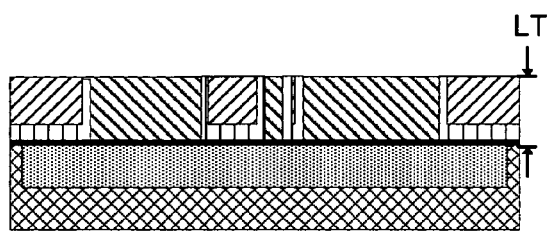
Figure 8G:
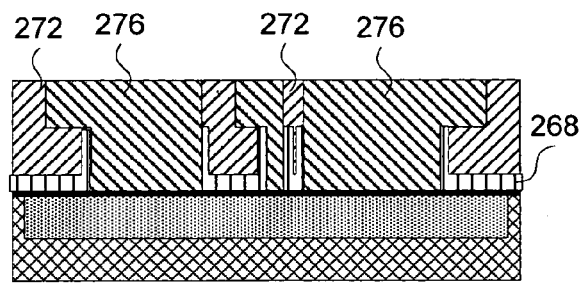
Figure 8H:
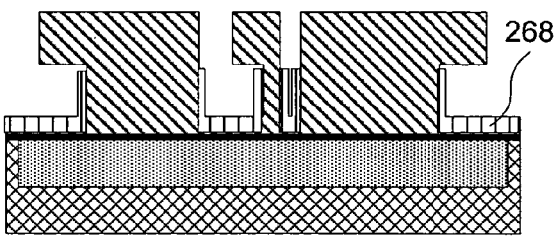
Figure 8I:
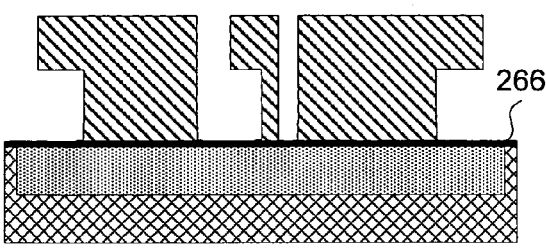
Figure 8J:
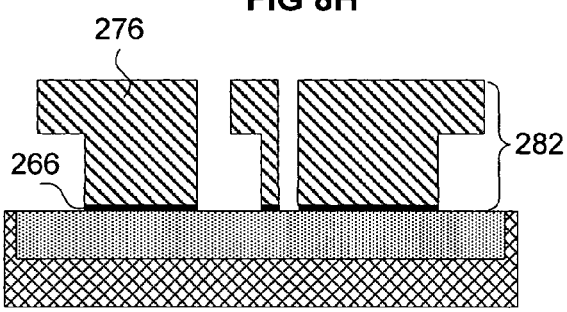

FIG. 8F depicts the state of the process after a planarization operation trims the height of the deposits to that corresponding to a layer thickness LT.

FIGS. 8G-8J are analogous to FIGS. 7G-7J and 6G-6J. These figures depict the states of the process after formation of an additional layer (FIG. 8G), after etching of the sacrificial material (FIG. 8H), after etching of the etch stop material (FIG. 8I), and finally after removal of exposed portions of the seed layer material to yield a released object 282 with separated portions of the structure being conductively isolated from one another.

Figure 5C:
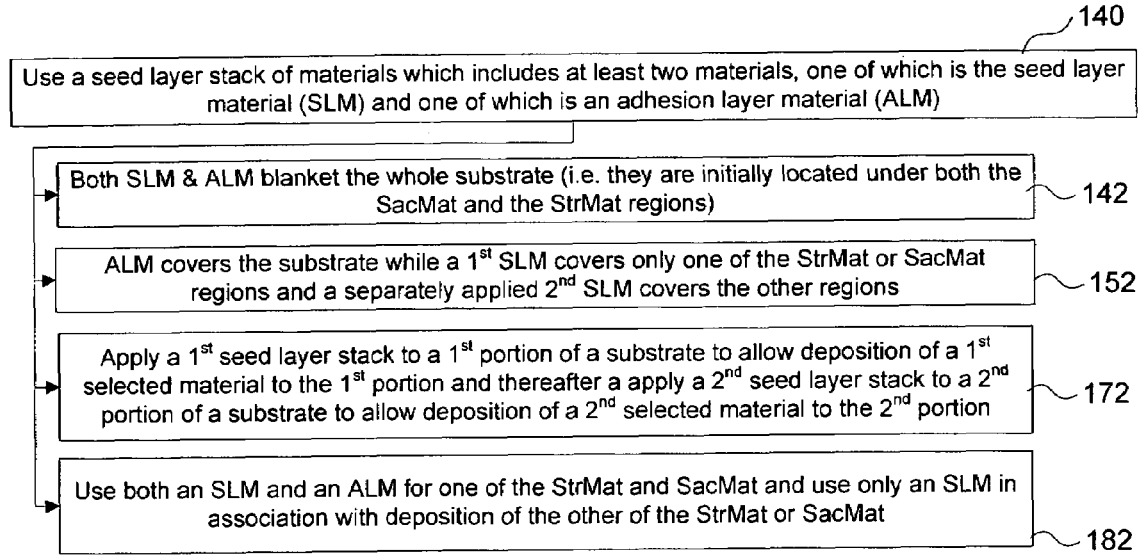
FIG. 5D provides a block diagram indicating four more detailed implementation examples associated with the first example implementation of FIG. 5B.
FIG. 5E provides a block diagram indicating three more detailed implementation examples (one of which is indicated as having two alternatives) associated with the second example implementation of FIG. 5B.
FIG. 5F provides a block diagram indicating a more detailed implementation example (along with two alternatives therefore) associated with the fourth example implementation of FIG. 5B.
FIG. 5G provides a block diagram indicating a more detailed implementation example (along with two alternatives therefore) associated with the fifth example implementation of FIG. 5B.

FIG. 5C provides a block diagram indicating four example implementations associated with the second of the main approach (block 140) set forth in FIG. 5A.

Block 142 represents a first implementation example associated with the use of a seed layer stack of materials as opposed to a single seed layer material. Block 142 calls for the use of a seed layer material (SLM) and adhesion layer material (ALM) which are blanket deposited across the entire substrate. In other words, in this implementation (i.e. group of embodiments) both the adhesion layer and seed layer materials are initially located under both sacrificial material regions and structural material regions of the first layer.

A second implementation example is set forth in block 152 which calls for an adhesion layer material to cover the entire substrate while a first seed layer material only covers regions to be occupied by one of the structural material or the sacrificial material and where a separately applied second seed layer material will cover the other of the regions.

A third implementation example is called for by block 172. In this third example a first seed layer stack of materials is applied to a first portion of the substrate to allow deposition of a first selected material to that portion of the substrate after which a second seed layer stack of materials is applied to a second portion of the substrate to allow deposition of a second selected material to regions of the second portion.

A fourth implementation example is called for by block 182. In this fourth example a seed layer material and an adhesion layer material is used to association with one of the structural material or sacrificial material while only a seed layer material is used in association with the other of the structural material or sacrificial material.

FIG. 5D provides a block diagram indicating four more detailed implementation examples associated with the first example implementation (block 142) of FIG. 5B.

The first more detailed implementation is set forth in block 144. This first detailed implementation represents the fourth embodiment of the invention. In this embodiment exposed portions of the seed layer material and then the adhesion layer material are removed after formation of the last layer of the structure and after removal of the sacrificial material.

FIGS. 9A-9D provide schematic illustrations of side views at various stages of the process of an example of this fourth embodiment of the invention.

Figure 9A:
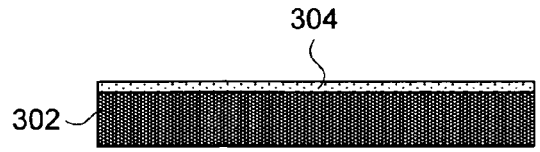
FIGS. 9A-9D provide schematic illustrations of side views at various stages of the process of a fourth embodiment of the invention which provides a first implementation of the example of block 144 of FIG. 5D.

FIG. 9A depicts the state of the process after substrate 302 is provided and a seed layer stack 304 is located thereon.

Figure 9B:
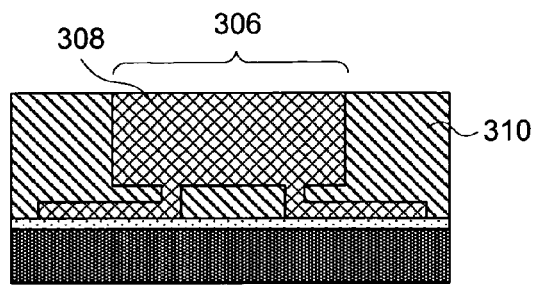

FIG. 9B depicts the state of the process after the layer build up of a structure 306 is completed where the layers include structural material 308 and sacrificial material 310.

Figure 9C:
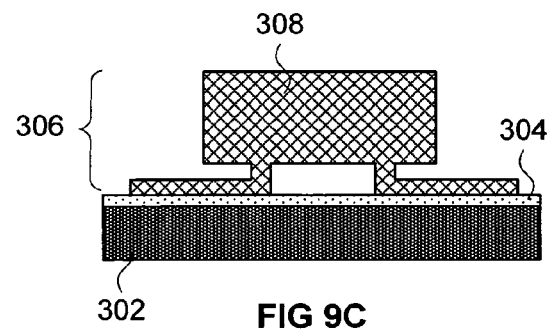

FIG. 9C depicts the state of the process after the sacrificial material has been separated from the structural material 308 leaving behind the structure 306 sitting on seed layer stack 304 and on substrate 302.

Figure 9D:
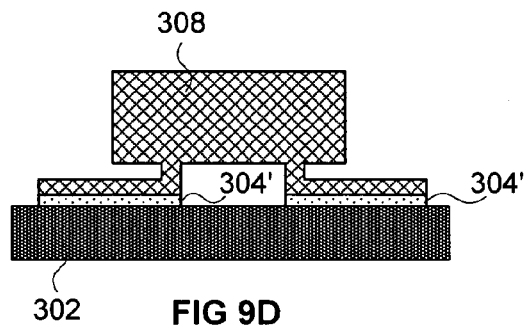

FIG. 9D shows the final state of the process after exposed regions of seed layer stack materials have been removed to leave behind a discontinuous seed layer 304' which is sandwiched between structural material 308 and substrate 302.

Block 146 of FIG. 5D sets forth a second more detailed implementation approach to that set forth in block 142. For the purposes of this application block 146 may be considered to set forth a fifth embodiment of the invention which calls for the removal of those portions of the seed layer material not overlaid by structural material where the removal is to occur prior to formation of the last layer of the structure. After removal of the exposed seed layer material, a different seed layer material is applied over at least the exposed portions of the adhesion layer material.

In some embodiments the removal of the seed layer material may occur after deposition of a structural material on the first layer and prior to beginning formation of a second layer of the structure. More particularly in some variations of this embodiment the structural material of the first layer may be deposited prior to the deposition of sacrificial material on the first layer and thus the seed layer material may be removed prior to deposition of the sacrificial material.

In other variations of this embodiment the structural material on the first layer may be deposited after an initial deposition of sacrificial material on the first layer after which the initial deposition of sacrificial material may be removed along with the underlying seed layer material which may then be followed by deposition of the second seed layer material and re-deposition of sacrificial material. An implementation of embodiment 5 may include the following operation:

(1) Supply a dielectric substrate.
(2) Apply an adhesion layer to the surface of the substrate and then apply a seed layer to the adhesion layer. In some variations of this implementation the adhesion layer material may be titanium or chromium while the seed layer material may, for example, be gold.
(3) Apply a pattern of masking material to the surface of the substrate (i.e. the surface of the seed layer material). The pattern of the masking material leaves the seed layer material exposed in those regions where structural material is to be deposited.
(4) Plate the structural material onto the exposed portions of the seed layer via the voids or openings in the masking material.
(5) Remove the masking material to expose portions of the seed layer where a sacrificial material is to be located.
(6) Remove exposed regions of the seed layer material, for example, via a controlled etching operation that limits damage to boundary regions of the seed layer material that underlie the structural material.
(7) Deposit a different seed layer material onto the exposed surfaces of the adhesion layer material and possibly onto the side walls and outward facing surface of the structural material.
(8) Deposit a sacrificial material, for example, by electroplating in a selective or blanket manner such that the depth of deposition in the regions where the second seed layer material overlays the adhesion layer material is greater than or equal to the layer thickness LT and more preferably greater than or equal to LT plus an incremental amount δ.
(9) Planarize the deposited materials to a height equal to that of the layer thickness LT, to complete formation of the first layer.
(10) Form any additional layer or layers required to complete build up of the structure.
(11) Remove the sacrificial material, for example, by etching.
(12) Remove the second seed layer material for example by etching.
(13) Remove the exposed portions of the adhesion layer material to complete formation and release of the structure such that separate portions of the structure are conductively isolated from other portions of the structure.

FIGS. 10A-10L provide schematic illustrations of side views at various stages of the process of an example of this fifth embodiment of the invention which provides a first implementation of the example of block 146 of FIG. 5D.

Figure 10K:
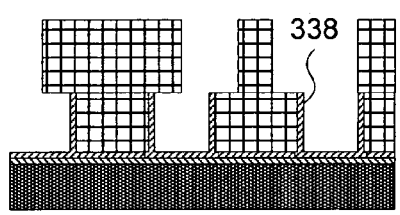
FIGS. 10A-10L provide schematic illustrations of side views at various stages of the process of a fifth embodiment of the invention which provides a first implementation of the example of block 146 of FIG. 5D.
Figure 10L:
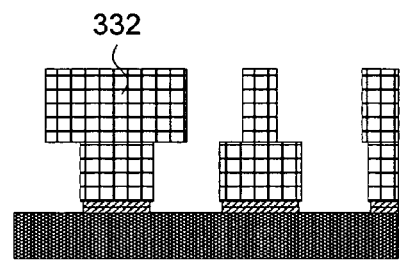
Figure 10A:

FIG. 10A shows the state of the process after the supplying of a substrate 322.

Figure 10B:
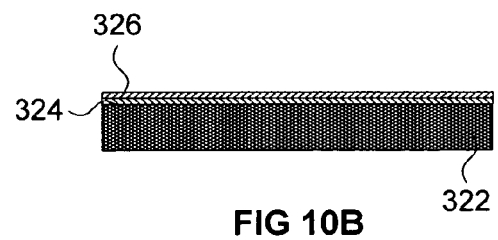

FIG. 10B shows the state of the process after an adhesion layer 324 is formed above substrate 322 and a seed layer 326 is formed above adhesion layer 324.

Figure 10C:
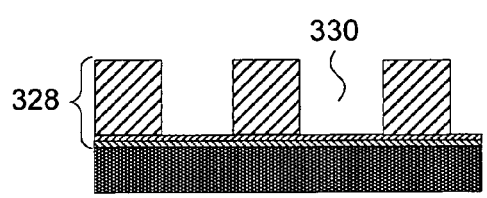

FIG. 10C shows the state of the process after a patterned mask 328 is applied to the surface of seed layer 326 wherein openings 330 exist in the mask which leave the portions of seed layer 326 exposed where a structural material is to be deposited.

Figure 10D:
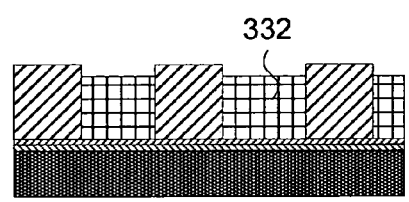

FIG. 10D shows the state of the process after a structural material 332 is deposited to a depth at least as great as a layer thickness and more preferably at last as great as a layer thickness plus an incremental amount δ.

Figure 10E:
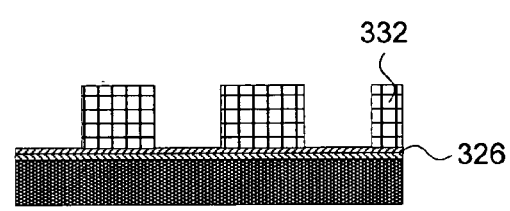

FIG. 10E shows the state of the process after mask 328 is removed which exposes those portions of seed layer 326 where a sacrificial material is to exist on layer 1.

Figure 10F:
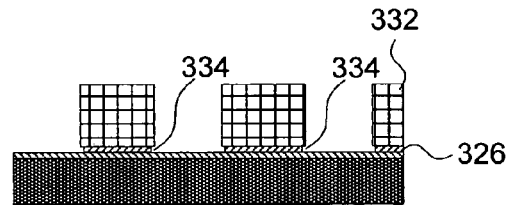

FIG. 10F depicts the state of the process after exposed portions of seed layer material 326 are removed. As indicated in FIG. 10F slight undercutting 334 may exist in a seed layer material located between the structural material and substrate as a result of the removal operation but using controlled etching operations it is believed that this undercutting can be held to a minimum and will not have a significantly negative impact on the formation of most structures.

Figure 10G:
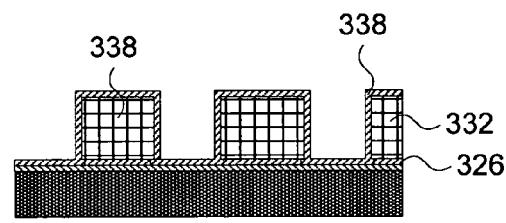

FIG. 10G depicts the state of the process after a second seed layer 338 is deposited over adhesion layer 334 as well as over the side walls and outward facing surface of structural material 332.

Figure 10H:
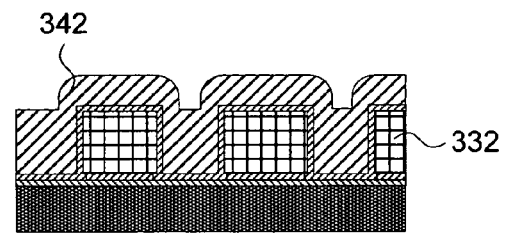

FIG. 10H depicts the state of the process after a sacrificial material 342 is blanket deposited over the second seed layer material such that voids in the structural material 332 are filled to a height equal to or greater than the layer thickness and more preferably equal to or greater than layer thickness plus an incremental amount.

Figure 10I:
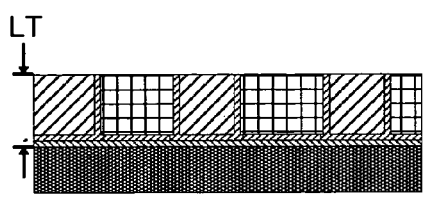

FIG. 10I shows the state of the process after a planarization operation trims the deposit heights to match the level associated with a layer thickness LT.

Figure 10J:
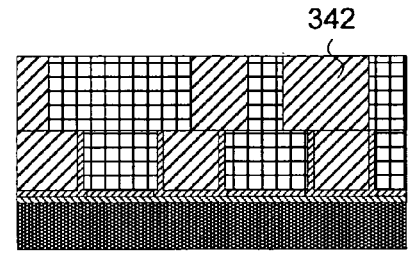

FIG. 10J depicts the state of the process after an additional layer is added to the structure.

FIG. 10K depicts the state of the process after sacrificial material has been removed and FIG. 10O depicts a state of the process after the second seed layer material 338 has been removed.

Turning back to FIG. 5D block 148 sets forth attributes associated with a third group of implementations of approach 142. The attributes include the removal of a first seed layer material and an associated adhesion layer material prior to the formation of the last layer of the structure and then the re-application of the adhesion layer material or the application of a different adhesion layer material in a blanket manner followed by the re-application of the seed layer material or the application of a different seed layer material either of which may occur in a blanket or selective manner. The regions from which the first seed layer and adhesion layer materials are to be removed may be those regions to be overlaid by the conductive sacrificial material or the conductive structural material. The process of block 148 gives rise to multiple embodiments of the present invention. The two embodiments to be discussed herein next (embodiment 6 and embodiment 7) are based on the approach of block 148.

A sixth embodiment of the invention involves the deposition of a sacrificial material onto a first layer prior to the deposition of a structural material. Operations associated with the sixth embodiment include the following:

(1) Supply a dielectric substrate.
(2) Apply a desired seed layer stack to the substrate. For example, the seed layer stack may include a titanium adhesion layer material and a gold seed layer material.
(3) Locate and pattern a masking material on the surface of the seed layer. The patterning of the mask material leaves portions of the seed layer material exposed and particularly leaves those portions of the seed layer exposed where a sacrificial material is to be deposited.
(4) Plate sacrificial material onto the seed layer material via the openings in the mask.
(5) Remove the masking material from the seed layer material.
(6) Blanket deposit or selectively deposit structural material such that exposed regions of the seed layer material are coated with structural material such that a net height of deposition in those regions equals or exceeds that of a layer thickness LT and more preferably LT+δ.
(7) Planarize the deposited materials to a height of LT+δ.
(8) Remove the deposited sacrificial material for example by etching so as to expose the underlying portions of the seed layer material.
(9) Remove the exposed seed layer material to expose underlying portions of the adhesion layer material.
(10) Remove exposed portions of the adhesion layer material, for example, by etching such that the portion of the substrate where sacrificial material is to exist is exposed as well as edges of the adhesion layer material and seed layer material and side walls of the structural material and outward facing surfaces of the structural material.

Apply a second adhesion layer material to the exposed surfaces. The application of the second adhesion layer material may be by sputtering or by other appropriate means. The second adhesion layer material may be the same as the initially applied adhesion layer material. For example they both may be titanium, they both may be chromium, the first may be titanium and the second may be titanium tungsten or vise versa.

(11) After application of the adhesion layer material apply a second seed layer material which may be the same or different from the first applied seed layer material.
(12) Deposit a sacrificial material to at least the regions to be occupied by sacrificial material (i.e. in the void regions in the patterned deposit of structural material). The sacrificial material may be deposited by electroplating and is preferably deposited to achieve a net thickness at least as great as the layer thickness and more preferably is at least as great as the layer thickness plus β.
(13) Trim the deposited materials to a height corresponding to that of the layer thickness so as to complete formation of the first layer.
(14) Add one or more additional layers as appropriate to complete formation of the structure.
(15) Remove the sacrificial material from the structure, for example, by etching so as to expose or even remove the second seed layer material.
(16) If not removed by the operation of FIG. 16, remove the second seed layer material, for example, by etching.
(17) Remove the second adhesion layer material, for example, by etching to complete formation of a released structure where separated portions of the structure are conductively decoupled from one another.

As noted above with regard to embodiment 6 the two seed layer materials may be the same or different and/or the two adhesion layer materials may be the same or different.

In still further embodiments additional materials may be added to the seed layer stacks. For example, in one alternative the structural material may be nickel, the sacrificial material may be copper the first adhesion layer material may be titanium and the first seed layer material may be gold while the second adhesion layer material is titanium tungsten and the second seed layer material may be copper (e.g. applied by sputtering). In such an alternative the titanium and titanium tungsten adhesion layers are preferably very thin, for example, between 100 angstroms and 1000 angstroms in thickness and the seed layer materials may have somewhat greater thicknesses, for example, on the order of 0.1 microns to 1.5 microns. Most preferably the adhesion layer thicknesses are on the order of 300 to 500 angstroms and the seed layer thicknesses are on the order of 0.3 to 0.7 microns.

Of course in other alternative embodiments thinner or thicker adhesion layers are possible. One advantage to the choice of adhesion layer materials and seed layer materials in this alternative is that the etchant for the sacrificial material (e.g. C-38) will not only remove the sacrificial material but will also remove the second seed layer material (i.e. copper)

and the second adhesion layer material (i.e. Ti—W) but will not significantly attack the first adhesion layer material regardless of the fact that it is very thin and sandwiched between structural material and the substrate.

FIGS. 11A-11K provide schematic illustrations of side views at various stages of an example of the process of the sixth embodiment of the invention.

Figure 11A:
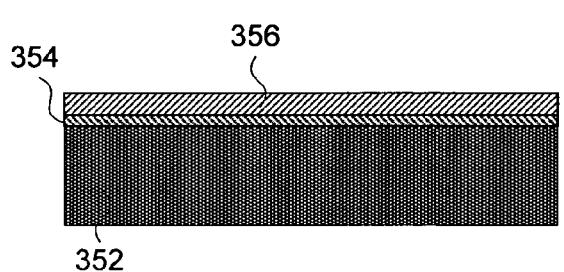

FIG. 11A depicts a state of the process after a supplied substrate 352 has received an adhesion layer 354 (e.g. titanium) and a seed layer material 356 (e.g. gold).

Figure 11B:
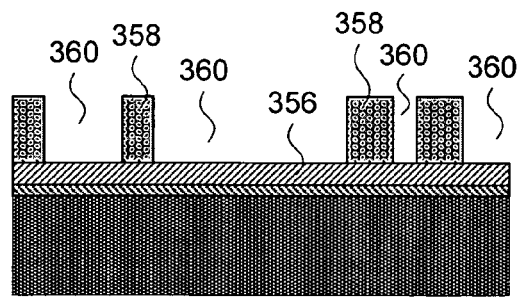

FIG. 11B depicts a state of the process after a masking material 358 (e.g. patterned photoresist) has been patterned to have openings 360 exposing selected portions of seed layer 356 where the openings in masking material 358 correspond to locations on the seed layer where sacrificial material is to be deposited.

Figure 11C:
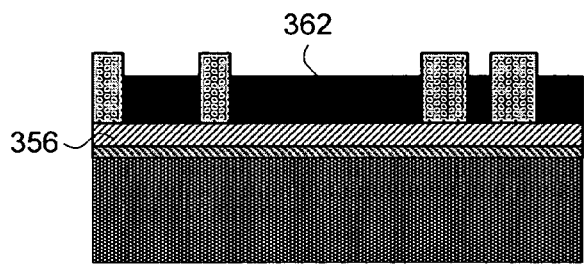

FIG. 11C depicts a state of the process after deposition of a sacrificial material 362 on the exposed portions of seed layer material 356.

Figure 11D:
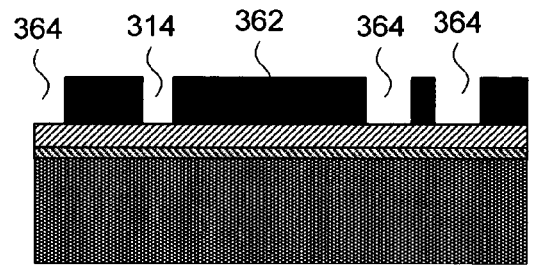

FIG. 11D depicts a state of the process after mask material 358 has been removed revealing openings or voids 364 in the sacrificial material 362.

Figure 11E:
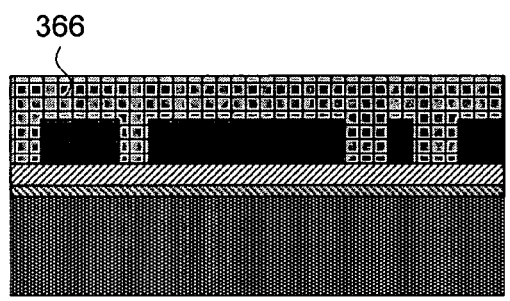

FIG. 11E depicts a state of the process after the blanket deposition of a structural material 366.

Figure 11F:
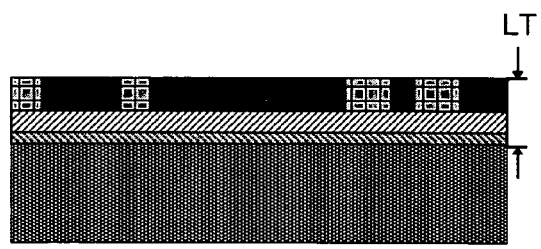

FIG. 11F depicts a state of the process after the deposits of material have been planarized to a height slightly above the level associated with layer thickness LT.

FIG. 11G depicts a state of the process after sacrificial material has been removed according to operation 8 as discussed above.

FIG. 11H depicts a state of the process after the exposed portion of the seed layer material and exposed portions of the adhesion layer material have been removed to expose portions of substrate 352 where sacrificial material is to exist.

FIG. 11I shows a state of a process after an adhesion layer of a second adhesion layer material 368 has been deposited and a seed layer of second seed layer material 372 has been deposited.

FIG. 11J depicts a state of the process after the blanket re-deposition of a sacrificial material 362.

FIG. 11K depicts a state of the process after planarization of the deposited materials to a height equal to that of the layer thickness. After formation of any additional layers the sacrificial material 362 may be removed via etching and therewith or thereafter seed layer material 372 may be removed and therewith or thereafter adhesion layer material 368 may be removed while doing little or no significant damage to the structural material 366, seed layer material 354, or adhesion layer material 354.

A seventh embodiment of the invention provides a process similar to that of the sixth embodiment of the invention with the exception that the structural material for the first layer is deposited prior to any deposition of sacrificial material. The process flow for the seventh embodiment includes the following operations:

(1) Supply a dielectric substrate.
(2) Apply an adhesion layer of a first material to the dielectric substrate and then apply a seed layer of a first seed layer material to the adhesion layer.
(3) Mask the substrate using a pattern that leaves the seed layer exposed in those areas where a structural material is to be deposited.
(4) Electroplate the structural material onto the exposed portions of the seed layer.
(5) Remove the masking material.
(6) Remove exposed portions of the first seed layer material.

(7) Remove exposed portions of the first adhesion layer material.
(8) Apply an adhesion layer of a second adhesion layer material to the exposed portions of the substrate to the side walls of the adhesion and seed layer materials located below the structural material, the side walls of the structural material itself, and to the outward facing surface of the structural material.
(9) Apply a seed layer of a second seed layer material to the surface of the second adhesion layer material.
(10) Electroplate sacrificial material over the second seed layer material such that the deposition thickness of the sacrificial material brings the minimum height of deposition to that of the layer thickness or more preferably to something equal to or greater than the layer thickness plus an incremental amount.
(11) Planarize the deposited materials at a level corresponding to the height of the first layer.
(12) Add additional layers as desired to complete formation of the structure.
(13) Remove the sacrificial material, for example, by etching, and potentially remove the second seed layer material and the second adhesion layer material using the same etching operation.
(14) Remove the second seed layer material if not already done so in operation 13.
(15) Remove the second adhesive layer material (i.e. from exposed regions of material if not already done so in operations 13 or 14 so as to complete formation of the released structure where separate components of the structure are conductively isolated from one another.

FIGS. 12A-12I provide schematic illustrations of side views at various stages of an example of the process of the seventh embodiment of the invention.

Figure 12A:
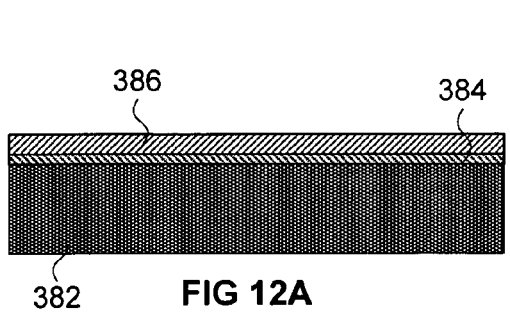
FIGS. 12A-12I provide schematic illustrations of side views at various stages of the process of a seventh embodiment of the invention which provides a second implementation of the example of block 148 of FIG. 5D.

FIG. 12A depicts a state of the process where an initial substrate 382 is provided which includes a coating of an adhesion layer 384 and a seed layer 386.

Figure 12B:
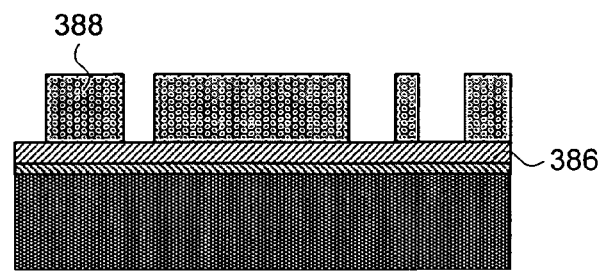
Figure 12C:
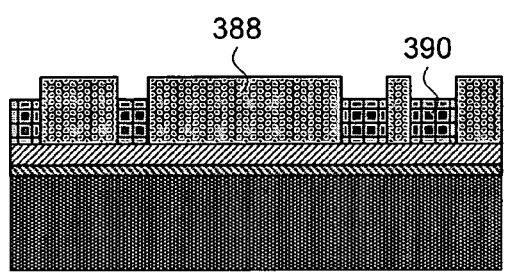

FIG. 12B shows a state of the process after a patterned mask has been applied to the surface where openings in the mask leave selected areas of the seed layer 386 exposed and where the selective areas correspond to regions where structural material 390 is deposited within the openings of mask material 388.

Figure 12D:
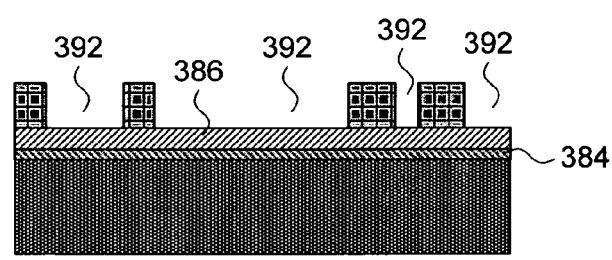
Figure 12E:
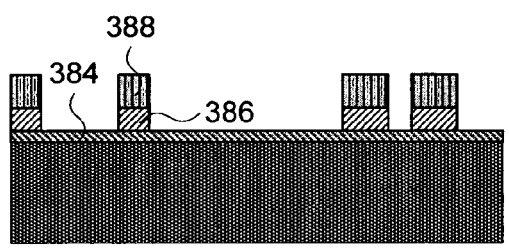

FIG. 12D depicts a state of the process after the masking material 388 has been removed. The removal of the masking material reveals voids 392 where a sacrificial material is to be deposited FIG. 12E depicts a state of the process after exposed portions of seed layer material 386 have been removed and voids 392 have been extended in depth.

Figure 12F:
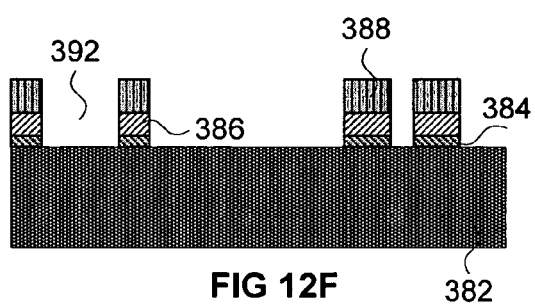

FIG. 12F depicts a state of the process after exposed regions of the first adhesion layer material have been removed thereby extending the height of voids 392 all the way down to substrate 382.

Figure 12G:
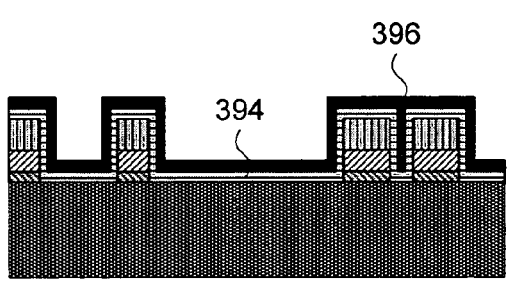

FIG. 12G depicts a state of the process after a second adhesion layer of a second adhesion layer material 394, and deposition of a second seed layer of a second seed layer material 396 are deposited over the substrate and all pervious depositions located thereon.

Figure 12H:
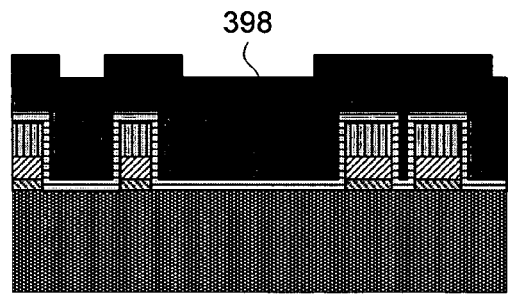
Figure 12:
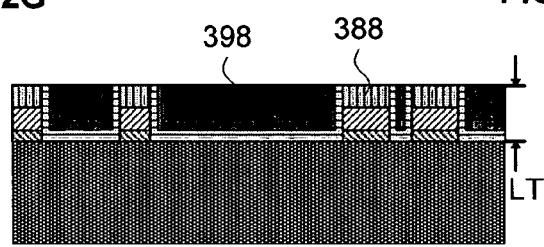

FIG. 12H depicts the state of the process after a sacrificial material 398 has been blanket deposited.

FIG. 12I depicts a state of the process after the deposits have been planarized to a height of one layer thickness LT.

As with the sixth embodiment additional layers may be deposited on the first layer as desired and then after completion of a layer formation sacrificial material 398 may be removed simultaneously thereafter the second seed layer may be removed and simultaneously or thereafter the second adhesion layer material me be removed. It is worth noting that in the sixth and seventh embodiments the second seed layer material does not directly contact the first seed layer material or the first adhesion layer material and in fact is completely shielded from them by a barrier of the second adhesion layer material.

In implementation where the second adhesion layer material is not attacked by the process or etchant that removes the second seed layer material, the first adhesion layer material and the first seed layer material will remain protected and thus these first adhesion and seed layer materials may actually be materials that would be attacked by the etchants or processes that remove the sacrificial material or the second seed layer material. In other words, in some implementations the blanket deposition of the second adhesion layer material may act as an etching barrier protecting what is below it.

Similarly the blanket deposition of the second seed layer material may act as a barrier layer protecting what is below it from any attack by etchants or processes used to remove the sacrificial material.

Turning back to FIG. 5D, block 150 sets forth the fourth implementation example which calls for the removal of both seed layer and adhesion materials after deposition of a structural material and then the depositing of a seed layer material in the regions where a sacrificial material is to be deposited.

An example of this implementation is set forth in an eighth embodiment of the invention which includes the following operations:

(1) Supply a dielectric substrate.
(2) Apply an adhesion layer and a seed layer to the dielectric substrate.
(3) Locate a patterned mask on the surface of the substrate wherein the patterned mask provides openings that leave those regions of the substrate that are intended to receive structural material exposed.
(4) Plate the structural material.
(5) Remove the mask from the substrate.
(6) Remove exposed regions of the seed layer material (i.e. defined by locations where a sacrificial material will be deposited).
(7) Remove exposed regions of the adhesion layer material.
(8) Deposit a second and different seed layer material.
(9) Deposit a sacrificial material for example by electroplating.
(10) Complete formation of the first layer by planarizing the deposits to a height corresponding to the layer thickness of the first layer of the structure.
(11) Form any additional desired layer or layers necessary to complete formation of the layers of the structure.
(12) Remove the sacrificial material, for example, by etching, and potentially remove the second seed layer material and potentially remove exposed regions of the adhesion layer material.
(13) If not already done so in step 12 remove the second seed layer material, for example, by etching.
(14) If not already done in operations 12 or 13 remove exposed regions of the adhesion layer material to yield a completed structure where separate regions of the structure are conductively isolated from one another.

In a variation of embodiment 8, lapping or other planarization operations may occur between operations 4 and 5. Numerous other alternatives to this and the other embodiments disclosed herein will be apparent to those of skill in the art upon review of the teachings herein. Furthermore those of skill in the art will understand that additional operations may be preformed during the practice of the various embodiments set forth herein. For example, it will be understood that cleaning operations, activation operations, process monitoring operations, and the like may be performed as necessary.

FIGS. 13A-13M provide schematic illustrations of side views at various stages of the process of an example of an eighth embodiment of the invention which provides a second implementation of the example of block 150 of FIG. 5D.

Figure 13A:
FIGS. 13A-13M provide schematic illustrations of side views at various stages of the process of an eighth embodiment of the invention which provides a first implementation of the example of block 150 of FIG. 5D.
Figure 13B:
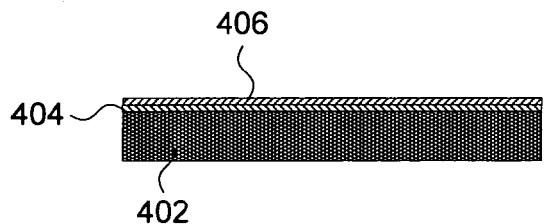

FIG. 13A depicts a state of the process after a dielectric substrate 402 has been supplied while FIG. 13B depicts a state of the process after an adhesion layer 404 and a seed layer 406 have been adhered to substrate 402.

Figure 13C:
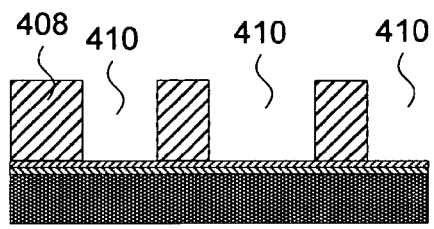

FIG. 13C depicts a state of the process after a patterned mask 408 has been located on the surface of seed layer 406 where openings 410 and the mask pattern leave those portions of the seed layer 406 exposed where a structural material is to be deposited.

Figure 13D:
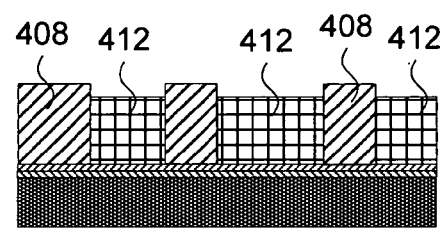

FIG. 13D depicts a state of the process after a structural material 412 has been deposited in openings 410.

Figure 13E:
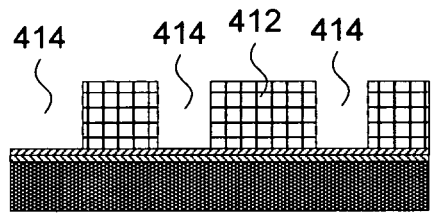

FIG. 13E depicts a state of the process after mask material 408 has been removed and voids 414 in the structural material 412 revealed.

Figure 13F:
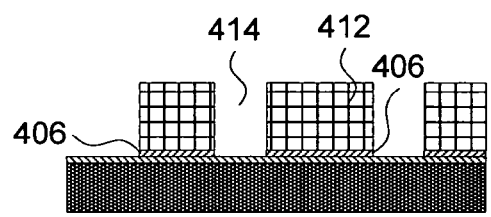

FIG. 13F depicts a state of the process after exposed portions of seed layer 406 are removed thereby causing voids 414 to grow deeper in depth.

Figure 13G:
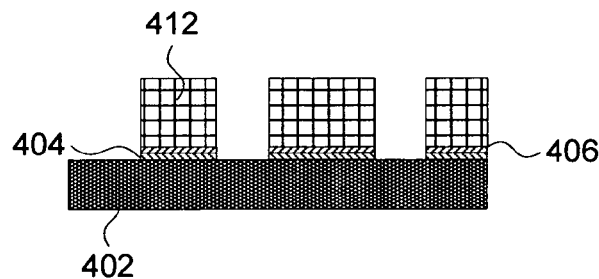

FIG. 13G depicts a state of the process after exposed portions of adhesion layer 404 are removed thereby exposing the surface of substrate 402.

Figure 13H:
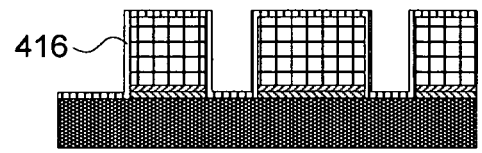

FIG. 13H represents a state of the process after a second seed layer material 416 has been deposited over the exposed regions of the substrate, the exposed sidewalls of the structural material, as well as the outward facing surface of the structural material.

Figure 13I:
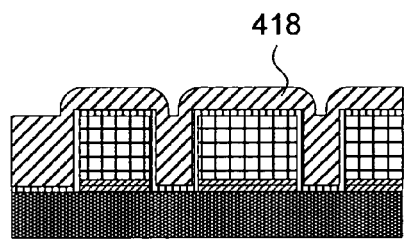

FIG. 13I depicts a state of the process after a blanket deposition of a sacrificial material 418 has occurred.

Figure 13J:
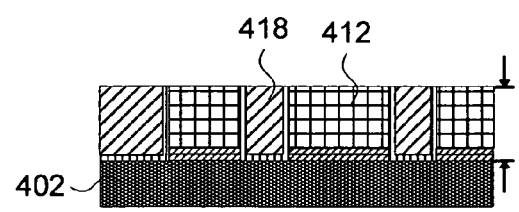

FIG. 13J depicts a state of the process after a trimming operation which diminishes the height of the deposited materials to a level corresponding to the layer thickness of the first layer of the structure.

Figure 13K:
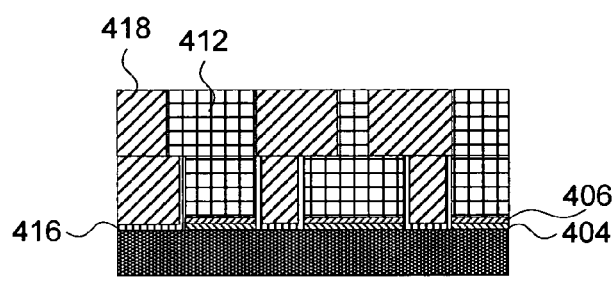

FIG. 13K depicts a state of the process after formation of a second layer over and adhered to the first layer.

Figure 13L:
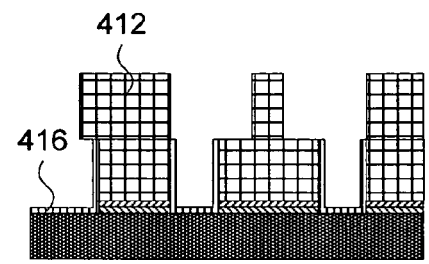

FIG. 13L depicts the state of the process after removal of sacrificial material 418 leaving all portions of structural material 412 conductively connected via seed layer 416.

Figure 13M:
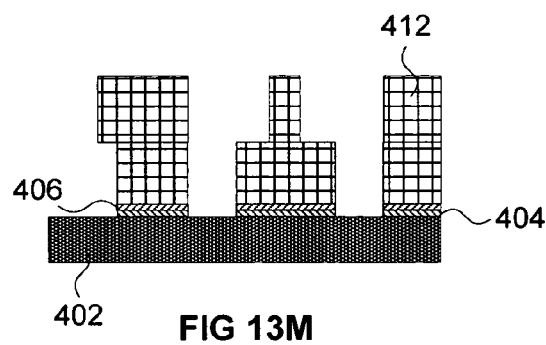

FIG. 13M depicts the state of the process after removal of seed layer 416 which yields the released structure comprised primarily of structural material 412 which is attached to substrate 402 via seed layer 406 and adhesion layer 404 wherein separate portions of structure 412 are conductively isolated from one another.

FIG. 5E provides a block diagram indicating three implementations associated with the second example implementation of FIG. 5B where two alternatives for the third implementation are given.

Block 154 of FIG. 5E provides a first implementation example for the process of block 152. In this example adhesion layer material is made to cover the substrate. A first seed layer material is deposited over structural material regions and structural material is deposited, then a second seed layer material is deposited over the sacrificial material region and then a sacrificial material is deposited.

A ninth embodiment of the invention provides more explicit process operations associated with the example of block 154. Operations associated with the ninth embodiment of the invention include:

(1) Supply a dielectric substrate.
(2) Apply an adhesion layer material across the surface of the substrate.

(3) Apply a patterned mask or pattern a mask applied to the surface of the adhesion layer material where openings in the mask expose regions of the adhesion layer material where a structural material is to be deposited.

(4) Apply a seed layer material to the exposed regions of the adhesion layer material, to the side walls of the mask material, and to the outward facing surface of the mask material. The selected seed layer material should be appropriate for use with the structural material.

(5) Electroplate a structural material onto the seed layer material within the openings in the mask.

(6) Planarize the surface of the deposited materials and mask material at a height slightly greater then that of the layer thickness.

(7) Remove the mask from the substrate.

(8) Deposit a second seed layer material in the voids in the structural material exposed by the removal of the mask. In some variations of this embodiment the second seed layer material may be deposited on the side walls of the structural material as well as on the outward facing surface of the structural material. In other variations the locations where the second seed layer material is deposited may be more restricted.

(9) Deposit a sacrificial material so that it occupies the voids in the structural material such that the minimum height of deposition as equal to or preferably greater than the layer thickness and even more preferably equal to or greater than an incremental amount δ above the layer thickness level.

(10) Planarize the deposited materials to complete formation of a first layer of the structure.

(11) As appropriate add additional layers of material to the structure.

(12) Remove the sacrificial material, for example, by etching and potentially simultaneously remove the second seed layer material and potentially even exposed regions of the adhesion layer material.

(13) If not already removed by operation 12, remove the second seed layer material, for example, by etching.

(14) If not already removed by operations 11 or 12, remove exposed regions of the adhesion layer material to yield a released structure where separated portions of the structure are conductively isolated form one another.

Figure 14A:
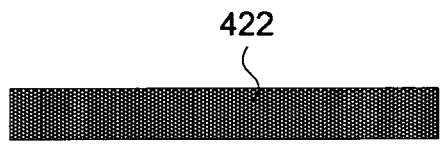
FIGS. 14A-14N provide schematic illustrations of side views at various stages of the process of a ninth embodiment of the invention which provides a first implementation of the example of block 154 of FIG. 5E.
Figure 14B:
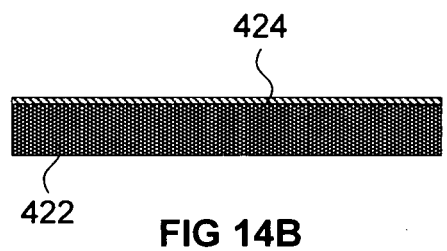
Figure 14C:
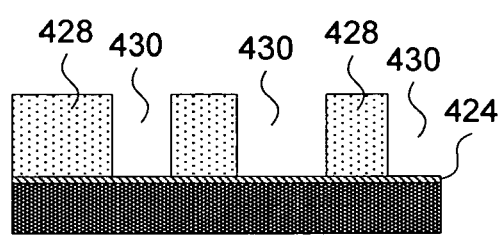
Figure 14D:
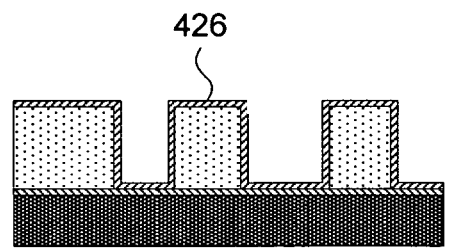
Figure 14E:
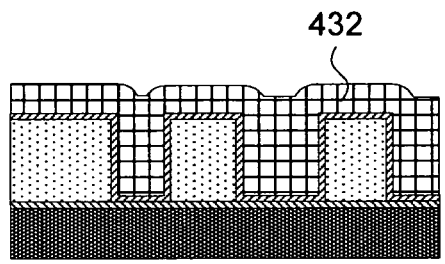
Figure 14F:
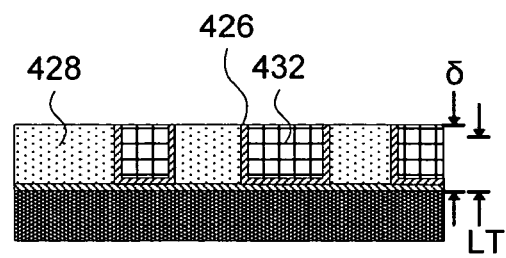
Figure 14G:
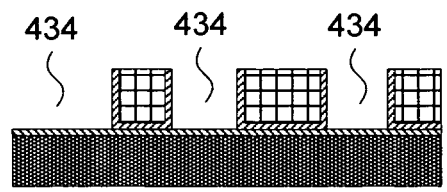
Figure 14H:
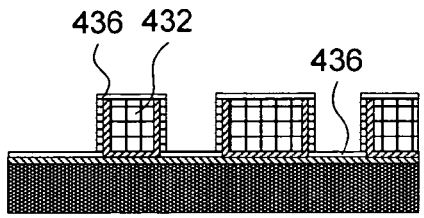
Figure 14I:
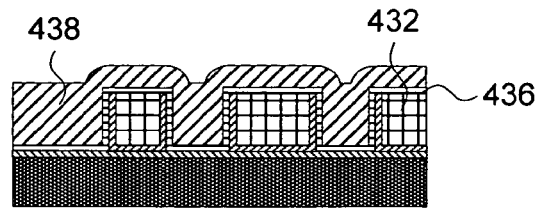
Figure 14J:
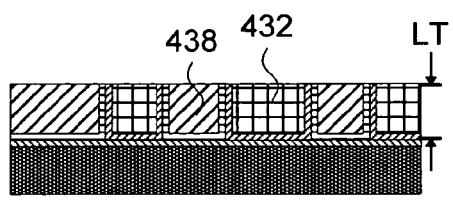
Figure 14K:
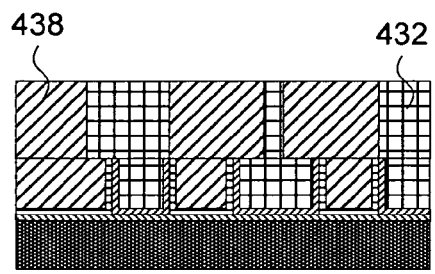
Figure 14L:
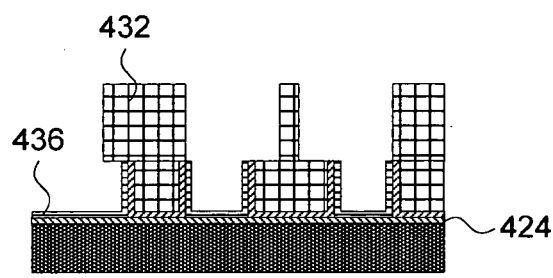
Figure 14M:
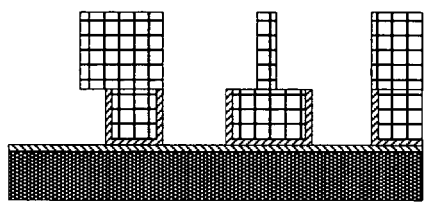
Figure 14N:
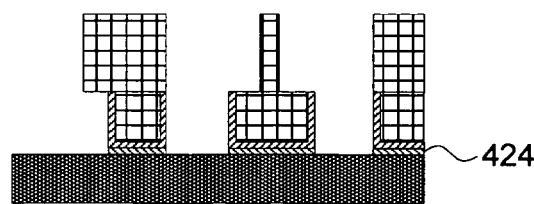

FIGS. 14A-14N provide schematic illustrations of side views at various stages of the process of a ninth embodiment of the invention as applied in a specific example.

FIG. 14A depicts a state of the process after a substrate 422 is provided while FIG. 14B depicts a state of the process after substrate 422 has received an adhesion layer 424.

FIG. 14C depicts a state of the process after a mask 428 has been patterned on adhesion layer 424 leaving voids 430 that expose portions of the adhesion layer material 424.

FIG. 14D depicts a state of the process after deposition of a seed layer material 426 locates seed layer material over the exposed portions of the adhesion layer material 424, along the side walls of mask 428, and along the top surface or outward facing surface of mask 428.

FIG. 14E shows the state of the process after blanket deposition of a structural material 432 deposits material into the voids 430 as well as above the outward facing surface of mask 428.

FIG. 14F shows the state of the process after the deposited materials are planarized to a height which is greater than the layer thickness by at least an incremental amount δ. This planarization operation exposes mask material 428 by trimming of the top portions of structural material 432 and seed layer material 426.

FIG. 14G depicts a state of the process after masking material 428 is removed, thus exposing voids 434 in the structural material.

FIG. 14H depicts a state of the process after a second seed layer material 436 is deposited over the exposed regions of adhesion layer 424, side walls of the structural material (which are already coated with the first seed layer material), and the upper surface of structural material 432.

FIG. 14I depicts a state of the process after blanket deposition of a sacrificial material 438 fills the voids 434 and coats over the upper surface of seed layer material 436 located on structural material 432.

FIG. 14J depicts a state of the process after the first layer of structure is completed by the planarization of the deposited materials to a height corresponding to the layer thickness LT.

FIG. 14K depicts a state of the process after formation of a second layer of conductive structural and sacrificial materials is formed.

FIG. 14L depicts a state of the process after sacrificial material 438 is removed which yields a partially released structure of desired configuration consisting primarily of structural material 432 but where the second seed layer material and the adhesion layer material conductively connect otherwise separate elements of the structure together.

FIG. 14M depicts a state of the process after the second seed layer material 436 is removed while FIG. 14N depicts the state of the process after exposed regions of adhesion layer material 424 have been removed.

Block 156 of FIG. 5E sets forth an implementation of the process of block 152 that defines an implementation similar to but opposite to that set forth in block 154. In particular, in block 156 an adhesion layer material covers the substrate as it did in block 154, but an initially applied seed layer coats the adhesion layer in regions where a sacrificial material is to be located as opposed to a structural material as called for in block 154. The process of block 156 continues with the deposition of sacrificial material followed by the deposition of a second seed layer material in regions where a structural material is to be deposited and then by the deposition of the structural material itself.

The process of block 156 is implemented in a tenth embodiment of the invention which includes the followed basic operations:

(1) Supply a dielectric substrate.

(2) Apply an adhesion layer material across the surface of the substrate.

(3) Apply a patterned mask to the substrate or alternatively, apply a masking material to the substrate and pattern it such that openings in the mask material leave portions of the adhesion layer material exposed where a sacrificial material is to be deposited.

(4) Apply a first seed layer material to the regions to be occupied by sacrificial material. The application of the seed layer material may result in its deposition not only to the exposed surfaces of the adhesion layer material but also to the surfaces of the mask material.

(5) Electroplate sacrificial material onto the seed layer covered portions of the adhesion layer material. The deposition of the sacrificial material may also cause sacrificial material to be deposited on the seed layer material covering the mask material.

(6) Planarize the deposited materials and mask materials to a height that is equal to or greater than the layer thickness plus an incremental amount.

(7) Remove the mask material. For example, if the mask material is a photoresist material, remove it using a standard stripping process.

(8) Deposit a second seed layer material into void regions in the sacrificial material which were exposed by the removal of the mask material. These void regions represent regions where a conductive structural material is to be deposited. The deposition of the seed layer material may or may not result in seed layer material covering the walls and outward facing surface of the deposited sacrificial material.

(9) Deposit the structural material into the void regions where a minimum height of deposition is preferably greater than or equal to the layer thickness plus an incremental amount. The incremental amount may be an amount that is greater than or equal to a tolerance associated with the planarization operations that are used in setting layer levels and the like.

(10) Planarize the surface of the deposited materials such that a height corresponding to the layer thickness is achieved so as to complete formation of the first layer of the structure.

(11) Form one or more additional layers as appropriate to complete formation of the structure.

(12) Remove the sacrificial material, for example, by etching, and potentially simultaneously remove the second seed layer material and potentially even exposed regions of the adhesion layer material.

(13) If not already removed by operation 12, remove the second seed layer material, for example, by etching.

(14) If not already removed by operations 11 or 12, remove exposed regions of the adhesion layer material to yield a released structure where separated portions of the structure are conductively isolated form one another.

Figure 15A:
FIGS. 15A-15N provide schematic illustrations of side views at various stages of the process of a tenth embodiment of the invention which provides a first implementation of the example of block 156 of FIG. 5E.
Figure 15B:
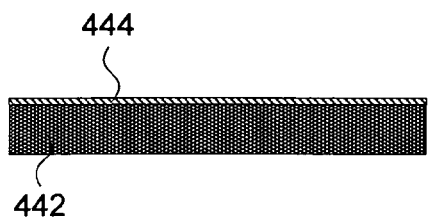
Figure 15C:
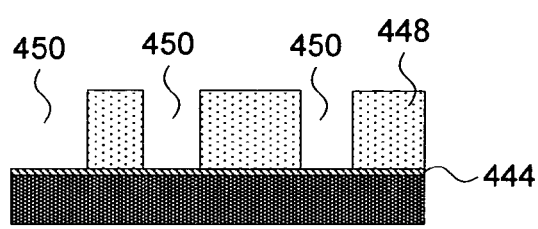
Figure 15D:
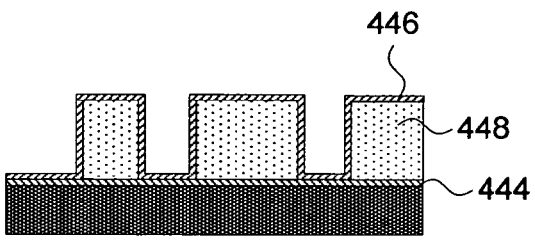
Figure 15E:
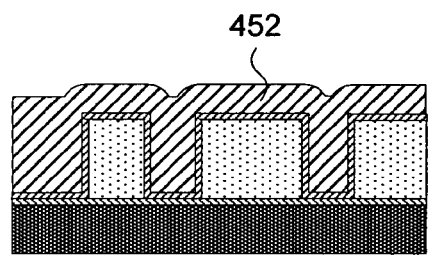
Figure 15F:
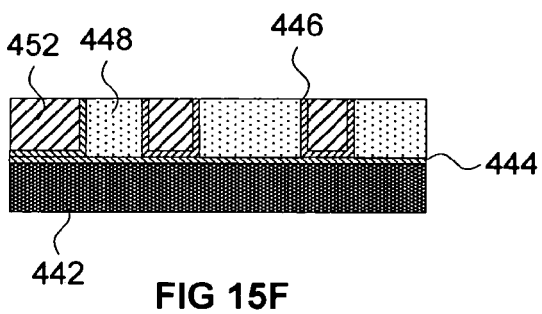
Figure 15G:
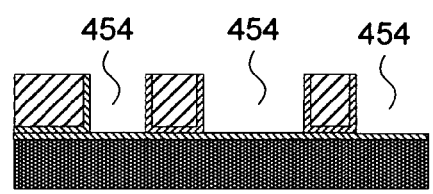
Figure 15H:
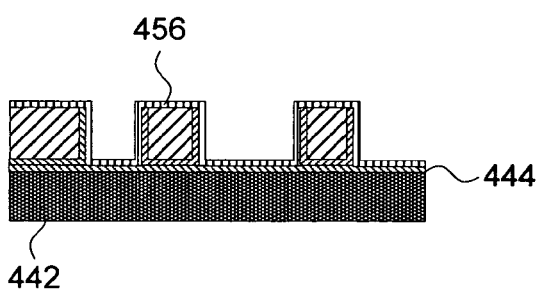
Figure 15I:
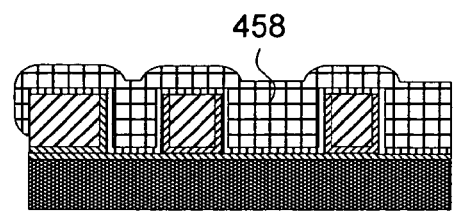
Figure 15J:
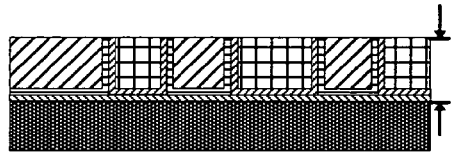
Figure 15K:
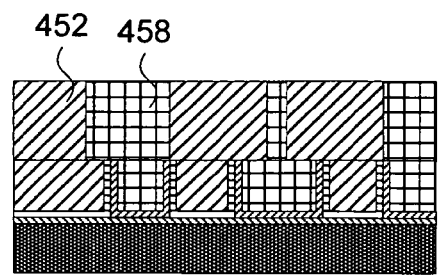
Figure 15L:
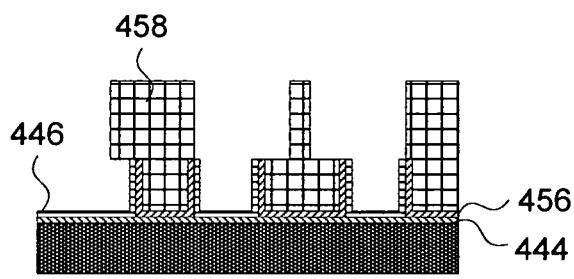
Figure 15M:
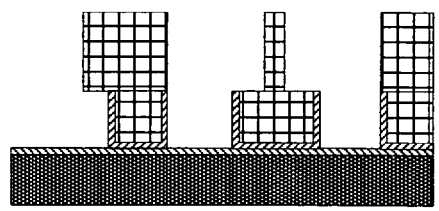
Figure 15N:
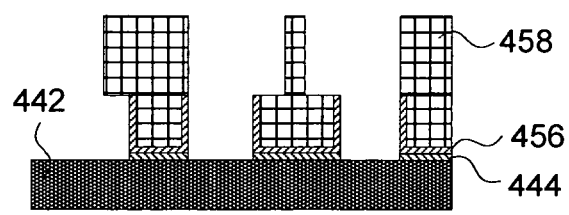

FIGS. 15A-15N provide schematic illustrations of side views at various stages of the process of a tenth embodiment of the invention as applied in a specific example.

FIG. 15A depicts the state of the process after a substrate 442 has been supplied.

FIG. 15B depicts a state of the process after an adhesion layer material 444 is deposited on substrate 442.

FIG. 15C depicts a state of the process after a patterned mask material 448 is located on the adhesion layer 444. Openings 450 exist in mask material 448 and represent locations where sacrificial material is to exist on the first layer of the structure.

FIG. 15D depicts a state of the process after a seed layer material 446 is applied to the exposed regions of adhesion layer material 444 and to exposed surfaces of mask material 448.

FIG. 15E depicts a state of the process after blanket deposition of a sacrificial material 452 causes the sacrificial material to be located in voids 450 as well as over the seed layer material that is located on the mask material 448.

FIG. 15F depicts a state of the process after a planarization operation trims the deposit heights to a level just above that associated with a desired layer thickness for the first layer.

FIG. 15G depicts a state of the process after mask material 448 has been removed and portions of adhesion layer 444 are exposed and voids 454 in the sacrificial material are revealed.

FIG. 15H depicts a state of the process after a second seed layer material 456 is deposited onto the exposed regions of adhesion layer 444 as well as on side walls and outward facing surfaces of sacrificial material 452.

FIG. 15I depicts a state of the process after a blanket deposition of structural material 458 causes structural material to fill the voids 454 to a minimum height equal to the layer thickness plus an incremental amount.

FIG. 15J depicts a state of the process after the formation of the first layer of the structure is completed as a result of a planarization operation which trims the height of the depositions to that of the layer thickness.

FIG. 15K depicts a state of the process after a second layer has been deposited and adhered to the first layer.

FIG. 15L depicts a state of the process after sacrificial material 452 has been removed.

FIG. 15M depicts a state of the process after removal of the first seed layer material 446.

FIG. 15N depicts a state of the process after removal of exposed regions of adhesion layer 444 which result in completion of the structure where separate regions of the structure are conductively isolated from one another.

Block 162 of FIG. 5E specifies a third more detailed implementation of the process of block 152 wherein a seed layer material is applied only to regions where sacrificial material will be deposited while regions where a structural material is to be located will receive a nickel deposit via a nickel strike operation.

Blocks 164 and 166 provide two alternative examples of how the process of block 162 might be implemented.

Block 164 calls for the deposition of the structural material prior to deposition of sacrificial material while block 166 calls for the deposition of sacrificial material prior to that of structural material.

The approach of block 164 is implemented in an eleventh embodiment of the invention which involves the following primary operations:

(1) Supply a dielectric substrate on which to form a structure.

(2) Apply an adhesion layer material across the surface of the substrate.

(3) Form a desired pattern of a masking material on the substrate such that openings in the mask material leave portions of the adhesion layer material exposed, and in particular, portions of the adhesion layer material where a structural material is to be deposited.

(4) Perform a nickel plating strike e.g. a woods strike, on the exposed portions of the adhesion layer material.

(5) Plate structural material over the region that has received the nickel strike.

(6) Remove the mask material. In variations of this embodiment it may be desirable to planarize the masking material and structural material prior to removing the mask material but it is believed not to be necessary as the masking material is not covered by seed layer material or structural conductive material.

(7) Deposit a second seed layer material (the nickel strike may be considered the first seed layer material which was selectively deposited). The second seed layer material is located on the adhesion layer material in those regions where the mask material was removed, while the seed layer may also be deposited onto the side walls of the structural material as well as on the outward facing surface of the structural material.

(8) Next sacrificial material is deposited to fill the voids in the structural material where the minimum height of deposition is preferably greater than the layer thickness plus an incremental amount.

(9) Planarize the deposited material at a level corresponding to the thickness of the first layer.

(10) Add one or more additional layers to complete build up of the layers of the structure.

(11) Form one or more additional layers as appropriate to complete formation of the structure.

(12) Remove the sacrificial material, for example, by etching and potentially simultaneously remove the second seed layer material and potentially even exposed regions of the adhesion layer material.

(13) If not already removed by operation 12, remove the second seed layer material, for example, by etching.

(14) If not already removed by operations 11 or 12, remove exposed regions of the adhesion layer material to yield a released structure where separated portions of the structure are conductively isolated form one another.

The approach of block 166 is implemented in a twelfth embodiment of the invention which includes the following major operations:

(1) Supply a dielectric substrate on which the structure is to be formed.

(2) Apply an adhesion layer material across the surface of the substrate.

(3) Locate patterned masking material on the substrate so as to leave regions of the adhesion layer material exposed where sacrificial material is to be deposited.

(4) Apply a first seed layer material to the exposed regions of the adhesion layer material as well as to the side walls and outward facing surface of the masking material.

(5) Plate sacrificial material onto the first seed layer material such that a minimum height of deposition in the open regions of the mask reach or exceed the layer thickness plus an incremental amount.

(6) Planarize the masking material and the deposited materials to a height equal to the layer thickness plus an incremental amount.

(7) Remove the mask material to expose portions of the adhesion layer material where a sacrificial material is to be deposited.

(8) Perform a nickel strike on the exposed surfaces of the adhesion layer material to form an appropriate seed layer so that electroplated nickel may be received.

(9) Electrodeposit the structural material onto the region that received the nickel strike such that a minimum height of deposition equals or exceeds that of the layer thickness and more preferably the layer thickness plus an incremental amount.

(10) Planarize the deposited materials to achieve a net height equal to that of the layer thickness.

(11) Form one or more additional layers as appropriate to complete formation of the structure.

(12) Remove the sacrificial material, for example, by etching and potentially simultaneously remove the second seed layer material and potentially even exposed regions of the adhesion layer material.

(13) If not already removed by operation 12, remove the second seed layer material, for example, by etching.

(14) If not already removed by operations 11 or 12, remove exposed regions of the adhesion layer material to yield a released structure where separated portions of the structure are conductively isolated form one another.

FIGS. 16A-16M provide schematic illustrations of side views at various stages of the process of an eleventh embodiment of the invention as applied to the formation of a particular structure.

FIG. 16A depicts a state of the process after a substrate 462 has been supplied.

FIG. 16B depicts a state of the process after substrate 462 has received an adhesion layer 464.

FIG. 16C depicts a state of the process after a masking material 468 has been applied to the surface of adhesion layer material 646. Openings 470 in mask material 468 correspond to locations where a structural material is to be deposited.

FIG. 16D depicts a state of the process after a nickel deposit 466 coats the exposed portions of adhesion layer material 464.

FIG. 16E depicts a state of the process after electrodeposition of structural material 472 is deposited onto nickel strike material 466.

FIG. 16F depicts a state of the process after mask material 468 is removed which reveals voids 474 in structural material 472.

FIG. 16G depicts a state of the process after a second seed layer material 476 is deposited onto adhesion layer 464 and onto the side walls and outward facing surface of structural material 472.

FIG. 16H depicts a state of the process after a blanket deposition of sacrificial material 478 results in sacrificial material filling the voids 474 in the structural material.

FIG. 16I depicts a state of the process after the first structural layer is completed by a planarization operation which trims the height of the deposits to correspond to that of the desired layer thickness.

FIG. 16J depicts a state of the process after a second layer of material has been formed above the first layer of material.

Figure 16K:
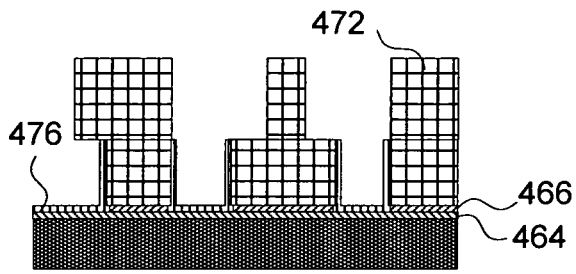

FIG. 16K depicts a state of the process after sacrificial material 478 has been removed.

Figure 16L:
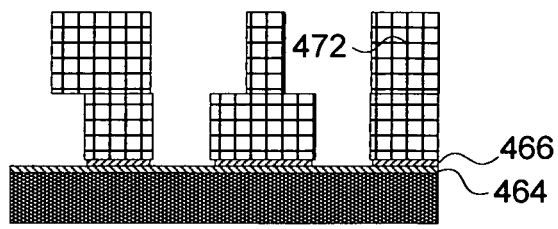

FIG. 16L depicts a state of the process after seed layer material 476 has been removed.

Figure 16M:
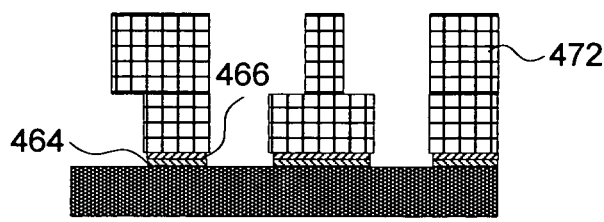

FIG. 16M depicts a state of the process after exposed regions of adhesion layer material have been removed.

Figure 17K:
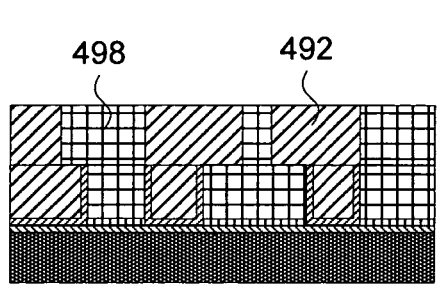
FIGS. 17A-17N provide schematic illustrations of side views at various stages of the process of a twelfth embodiment of the invention which provides a first implementation of the example of block 166 of FIG. 5F.
Figure 17L:
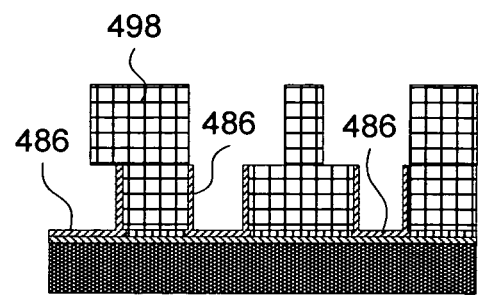
Figure 17M:
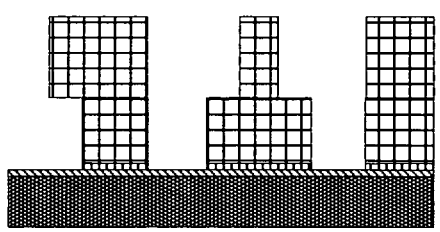
Figure 17N:
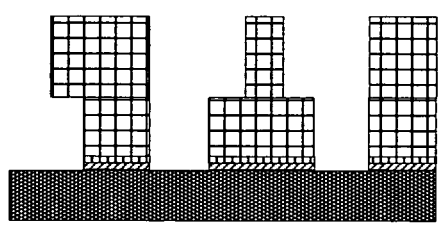
Figure 17A:

FIGS. 17A-17N provide schematic illustrations of side views at various stages of the process of a twelfth embodiment of the invention as applied to the formation of a particular structure.

Figure 17B:

FIG. 17A depicts a state of the process after the substrate 482 is received whereas FIG. 17B depicts the state of the process after an adhesion layer material is deposited on the substrate.

Figure 17C:
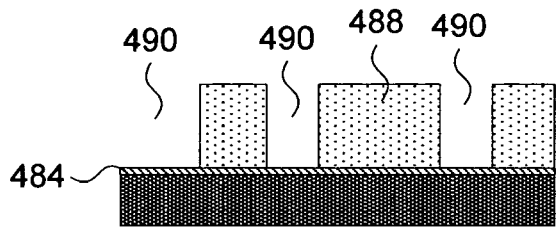

FIG. 17C depicts a state of the process after a patterned masking material 488 is formed on the surface of adhesion layer 484. Openings 490 through masking material 488 expose regions of adhesion layer 484 where a sacrificial material is to be deposited.

Figure 17D:
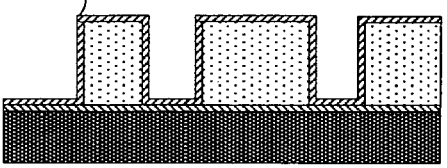

FIG. 17D depicts a state of the process after a first seed layer material 486 is deposited onto the exposed portions of the adhesion layer and also on the outward facing surface of the masking material.

Figure 17E:
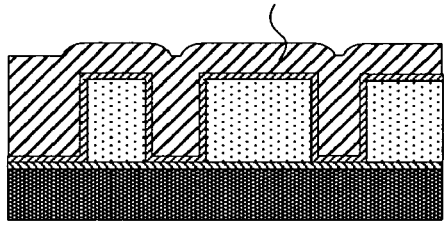

FIG. 17E depicts a state of the process after a sacrificial material 492 is electroplated onto the seed layer material 486 so that a minimum height of deposition preferably greater than or equal to the layer thickness plus an incremental amount is formed in regions of voids 490.

Figure 17F:
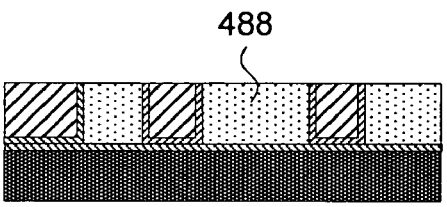

FIG. 17F depicts the state of the process after the deposited materials and masking material are planarized to a height that is preferably greater than or equal to the layer thickness plus an incremental amount.

Figure 17G:
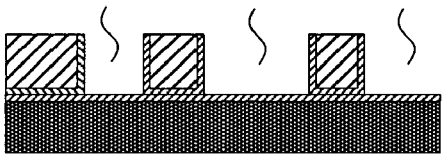

FIG. 17G depicts a state of the process after masking material 488 is removed.

Figure 17H:
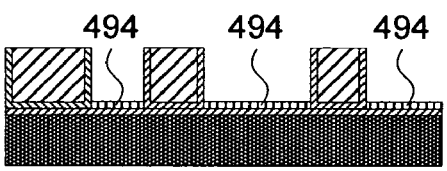

FIG. 17H depicts a state of the process after a nickel strike deposits nickel seed layer material 494 in void regions 496 exposed by the removal of masking material 488. The nickel seed layer material is deposited to regions where a structural conductive material is to be deposited.

Figure 17I:
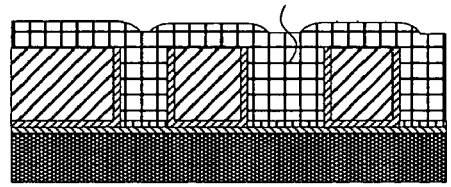

FIG. 17I depicts a state of the process after structural material 498 is deposited to fill voids 496 such that the minimum height of deposition locates the surface of the structural material at a height equal to or greater then the layer thickness plus an incremental amount $\delta$.

Figure 17J:
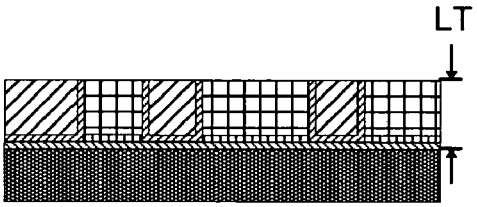

FIG. 17J depicts a state of the process after the deposited materials have been planarized to a thickness equal to the layer thickness.

FIG. 17K depicts a state of the process after a second layer of material has been added.

FIG. 17L depicts a state of the process after the sacrificial material has been removed while FIG. 17M depicts the state of the process after the first seed layer material 486 is removed.

FIG. 17N depicts a state of the process after exposed adhesion layer material has been removed.

FIG. 5F provides a block diagram indicating a more detailed implementation example (along with two alternatives therefore) associated with the fourth example implementation of FIG. 5B.

Block 174 provides a more detailed description of a particular implementation of the process of block 172. In particular, block 174 calls for the use of a patterned material to define initial regions on the substrate where the first seed layer stack and first selected material of block 172 will be deposited and then to use the first seed layer stack and first selected material as the mask for defining regions that will receive a second seed layer stack and the second material.

Blocks 176 and 178 provide examples of two variations of the process of block 174 which may be used in its implementation (in particular block 176) that in situations where the seed layer material of the first and second seed layer stacks are the same then removal of the seed layer material associated with the sacrificial material may occur without damaging the seed layer material for the structural material by insuring that structural material deposited on the second layer completely covers the boundary regions separating the structural and sacrificial materials on the first layer.

Block 178 is directed to situations where the seed layer material for the first and second seed layer stacks are different and where the sacrificial material and the associated seed layer material and adhesion layer material can be separated from the seed layer material and adhesion layer material associated with the structural material without damaging them. In these circumstances block 178 indicates that there are no restrictions on the design of the second layer relative to the first layer.

Embodiment thirteen of the present invention provides a detailed process for an example implementation of the approach of block 176 whereas embodiment fourteen provides a detailed process that may be used in implementing the approach of block 178 of FIG. 5F.

Primary operations associated with the thirteenth embodiment of the invention include:
(1) Supply a dielectric substrate.
(2) Pattern a material, for example a photoresist, on the surface of the substrate leaving voids where a first of the sacrificial material or structural material is to be located.
(3) Apply a first adhesion layer material and a first seed layer material to the exposed surfaces of the substrate as well as to its sidewalls and outward facing surface of the masking material.
(4) Deposit a first of the sacrificial material or structural materials onto the seed layer stack located on the substrate such that a desired minimum height of deposition is achieved. For example, the minimum height of deposition may be set to an amount equal to or greater than the layer thickness plus an incremental amount.
(5) Planarize the deposited material and mask material to a height corresponding to the layer thickness plus an incremental amount.
(6) Remove the masking material from the substrate thereby exposing regions of the substrate where a second of the structural material or sacrificial material is to be located.
(7) Deposit a second adhesion layer material and second seed layer material onto the substrate in the regions where the masking material was removed and also onto the sidewalls of the deposited materials associated with the first of the structural or sacrificial material and onto the outward facing surface of that first material.
(8) Deposit the other of the sacrificial material or structural material such that the minimum depth of the deposition meets or exceeds that of the layer thickness plus an incremental amount.
(9) Planarize the deposits of the materials to a height corresponding to the layer thickness of the first layer of the structure.
(10) Add additional layers as desired wherein the structural material deposited on the second layer preferably overlays the boundary regions separating the structural materials from the sacrificial materials. More specifically in some preferred embodiments the structural material on the second layer will overlay not only the structural material on the first layer but will also overlay the associated seed layer material and adhesion layer material.

In other variations the structural material on the second layer may simply overhang the structural material on the first layer and the seed layer material on the first layer or at least a large portion of the seed layer associated with structural material on the first layer such that any access paths by an etching solution to the seed layer material associated with the structural material are sufficiently small that removal of the seed layer material associated with the structural material cannot be removed or damaged to a significant amount in regions where structural material adheres to the substrate via the seed layer material.

(11) Remove the sacrificial material by etching and potentially remove the seed layer associated with the sacrificial material in the same etching process.
(12) If the seed layer material associated with the sacrificial material is not removed in operation 11 remove the seed layer material, for example by using an etching operation that is selective to the seed layer material and that does not do damage to the structural material or to the adhesion layer material associated with the structural material that acts as an etch stop for the seed layer material associated with the structural material.
(13) Remove exposed portions of the adhesion layer material associated with the sacrificial material. This operation may or may not also attack exposed regions of the adhesion layer associated with the structural material. If the adhesion layer material associated with the structural material is attacked the thinness of the adhesion layer material in the region separating the structural material from the substrate should be thin enough to inhibit significant damage to this sandwiched adhesion layer material.

In one implementation of the process of embodiment thirteen the adhesion layer for the sacrificial material may be titanium-tungsten while the seed layer material for the sacrificial material is copper and the sacrificial material itself may be copper. In such an embodiment the structural material may be nickel and the adhesion layer material associated with the structural material may be titanium while the seed layer material associated with the structural material may be copper or gold or any other material. As a seed layer of titanium-tungsten may be readily attacked by the etchant used to remove a copper sacrificial material the use of an adhesion layer of titanium for the structural material may have a benefit in that the etchant for the copper will not readily attack pure titanium. And thus there is no worry about inadvertent undercutting of the adhesion layer or undercutting of the seed layer associated with the structural material such as a copper based seed layer material In another variation if the seed layer material or the structural material is gold it may be possible to use a titanium-tungsten seed layer for the structural material even though it may be attacked by the etchant used to remove the sacrificial material as the barrier provided by the gold and the thinness of the adhesion layer material sandwiched between the gold and the substrate may insure that no significant damage occurs to the structural integrity of the structure where it is mounted to the substrate.

A fourteenth embodiment of the invention offers more freedom of design as the second layer of structural material can take on any appropriate configuration without worrying about it having to function as a capping layer to protect the seed layer material associated with the structural material.

In the fourteenth embodiment it is necessary that the seed layer associated with the structural material not be attacked by any etchants that it may come into contact with. For example, it should not be attacked, at least aggressively, by the etchant used to remove the sacrificial material. It should also not be attacked by an etchant used o remove the seed layer material associated with the sacrificial material. For example, if the sacrificial material is copper and its seed layer is copper then a seed layer of gold or tin or silver would be effective in this embodiment. It is also preferred that the adhesion layer material used for the structural material not be attacked by etchants used to remove the sacrificial material, the associated seed layer material or the associated adhesion layer material. In particular, if the sacrificial material is copper and the associated seed layer material is copper and the associated adhesion layer material is titanium-tungsten, all may be etched by the same etchant whereas use of a titanium seed layer for the structural material would be appropriate in this embodiment as it would probably not be significantly attacked by the etchant of choice. It will be understood by those of skill in the art that other material combinations will be possible and that if necessary minimum experimentation could be performed to distinguish working material and etchant combinations from non-working combinations.

FIGS. 18A-18L provide schematic illustrations of side views at various stages of the process of a thirteenth embodiment of the invention as applied to the formation of a specific exemplary structure.

Figure 18A:
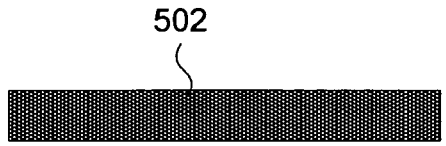
FIGS. 18A-18L provide schematic illustrations of side views at various stages of the process of a thirteenth embodiment of the invention which provides a first implementation of the example of block 176 of FIG. 5G.

FIG. 18A depicts a state of the process after a substrate 502 is applied.

Figure 18B:
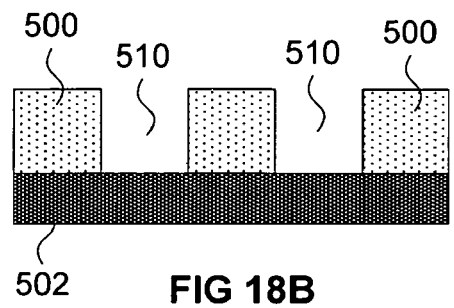

FIG. 18B depicts a state of the process after a patterned masking material 500 is formed on substrate 502 where voids 510 exist in the masking material, which define regions to be occupied by structural material or sacrificial material. In this embodiment it is assumed that the first material to be deposited will be structural material and as such the various operations of this embodiment will reflect that choice. It will be understood by those of skill in the art that alternative embodiments may utilize the sacrificial material as the first deposited material.

Figure 18C:
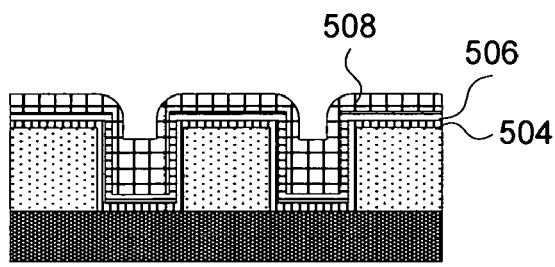

FIG. 18C depicts a state of the process after an adhesion layer 504 associated with the structural material is deposited, a seed layer 506 associated with the structural material is deposited and the structural material itself 508 is deposited. The minimum height of deposition associated with the structural materials is equal to or greater than the layer thickness pus an incremental amount which will allow any necessary amount to accommodate tolerances in planarization.

Figure 18D:
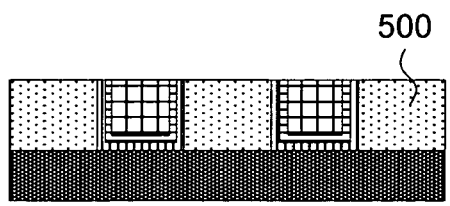

FIG. 18D depicts a state of the process after the masking material and structural materials have been planarized to a level that is somewhat higher than the ultimate desired layer thickness.

Figure 18E:
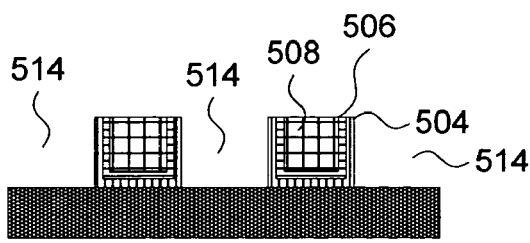

FIG. 18E depicts a state of the process after masking material 500 has been removed leaving adhesion layer material 504, seed layer material 506 and conductive structural material 508. FIG. 18E also depicts voids 514 in the deposited structural materials. The voids represent regions to be occupied by sacrificial material.

Figure 18F:
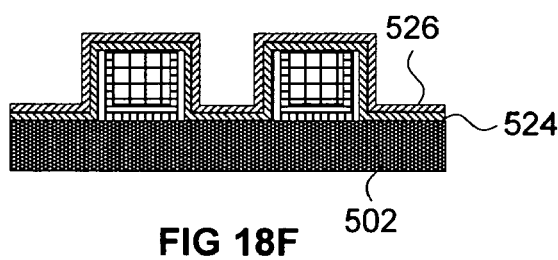

FIG. 18F depicts a state of the process after an adhesion layer 524 and a seed layer 526 associated with a sacrificial material have been deposited into the exposed regions of substrate 502 in preparation for receiving a deposit of sacrificial material.

Figure 18G:
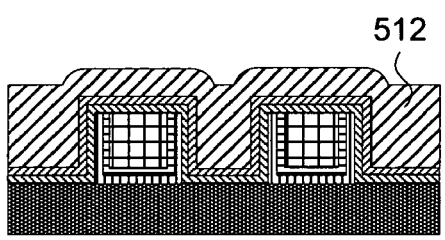

FIG. 18G depicts a state of the process after sacrificial material 512 has been deposited to fill voids 514.

Figure 18H:
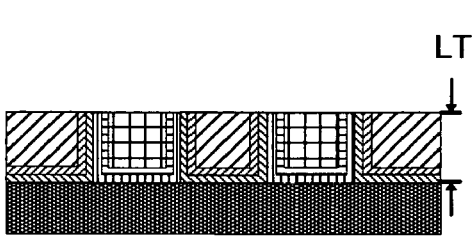

FIG. 18H depicts a state of the process after the formation of the first layer is completed as the result of a planarization operation that sets the thickness of the deposits equal to the layer thickness.

Figure 18I:
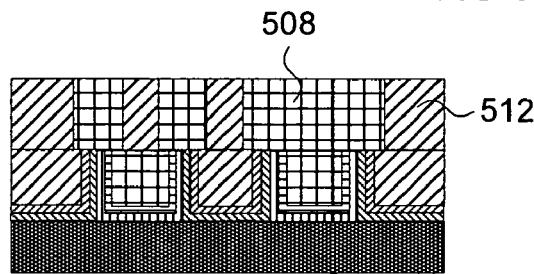

FIG. 18I depicts a state of the process where a second layer is formed above and adhered to the first layer and wherein structural material regions 508 on the second layer overlay the boundary regions separating the structural materials and the sacrificial materials of the first layer.

Figure 18J:
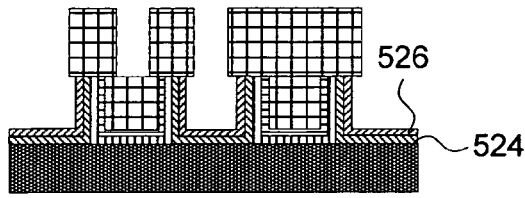

FIG. 18J depicts a state of the process after sacrificial material 512 has been removed.

Figure 18K:
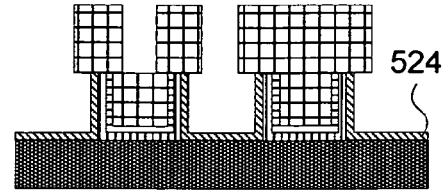

FIG. 18K depicts a state of the process after seed layer 526 associated with the sacrificial material 512 has been removed.

Figure 18L:
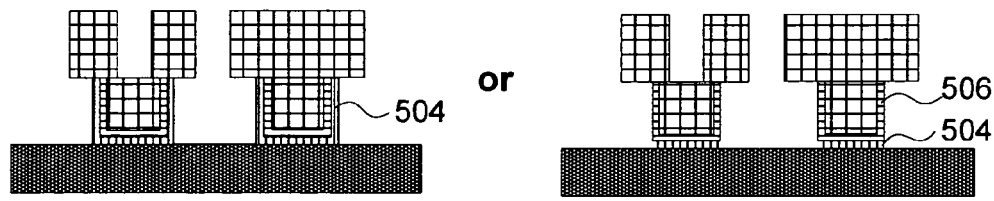

FIG. 18L depicts two alternative versions of potential states of the process after adhesion layer 524 is removed. The left most figure of FIG. 18L assumes that the removal of adhesion layer 524 does not attack the side walls of adhesion layer 504 and thus the adhesion layer remains in place. The right most figure of FIG. 18L depicts the state of the process under the circumstance where the removal of adhesion layer 524 also results in the removal of exposed regions of adhesion layer 504 but not significant removal of adhesion layer material 504 located between the substrate and seed layer 506.

FIGS. 19A-19D provide schematic illustrations of side views at various stages of the process of a fourteenth embodiment of the invention as applied to the formation of a specific exemplary embodiment.

Figure 19A:
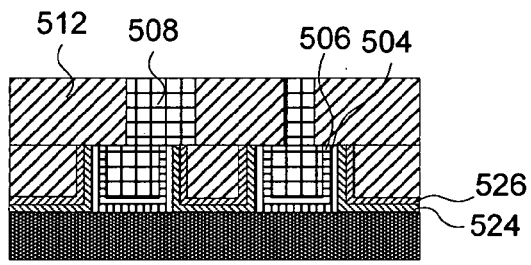
FIGS. 19A-19D provide schematic illustrations of side views at various stages of the process of a fourteenth embodiment of the invention which provides a first implementation of the example of block 178 of FIG. 5G.

FIG. 19A depicts a state of the process after formation of a first and second layer have been completed where the first and second layers include structural material 508 and sacrificial material 512. The first layer also includes adhesion layer material 504 and seed layer material 506 as well as adhesion layer material 524 associated with the sacrificial material and seed layer material 526 also associated with the sacrificial material.

Figure 19B:
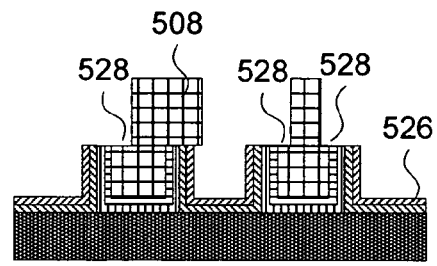

FIG. 19B depicts a state of the process after removal of sacrificial material 512 where it can be seen that the structural material associated with the first and second layers do not result in the material of the second layer overlaying the boundary interface regions between the structural and sacrificial materials of the first layer. In particular regions 528 indicate that direct path ways to seed layer and adhesion layer materials for the structural materials exist for sacrificial material etchants. But as it is assumed in this embodiment that such etchants will not attack the seed and adhesion layers or the structural material such pathways are not an issue.

Figure 19C:
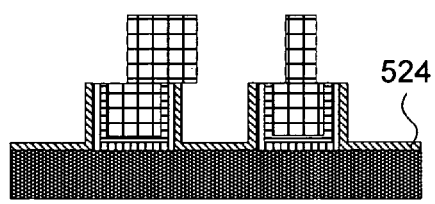

FIG. 19C depicts the state of the process after seed layer material 526 has been removed.

Figure 19D:
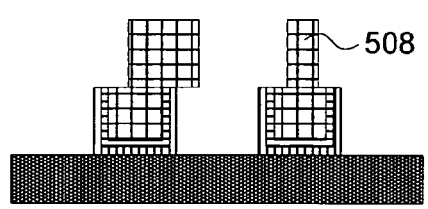

FIG. 19D depicts a state of the process after adhesion layer 524 has been removed.

FIG. 5G provides a block diagram indicating a more detailed implementation example (along with two alternatives therefore) associated with the fifth example implementation (block 182) of FIG. 5B.

Block 184 provides an example of a first alternative to the process of block 182. The process of block 184 calls for the structural material to have associated with it an adhesion layer material and a seed layer material while the sacrificial material would have associated with it a different seed layer material but will not have a separate adhesion layer material.

Block 186 on the other hand calls for the sacrificial material to have associated with it an adhesion layer material and a separate seed layer material while the structural material has a different seed layer material associated with it but no separate associated adhesion layer material.

A fifteenth embodiment of the invention provides a specific implementation of the process of block 184 of FIG. 5G. In particular the primary operations associated with the fifteenth embodiment include the following:

(1) Supply a dielectric substrate.
(2) Mask the substrate so that regions of the substrate not to be covered by structural material are masked while regions to be covered by structural material remain exposed.
(3) Apply an adhesion layer material and a seed layer material to the substrate, the side walls of the masking material, and to the outward facing surface of the masking material in preparation for depositing a structural material.
(4) Electrodeposit the structural material such that a minimum height of deposition is achieved that is equal to or somewhat greater then the layer thickness plus an incremental amount δ.
(5) Planarize the masking material and deposited structural material to a height corresponding to the layer thickness plus an incremental amount.
(6) Remove the masking material so as to expose portions of the substrate where a sacrificial material is to be deposited.
(7) Deposit a second seed layer material to the exposed regions of the substrate and to the side walls and outward facing surface of the structural materials.
(8) Electro deposit the sacrificial material such that a desired minimum height of deposition preferably greater then or equal to the layer thickness plus an incremental amount is achieved.
(9) Planarize the deposits to a level corresponding to that of the layer thickness.
(10) Add one or more additional layers as desired to complete the layer formation process.
(11) Remove the sacrificial material, for example, by etching and potentially remove the second seed layer material at the same time.
(12) If not removed in association with operation 11, remove the second seed layer material for example by etching so as to complete formation of the released structure where separate elements of the structure are conductively isolated from one another.

FIGS. 20A-20L provide schematic illustrations of side views at various stages of the process of a fifteenth embodiment of the invention which provides a first implementation of the example of block 184 of FIG. 5H.

Figure 20A:
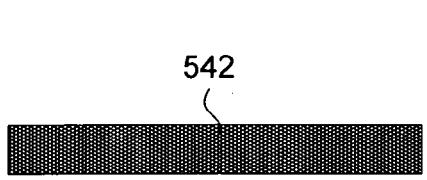
FIGS. 20A-20L provide schematic illustrations of side views at various stages of the process of a fifteenth embodiment of the invention which provides a first implementation of the example of block 184 of FIG. 5H.
Figure 20B:
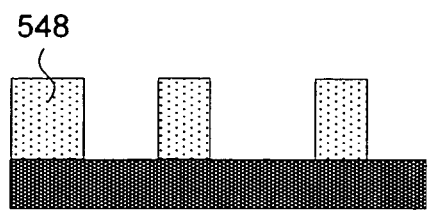

FIG. 20A depicts a state of the process after supplying a substrate 542 while FIG. 20B depicts a state of the process after forming a desired pattern of masking material 548 on the substrate.

Figure 20C:
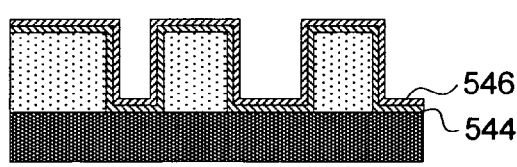

FIG. 20C depicts a state of the process after application of an adhesion layer 544 and a seed layer 546 that are associated with a structural material to be deposited.

Figure 20D:
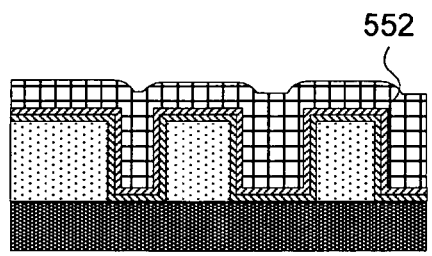

FIG. 20D depicts a state of the process after a structural material 552 is deposited.

Figure 20E:
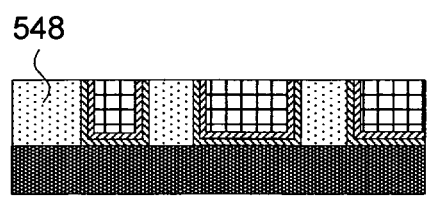

FIG. 20E depicts a state of the process after the materials are planarized to a height slightly greater then one layer thickness.

Figure 20F:
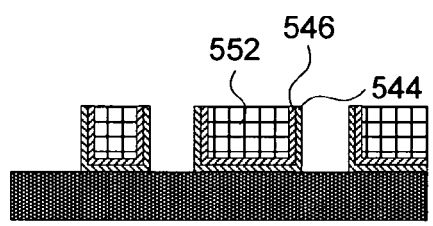

FIG. 20F depicts a state of the process after masking material 548 has been removed.

Figure 20G:
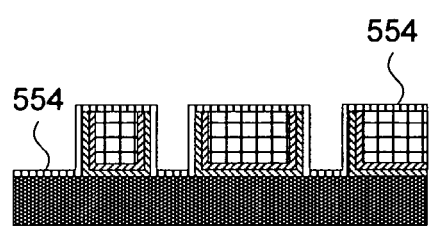

FIG. 20G depicts a state of the process after a second seed layer material 554 has been deposited.

Figure 20H:
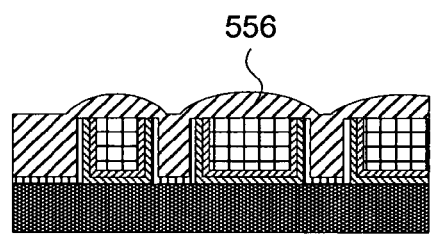
Figure 20I:
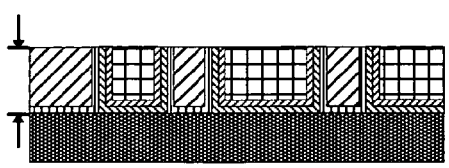

FIG. 20H depicts a state of the process after a sacrificial material 556 has been deposited while FIG. 20I depicts a state of the process after the deposited materials have been planarized to a height of one layer thickness which completes formation of the first layer.

Figure 20J:
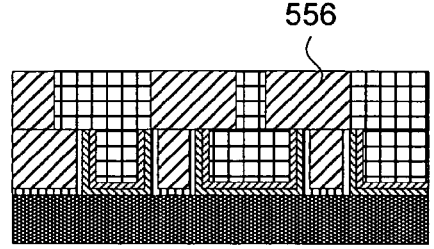

FIG. 20J depicts a state of the process after a second layer has been added.

Figure 20K:
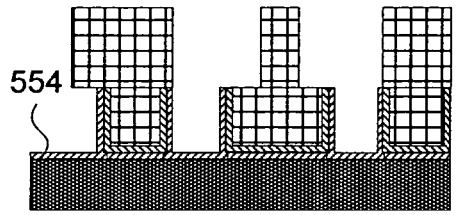
Figure 20L:
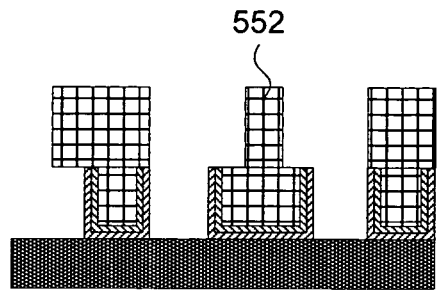

FIG. 20K depicts a state of the process after sacrificial material 556 has been removed while FIG. 20L depicts a state of the process after the second seed layer material 554 has been removed which completes the process and yields a released structure whose separate regions are conductively isolated form one another.

The methods and operations employed in the embodiments of the invention as discussed above may be applied not only to the forming of the initial layer of structure when building on a dielectric substrate but they may also be applied during the formation of additional layers when their immediately preceding layers include a dielectric material. The embodiments set forth above may be modified to leave or add one or more dielectric materials to the layers being formed. Such modifications may be based on the teachings set herein explicitly or based on teachings from other patent applications that are incorporated herein by reference. As such, other embodiments of the invention may involve some or all layers of a structure incorporating a dielectric material. Incorporation of dielectric material may occur via the teachings found herein before and herein after as well as in a number of the patent applications incorporated herein by reference. In still other embodiments, more that one structural material may be deposited on a given layer and/or more than one sacrificial material may exist on a given layer.

Some embodiments may be directed to the formation of single layer structures as opposed to multi-layer structures.

In still other embodiments data processing and masking techniques may be used to limit seed layer and/or adhesion layer formation to occur only over dielectric material (e.g. on the substrate or previously deposited layer) or such that it overlays conductive material only slightly such that dielectric material is not located between successive layers of conductive structural material and/or between successive layers of conductive sacrificial material.

In still other embodiments it may be possible to place seed layer material and/or adhesion layer material only over dielectric material and to leave a zero gap or slight gap between any conductive material on the substrate or previously formed layer and the seed layer material where such a gap can be readily bridged during plating operations to cause deposited conductive material to overlay the conductive material regions on the previous layer as well as to overlay seed layer regions on the present layer.

In other embodiments where more than two building materials are to be deposited, it may be possible to avoid a second patterning operation of a masking material or to avoid removing, reapplying and then patterning a second masking material. In such alternative embodiments it may be possible to initially pattern the dielectric material to form voids that represent the union of the locations where the first and second conductive materials will be deposited. After which a seed layer for the first conductive material may be applied, the first conductive material may be applied to fill all voids, and then the deposit(s) may, optionally, be trimmed (e.g. planarized) to a desired level. Next a mask may be overlaid on the surface of the first conductive material. Voids may exist in the mask at the time of mating the masking material to the previously deposited materials. Alternatively, the voids may be formed in the masking material after mating has occurred. The mask may, for example, be of the contact or adhered type. The voids in the mask preferably correspond to locations where a second conductive material is to be located. Etching of the first conductive material may occur to a desired depth and even exposed seed layer material may be removed (and potentially other associated materials as well). If the seed layer is to be removed, it may be removed by the same process (e.g. etchant) as is used for removing the conductive material or alternatively it may be removed by a different process (e.g. using a different etchant). Next, with or without removing the masking material that was used for etching, the second conductive material may be deposited and if necessary prior to that deposition, a seed layer material or seed layer stack of materials, appropriate for the second conductive material, may be deposited. After deposition of the second conductive material, the mask may be removed (if not already removed) and planarization of the surface may occur to remove any seed layer material or seed layer stack materials located above the first conductive material and to bring the net layer height to a thickness equal to that of the layer thickness.

In still further embodiments, it may be desirable to not use mechanical-type or machining-type operations (e.g. lapping, machining, milling or the like) to trim seed layer material from the surface of the dielectric or other conductive material which it overlays. In some embodiments etching operations may be used to remove the seed layer material. In some alternative embodiments, the etching operations may be done in a selectively manner or largely selective manner such that seed layer material is attacked and removed while causing no more than insignificant damage to any deposited conductive material located above the seed layer. In other alternative embodiments, the seed layer etching process may also attack the material that was deposited above the seed layer and/or attack other exposed conductive and/or dielectric materials. In such embodiments, the coating thickness of the materials attacked by the etchant may be such that the etching is insufficient to cause the regions to fall below a desired minimum thickness (e.g. below a level corresponding to the layer thickness). After the etching operations have operated on the seed layer material, sufficiently, the deposited materials may be ready for receiving subsequent deposits and processing or alternatively a planarization operation may be used to bring the surface of the deposited material to a desired level. In some embodiments, scratching or otherwise forming openings in the seed layer may be sufficient to allow an etchant (e.g. developer or stripper) to attack the underlying dielectric material (e.g. photoresist) which may result in removal of the dielectric as well as removal of any overlying seed layer material by a lift off process. Such removal via lift off may be accompanied by ultrasonic agitation or the like.

In additional embodiments, the etching operations set forth above may be used to incorporate additional structural or dielectric materials of either the conductive or dielectric type. In some embodiments, the etching operations may be used in such a manner that at any given time only one material is being etched into. In other alternatives, etching operations may cut into more than one material simultaneously.

In still further embodiments, the orders of applying materials in the above described embodiments may be modified along with making appropriate changes to the processes.

The effectiveness of various embodiments and alternatives discussed above and below may be enhanced by use of one or more of the following techniques. Formation of seed layers and/or adhesion layers on dielectric materials may be accomplished using a variety of different operations or processes. For example, the formation may occur using a sputtering or other PVD or CVD process, an electroless deposition process, or via a direct metallization process.

Operations and parameters involved in sputtering processes or other PVD or CVD process are known to those of skill in the art or may be readily ascertained by them without undue experimentation. Electroless deposition processes and parameters are also known to those of skill in the art or may be readily ascertained by them without undue experimentation. Electroless deposition processes are capable of forming coatings of many different materials including, for example Au, Ag, Sn, Cu, Ni, and the like. Similarly, direct metallization processes are also known to those of skill in the art or may be readily ascertained by them without undue experimentation. Direct metallization processes may be used to deposit different materials including for example Cu and Ni.

For example, an electroless deposition process for copper may involve the following operations:

1. Activate the substrate using a solution of hydrochloric acid, tin chloride, and palladium chloride where the concentrations and ratios of each as well as the general process parameters that may be used are ascertainable or purchasable from standard sources by those of skill in the art.
2. Optionally, rinse with de-ionized water; and
3. Expose the substrate to an electroless deposition solution containing sodium hydroxide, formaldehyde, a chelater, and a copper salt where the relevant concentrations and ratios and other process parameters are ascertainable or purchasable from standard sources by those skilled in the art.

The purpose of the director metallization or direct plating process is to allow electroplating of a conductive layer directly on a non-conductive substrate. Three different commercial processes exist for direct metallization: (1) Pd colloidal processes, (2) conductive polymer processes, and (3) carbon/graphite based systems. For example, a direct metallization or direct plating process may be implemented via a series of steps or operations: (1) First, the substrate is dipped in an etching solution to roughen its surface; (2) Then, the substrate is dipped in an activator solution to get surface conductive; and then; and (3) A very thin (<1 um) metal layer (e.g., Cu, Ni or Au) is plated onto the substrate.

For the Pd colloidal process, there are two subgroups: (a) the Pd—Sn colloidal process and (2) the Sn free Pd process. Some examples of commercial processes include: (1) Crimson (Shipley), (2) Envision DPS (Enthone), and (3) Compact-1 (Atotech). A typical process flow includes cleaning, microetch, activation and plating.

For the conductive polymer processes, examples of commercial processes include: (1) DMS-2 (Blasberg Co.) and (2)

Compact CP (Atotech). The conductive polymers include polypyrrole or 3,4 ethlendioxythiophene.

For the carbon processes, examples of commercial processes include (1) Black Hole II (MacDermid), (2) Shadow (Electrochemicals Co.). and (3) Graphite 200 (Shipley).

In some embodiments an important portion of the invention relates to the ability to separate sacrificial materials, any associated seed layers, and/or any associated adhesion layer materials from the desired structures and from the substrate while doing minimal damage to the structural material, any associated seed layer materials, and any associated adhesion layer materials. The separation of these materials may occur after partial or complete formation of a first layer, after partial or complete formation of a subsequent layer or after completion of the last layer to be formed.

In some embodiments, a gold (Au) seed layer material and a titanium adhesion layer material must be separated from the structural materials. In these embodiments, the gold layer generally has a thickness between 0.1 and 1.0 microns, more typically between 0.3 and 0.7 microns and most typically between about 0.4 and 0.6 microns (~0.5 µm) and the Titanium layer generally has a thickness between about 50 and 500 angstroms and more typically about 100 to 300 A. In some embodiments, the gold etchant may be GE-8148 from Transene Co. Inc. of Danvers, Mass. and the titanium etchant may be TFTN which is also from Transene Co. Inc.

From the technical datasheet for GE-8148, the etch rate for the gold etchant is about 50 angstroms/second at 25 C. As such, it takes about 100 seconds to remove the 0.5 µm (micron) Au seed layer. But since in actual application the gold has a variable layer thickness, the etch rate is variable and it is difficult to control the etch from over-attacking regions where etching may not be desired while waiting for the etching to be completed in other areas which may have inadvertently or intentional received thicker initial coatings. It is difficult to control the etching process during such short time intervals. If the etching is not well controlled, severe undercutting may result which may cause yield reductions or complete failures of processes that would have otherwise been successful. To control the process, it is desirable to extend the etching time. Such extensions may involve factors of 2, 3, 5, 10 or even higher values. For example, it may be desirable to extend the etching time so that it takes 10 minutes instead of 1 minute. Tests have shown that such an extension of time may be obtained by diluting the concentration of the purchased etchant using distilled water. Tests have shows that it takes about 10 minutes to remove Au using a concentration of 1 part full strength etchant to 15 parts DI water and about 5-7 minutes using a concentration of 1 part full strength etchant to 10 parts DI water. As such, dilution of baths beyond ranges recommended by material suppliers may have significantly beneficial results.

It has also been observed that in the case of GE-8148, though the vendor has indicated that the etchant will not attack Nickel films, experiments have shown that such attack does occur when diluted baths are used. As such, in some embodiments of the invention, it is desirable to add an effective quantity of nickel corrosion inhibitor to the bath.

In one test, 1 g NaNO3 per 100 ml of solution was added in a 1:10 diluted Au etchant. After etching, no noticeable Ni corrosion was seen. U.S. patent application Ser. No. 10/434, 294, by Gang Zhang, entitled "Electrochemical Fabrication Method With Enhanced Post Deposition Processing" describes the addition of such a corrosion inhibitor to Enstrip C-38 Stripper (Enthone-OMI Inc. of New Haven, Conn.). This referenced patent application is hereby incorporated herein by reference as if set forth in full. It is possible to use even higher concentrations, for example 5-10% and still get effective results. For example, in another test, 5 g/100 ml NaNO3 was added in 1:10 Au etchant and effective Au etching was obtained without evidence of Ni corrosion being observed. In still other embodiments, a smaller concentration may still yield effective results.

In other embodiments, instead of using NaNO3 as the inhibitor it may be possible to use ammonium phosphate dibasic or the like.

In still other embodiments, additional steps may be taken to protect structural material surfaces (e.g. nickel surfaces) from corrosion. Such additional steps may be particularly useful when the structural configuration includes complex geometries such as blind and long narrow channels. Such additional steps may include dipping the structure, device, component, part, etc. into an inhibitor/water solution for a short time (e.g. a number of minutes) prior to dipping the structure into the Au etchant (which may not but preferably does include a nickel corrosion inhibitor). Normal Au etching can then be allowed to proceed. If necessary, the etching operation may be halted part way through the process and re-immersion into the inhibitor solution may be made to occur so as to provide additional protection for any newly exposed structural material surfaces. Such operations may be repeated more than once if found to be necessary. Appropriate inhibitor immersion times, temperatures, frequency of re-immersion, and other process variables and options may be ascertained empirically by those of skill in the art.

Although a diluted etchant increases the total etch time and allows for enhanced control, excessively diluted solutions can not completely etch away all Au. Those of skill in the art may ascertain empirically useful ranges of effective dilution. It will be understood by those of skill in the art that though the above discussion focused on Au seed layer material and Ni structural material, the process of using a diluted etchant; an etchant containing a corrosion inhibitor, or inhibitors, specific to the structural material, or materials, to be protected; and/or an inhibitor bath, may be useful with other materials (e.g. sacrificial materials, seed layer materials, or adhesion layer materials) to be removed and/or with other structural materials. Still other process parameter modifications from recommended values and/or ranges may yield slower/more controlled and better etching results.

For example, the vendor of the titanium etchant recommends using the etchant at 70-80 C. The vendor indicates that the etch rate will be about 10 Angstroms/second (A/s) at about 10 C and will be about 50 A/s at 85 C. Again in some embodiments, it is desirable to extend the total etch time to around 10 min. Since with this material, the etch rate is temperature related, we can lower the operation temp to increase etch time. An additional advantage in doing this includes decreased evaporation of the toxic chemicals in the etchant (e.g. HCl). Certainly, if necessary the concentration the etchant may also be reduce. Tests indicated that sufficient decrease in etch time could be achieved by modifying the temperature. For example, Ti was etched in 1 minutes at 50 C, 3.5 minutes at 40 C, and in about 10-14 minutes at 35 C, and no change in the Ti layer was observed after 20 minutes when the process was performed at room temperature.

As HCl in the titanium etchant could cause pitting of Ni or other structural materials, in some embodiments dilution of the etchant, incorporation of an inhibitor therein, or upfront inhibitor treatments may be used in addition to controlling of the temperature at a desired level. The addition of a corrosion inhibitor to the solution may again involve use of NaNO3 or a different inhibitor and may involve the added amounts in the range discussed above or outside of that range. It is within the level of skill of those in the art to empirically determine effective ranges of temperature, inhibitor type and concentration, and the like without undue experimental effort. Though the discussion of temperature as a process control variable has been limited to titanium etchants, it will be clear to those of skill in the art that temperature control may be used with other materials to be removed, etchants, and structural materials.

As a result of additional problems discovered with regard to the gold etchant attacking nickel several additional techniques for enhancing the removal process are proposed. Each additional enhancement may be used as needed. They may be used alone or in combination with each other or in combination with the other techniques discussed herein. In particular, when using the GE8148 gold etchant, a white precipitate has been observed and when the precipitate has been removed, damage (i.e. corrosion) of the underlying surface of the structural material (i.e. nickel) has been observed. Though not necessarily relevant to the effectiveness of the solutions to the problem, it is believed that the precipitate may have a primary source and a secondary source. The primary source appears to be a reaction between remnants of a copper sacrificial material that interact with the etching solution to form a precipitate CuI (Copper-Iodine). The secondary source appears to be a precipitate that results from a reaction between the gold and the etchant to form AuI (Gold-Iodine). The corrosion may come about from a localized difference in concentration and/or as a result the localized pH dropping too low.

To address these issues, some embodiments may benefit from implementation of the following enhancements: (1) if the device contains copper, any copper that would be accessible to the gold etchant is preferably removed prior to bringing the etchant into contact with the copper; (2) during etching, moderate levels of agitation may be used to keep stagnant areas from forming what may otherwise become over saturated regions; (3) In situations where long channels exist or blind cavities, periodic removal of the structure from the gold etchant may occur and then the structure may be subjected (e.g. by dipping or the like) to an HCl or C-38 solution which will dissolve the precipitate and prevent any local oversaturation from occurring—this process may be repeated several times if necessary during the etching of a given region; and/or (4) instead of using wet etching of the gold it may be desirable to use dry etching methods (e.g. RIE or Ar bombardment. A book entitled "Etching in Microsystem Technology", by Michael Kohler, and published by Wiley VCH lists some recipes for etching Titanium-gold layers.

When practicing embodiments where sacrificial seed layer and/or adhesion layer depositions are based on electroless or direct metallization techniques, during the removal processes, it may not only be necessary to use etchants or removal processes that attack the sacrificial material, the associated seed layer material, and the associated adhesion layer material, it may also be necessary to use an etchant or etching operation that can remove any materials deposited during activation operations, such as palladium, graphite, or the like.

Furthermore, when practicing embodiments where seed layer and/or adhesion layer depositions are based on electroless or direct metallization techniques, it may be that different base materials (i.e. exposed materials that are subjected to activation, will become more or less susceptible to receiving depositions than other materials and as such beneficial or detrimental properties may result from tendencies to form or not to form coatings with thicknesses that depend on the properties of the base materials.

Figure 21:
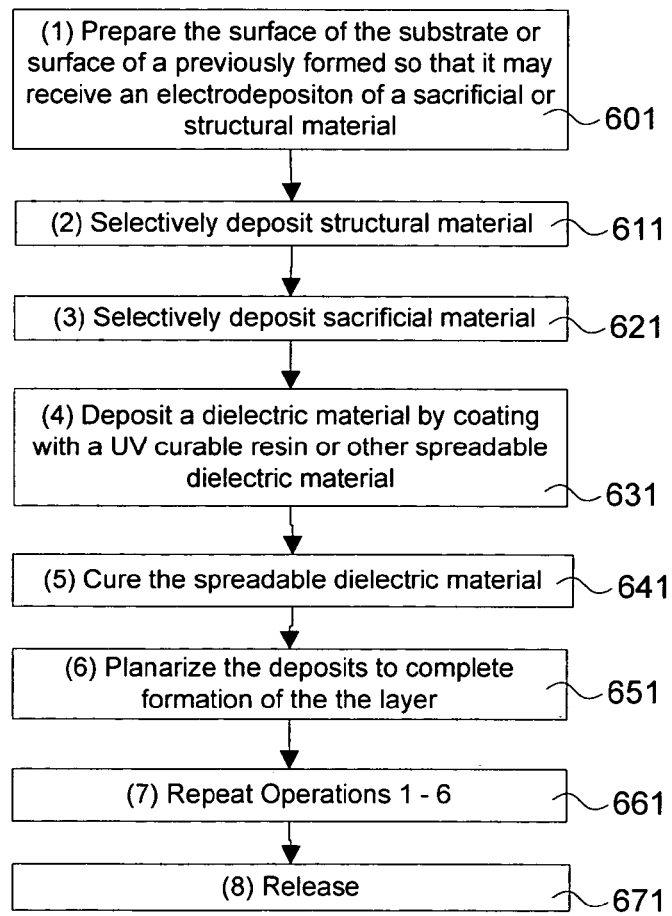
FIG. 21 provides a block diagram that sets forth primary operations associated with a process for forming a multi-layer structure according to another embodiment of the invention.

FIG. 21 provides a block diagram of primary operations associated with a process for forming a multi-layer structure according to another embodiment of the invention. Block 601 sets forth a $1^{st}$ operation of the embodiment which involves the preparation of the surface of the substrate, or of a previously formed layer, so that it may receive an electrodeposition of a sacrificial or structural material. Block 611 sets forth a $2^{nd}$ operation of the embodiment which involves the selective deposition of a structural material. Block 621 sets forth a $3^{rd}$ operation of the embodiment which calls for the selective deposition of a sacrificial material. Block 631 sets forth a $4^{th}$ operation of the embodiment which involves depositing of a spreadable dielectric material while block 641 sets forth a $5^{th}$ operation which involves curing of the spreadable dielectric material. Block 651 sets forth a $6^{th}$ operation of the embodiment which involves planarization of the deposits to a level corresponding to the intended boundary level of the layer. Block 661 calls for the repetition of Operations 1-6 one or more times to build up the multi-layer structure. Block 671 sets forth an $8^{th}$ operation of the embodiment which calls for the release of the structure from the sacrificial material and from any seed layer material located between layers of sacrificial material.

FIGS. 22A-22H provide schematic illustrations of side views at various stages of the process of FIG. 21 which provides an embodiment for incorporating a dielectric material along with platable conductive materials in association with arbitrary layers of a structure being formed.

In a preferred implementation of the process, a conductive structural material comprises nickel 702; a dielectric material comprises a UV curable photopolymer 704; a conductive sacrificial material comprises copper 706; the surface treatment comprises electroless deposition of copper 708. However in other implementations other materials and material combinations may be used.

In the first operation a surface of the substrate or the surface of a previously formed layer is prepared so that it may receive an electrodeposition of a conductive structural material and a conductive sacrificial material. Surface preparation of the substrate may be different than that required for subsequent layers or may be omitted if the substrate or immediately preceding layer is (1) entirely conductive, (2) is conductive in appropriate locations (i.e. locations where electrodeposition is to occur and such that the locations are conductively connected to a source of electric power), or (3) in the event that the substrate is supplied with a plating base or seed layer already in place.

Figure 22A:
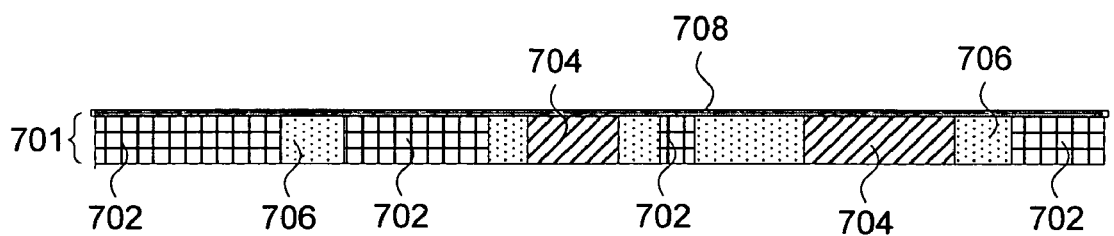
FIGS. 22A-22H provide schematic illustrations of side views at various stages of the process of an implementation of an embodiment of the invention which provides for incorporating a dielectric material along with conductive materials on arbitrary layers of a structure being formed.

As illustrated in FIG. 22A, the surface treatment 708 is applied over the entire previous layer or substrate 701. In other embodiments, for example, the surface treatment may be applied in a patterned manner so as to either (1) correspond to the dielectric areas on the preceding layer or (2) correspond to those portions of the dielectric areas on the preceding layer where electrodeposition is to occur and where necessary to yield a conductive bridge to a source of electric power.

In this embodiment, the surface preparation preferably involves the electroless deposition of copper which may be implemented using the following three steps:

1. Activate the substrate using a solution of hydrochloric acid, tin chloride, and palladium chloride where the concentrations and ratios of each, as well as the general process parameters that may be used, are known, readily ascertainable, or are readily obtainable from standard sources by those of skill in the art.
2. Optionally, rinse the substrate with de-ionized water; and
3. Expose the substrate to an electroless deposition solution containing sodium hydroxide, formaldehyde, a chelater, and a copper salt where the relevant concentrations and ratios and other process parameters are known, readily ascertainable, or purchasable from standard sources by those skilled in the art.

In other embodiments, other surface preparation processes and materials may be used. For example, in some alternative embodiments, one or more of the following may be used in forming a plating base or seed layer onto which electrodeposition may take place:

a) A different metal or alloy may be deposited by electroless deposition. For example, nickel, tin, silver, or another material may be used;

b) A metal or other conductive material or materials may be applied by a form of PVD (e.g. sputtering or evaporation);

c) A metal or conductive compound may be applied by a form of CVD;

d) A metal or conductive compound may be applied by a direct metallization (i.e. a direct plating technique), for example a Sn—Pd process may be used, a graphite based process or a conductive polymer based process may be used.

e) Any of the alternatives a)-d) may be followed by a microetching operation, e.g. using an etchant such as Endplate AD485 from Cookson Electronics in order to provide a rougher surface to improve adhesion to a masking material (e.g. photoresist) that may be applied in a subsequent step;

f) Electroplating of metal may occur directly on to a substrate or previously formed layer that has undergone the activation operation described above, or one similar to it, without the need of a subsequent electroless deposition operation;

g) A conductive powder or film may be deposited by mechanical means (e.g. spraying, spreading, rolling, or the like) and then if necessary transformed into a solid by, for example, use of heat, pressure, radiation, application or evaporation of a solvent, or the like h) A conductive powder may be electrostatically applied;

i) A conductive powder may be applied by electrophoretic deposition;

j) Conductive particles may be deposited and adhered via a spray metal coating process;

k) In other alternative embodiments, operations g)-j) may be accompanied by, for example, use of heat, pressure, radiation, application and evaporation of a solvent, or the like to enhance the cohesion of individual particles, the adhesion of particles to the substrate or to form a more continuous or dense coating.

l) In other alternative embodiments, operations of g)-j) may be followed by an operation such as that set forth in k) which may in turn be followed or proceeded by, a compaction operation by using enhanced pressure, pressing, rolling, vibration, or peening.

m) In other alternative embodiments, the surface preparation step may be skipped. This is especially appropriate for situations where it is desired that the next layer of the structure is to be made from a dielectric material only or where the entire structure is to be made from the dielectric material (i.e., without a structural metal).

Figure 22B:
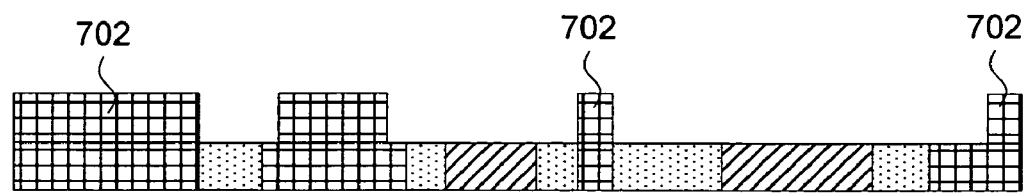

FIG. 22B depicts the state of the process after completion of Operation (2) of FIG. 21, i.e. after selective deposition of a structural material. In FIG. 22B, structural material 702 is shown as having been selectively deposited using a contact mask (e.g. of the anodeless type) or an adhered mask (e.g. of patterned photoresist). Since some desirable structural materials may plate with less than 100% plating efficiency, it may be necessary or desirable to take some precautionary or corrective actions to reduce bubble formation or to remove bubbles once formed. For example, the plating bath may be degassed prior to mating to enhance its ability to hold gas in solution should bubbles begin to form.

Figure 22C:
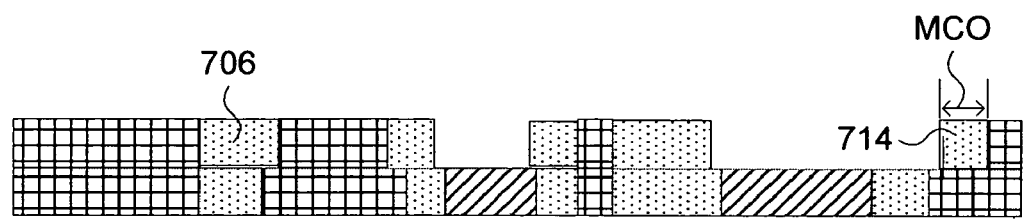

FIG. 22C depicts the state of the process after Operation (3) of FIG. 21, i.e. after selective deposition of sacrificial material. In FIG. 22C, sacrificial material 706 is selectively deposited using a contact mask (e.g. of the anodeless type) or an adhered mask (e.g. of patterned photoresist). The contact material of the mask should mate to the surface of the substrate or previously formed layer to shield those portions of the layer where a dielectric material will eventually be located. As plating efficiency may also be an issue during this step, some precautionary or corrective operations may be appropriate during performance of this operation. Such operation were discussed above in association with FIG. 22B.

In some contact mask implementations, it may be necessary for the conductive sacrificial material locations to be offset from the conductive structural material locations by a minimum width of the masking material. This may be termed that "minimum critical offset" or "MCO" (which, for example, may be in the range of 2-5 µm in some in embodiments while it may be more or less in other embodiments). Such an offset may be necessary in order to prevent mechanical conflict between the contact material of the mask and the previously deposited structural material.

As a result of the process order of this embodiment (i.e. deposit of conductive structural material followed by deposit of conductive sacrificial material followed by deposit of dielectric material) the dielectric material and structural material will not generally be in direct contact with one another on any single layer. In certain circumstances, however, such direct contact may be possible such as when certain mask types are used and when a region of structural material is to be completely surrounded by a ring of dielectric material. In any event, connections between conductive structural material and dielectric material may be made via higher and lower bounding layers.

In some alternative embodiments, the order of processing may be changed (e.g., deposition of conductive structural material may be followed by deposition of dielectric material which may be followed by deposition of conductive sacrificial material. In such embodiments, conductive structural material and dielectric material could be in contact, but this would generally result in the first of a dielectric or structural material being surrounded by the second of them. This might be a preferred approach for the formation of certain structures.

In other embodiments, the use of adhered masking techniques may remove the restrictions associated with the minimum critical offset noted above. In some such embodiments, contact masking may be used during deposition of the structural material and adhered masking may be used during the deposition of the sacrificial material. In other embodiments, adhered masking may be used during the deposition of both the conductive structural material and the conductive sacrificial material. Analogous variations exist when the order of processing is changed.

In still other alternative embodiments, the sacrificial material may be blanket deposited so as to remove issues associated with the MCO, then the deposited materials may planarized to a desired height (e.g. a level that is somewhat above the level associated with the intended layer thickness), a contact or adhered mask may be applied to planed surface and then either the structural material and/or the sacrificial material may be etched to an appropriate depth so as to define voids for receiving a dielectric material in a next step. These same alternatives may be applied when the processing order of the structural and sacrificial materials is reversed.

In Operation (4) of FIG. 21 a dielectric material is to be deposited. In the present embodiment it is preferred that the dielectric material 704 be a UV curable resin or other spreadable material. There are a variety of dielectric materials that may be deposited in this step using a number of different deposition methods. A preferred method is to use a curable stereolithography resin or paste. For example, SL5190 epoxy photopolymer resin manufactured by Vantico, AccuDur 100 sold by 3D Systems, or Somos 9120 sold by Dupont would be suitable. Thermally cured materials may are also suitable and may be used in alternative embodiments.

Figure 22D:
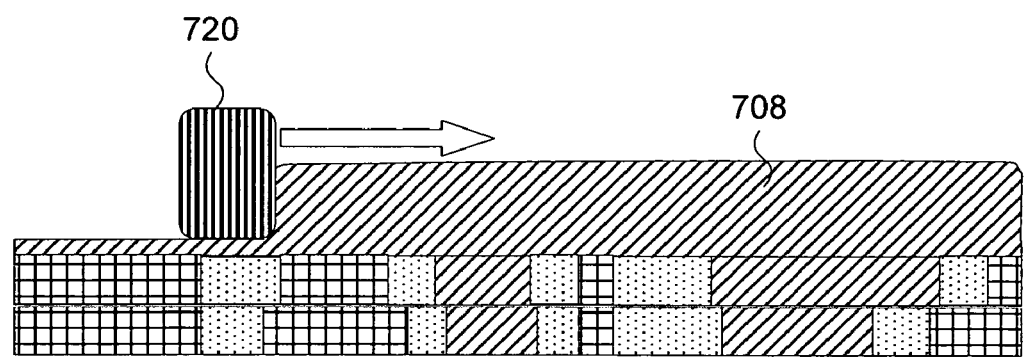

In the present embodiment, a two operation process is used in depositing the dielectric material 704:

1. The substrate surface (in whole or in part) is coated with the dielectric material 708. FIG. 22D depicts the state of the process after the substrate has been coated.
   a) Preferably this is done with the substrate horizontal, face-up, and the dielectric material applied by pouring onto the substrate surface.
   b) Alternatively, the substrate may be dipped (with a substantially vertical orientation) into the dielectric material and then slowly withdrawn.
   c) Alternatively, the dielectric material may be applied by a spreader bar which pumps the dielectric material through nozzles pointed in the direction of the substrate which is preferably oriented horizontally and face up.
   d) Alternatively, the dielectric material may be applied by orienting the substrate horizontally and dipping into the dielectric material and then slowly withdrawing the substrate.
   e) Alternatively, the dielectric material may be applied in conjunction with one of the 'leveling' operation alternatives described hereafter.
2. The dielectric material is 'leveled' to establish the appropriate thickness and an approximately uniform distribution of material across the substrate.
   a) Preferably this leveling is performed using a doctor blade 720 as shown in FIG. 22D that is (i) aligned to sweep a plane that is parallel to the plane of the substrate, (ii) located a fixed distance away from the surface of the preceding layer (e.g. at the layer thickness or somewhat higher), and (3) moved in a controlled manner across the substrate from one side to the other. Blade geometry, spacing from the previously formed layer, speed of travel, and number of sweeps can be optimized for various materials empirically as necessary.
   b) Alternatively, in other embodiments, this step may be performed by spinning the dielectric coated substrate at rate appropriate to establish the desired thickness. Appropriate speed and duration of the spinning may depend on the properties of the dielectric material and may readily be determined experimentally by those of skill in the art in view of the teachings herein.
   c) In other embodiments, a roller may be used in place of the doctor blade. The roller may rotate with the direction of motion or counter to it
   d) In still other embodiments, the dielectric material may be dispensed from a cavity in the doctor blade as the doctor blade is moving across the preceding layer.
   e) In still other embodiments, the substrate may be oriented horizontally, vertically, or at an angle to the horizontal and gravity may be allowed to provide the leveling force.
   f) In still other embodiments, the leveling operation of this step may be skipped in favor of a planarization step that will follow.

In various alternative embodiments, different types of dielectrics may be used, for example, the dielectric material may comprise:

1. A one-part epoxy system.
2. A two-part epoxy system.
3. A three-part epoxy system.
4. A one-part PDMS system.
5. A two-part PDMS system.
6. Sylgard 184 (PDMS) from Dow Corning, mixed in appropriate ratio before application.
7. Photoneece® PWDC-1000 (polyimide) from Dow Corning.
8. An oxide or nitride deposited through low pressure chemical vapor deposition (LPCVD).
9. A low stress SiN (silicon nitride) deposited through LPCVD.
10. A fusible powder or non-fusible powder where individual particles may be coated with a fusible material. In some such alternatives, the particles may be compacted against the surface of the previous layer with a roller during or subsequent to deposition. In some such alternatives, the 'cure' may be performed by heating the dielectric material (e.g. by laser heating). In some such embodiments, particles in the range of 5 µm to 10 µm are preferred, but particles in the range of 10 µm to 100 µm can also be used in some embodiments.
11. Any of the materials of 1-10 may be used in combination with an incorporated ferrite powder suspended in the spreadable material to increase its usefulness in transformers, inductors, and the like.
12. Any of the materials 1-10 may be used in combination with an incorporated metal or ceramic powder suspended in the spreadable material to increase strength or toughness or to provide a surface more amenable to planarization.

Figure 22E:
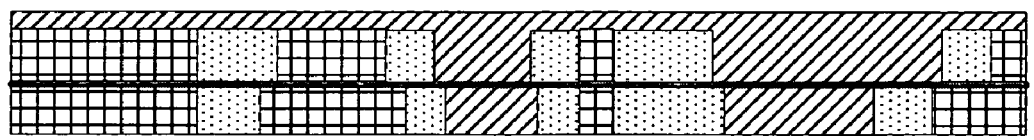

In Operation (5) the spreadable dielectric material is cured. In FIG. 22E the dielectric material has been preferentially cured by exposure to UV radiation (preferably in the range of 320 nm to 400 nm), for example, through the use of a florescent UV light source such as F71 from UValux. In alternative embodiments other sources of curing radiation may be used and even other types of curable materials, for example:

1. A UV mercury lamp may be used.
2. A UV flood source may be used.
3. A UV laser source may be used wherein the wavelength(s), scan pattern, speed, etc., may be optimized to reduce distortion and increase adhesion.
4. The dielectric material may be cured in response to radiation in the visible spectrum with light sources and background radiation being appropriately modified.
5. The dielectric material may be cured in response to radiation in the infrared spectrum with radiation sources and background radiation being appropriately modified.
6. The dielectric material may be cured through the use of heat, radiated, conducted, or convected to the dielectric material or via any combination of these possibilities.
7. The dielectric material may be cured through contact with the air.
8. The dielectric material may be cured through an endothermic or exothermic reaction within the dielectric material.

9. In some embodiments, the dielectric material may not be cured, but may be useable as deposited. This may be the case, for example, for certain gels and compacted powders.

Figure 22F:
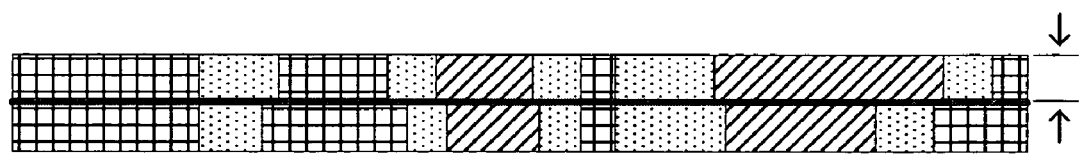
Figure 22G:
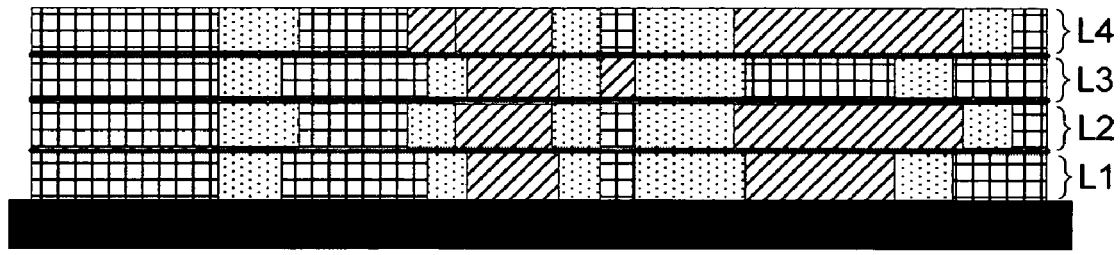

In Operation (6) of FIG. 21, planarization of the deposited materials occurs. In FIG. 22F the desired layer thickness, LT, and surface finish is established preferably by fly cutting (e.g. using a diamond tipped tool) with endpoint detection being made by periodically pausing the diamond fly cutting and measuring the layer thickness using an LVDT or other contact measurement technique. In other embodiments other planarization or trimming techniques may be used.

1. Alternative planarization operations may comprise lapping with crystalline or poly-crystalline diamond.
   a. The media size may be between 0.5 to 3.0 μm, between 3.0 to 6.0 μm or even larger (particularly where a multi-stage trimming process will be used—starting with courser media and working toward finer media as the desired planarization height is achieved.
2. the planarization may comprise lapping using a ceramic media.
3. The planarization may comprise use of fixed media lapping.
4. The planarization may comprise use of a Renewable Polishing Lap as described in U.S. Pat. No. 5,897,424 to Evans, et al. This patent is hereby incorporated herein by reference as if set forth in full.
5. The planarization may comprise use of two or more lapping operations with operations being varied in at least one of: lapping media, lubricant, pressure, duration, speed, or motion profile.
6. The planarization may comprise one or more lapping operations followed by one or more diamond fly cutting operations.
7. The planarization may comprise one or more diamond fly cutting operations followed by one or more lapping operations.
8. In addition to planarization including fly cutting or one or more of the operations 1.-7. it may also include one or more polishing operations.
9. In addition to planarization including fly cutting or one or more of the operations of 1.-7., it may also include performance of an endpoint detection measurement, e.g. using a confocal laser measurement system, a physical probe contact system, an eddy current measurement system, sonic means, x-ray measurement.

Further teachings about planarizing layers and setting layers thicknesses and the like are set forth in the following US Patent Applications: (1) U.S. Patent Application No. 60/534,159, filed Dec. 31, 2003, by Cohen et al. and which is entitled "Electrochemical Fabrication Methods for Producing Multi-layer Structures Including the use of Diamond Machining in the Planarization of Deposits of Material"; (2) U.S. Patent Application No. 60/534,183, filed Dec. 31, 2003, by Cohen et al. and which is entitled "Method and Apparatus for Maintaining Parallelism of Layers and/or Achieving Desired Thicknesses of Layers During the Electrochemical Fabrication of Structures"; and in U.S. patent application Ser. No. 11/029,220, filed concurrently herewith, by Cohen et al., and entitled Method and apparatus for maintaining parallelism of layers and/or achieving desired thicknesses of layers during the electrochemical fabrication of structures. These patent filings are each hereby incorporated herein by reference as if set forth in full herein.

In Operation (7), operations 1.-6. are repeated as necessary to build up the structure from a plurality of adhered layers. The state of the process after forming four layers is illustrated by layers L1-L4 of FIG. 22G.

Figure 22H:
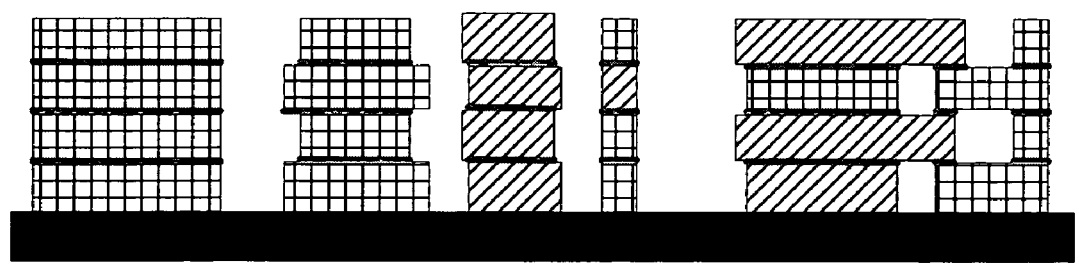

In Operation (8), the structure is released. Once the build is complete (e.g. formation of all layer is completed), the structure is released from any sacrificial material as shown in FIG. 22H. In some embodiments, the build may be singulated (i.e. diced) before release. Preferably, the structure is released by using an etchant that attacks the sacrificial material and exposed regions of any surface treatment material deposited between adjacent levels of sacrificial material. The etching operations preferably do not attack the build material or attack it only at a significantly lower rate. In the preferred embodiment, the structural material is nickel, the sacrificial material is copper and the surface treatment is electroless copper. In this scenario, the preferred etchant is a modified version of C-38 from Enthone where the modification includes the addition of corrosion inhibitor that helps protect the nickel.

In some alternatives, however, the surface treatment may not be amenable to removal by the same etchant that removes the sacrificial material. In these situations, it is necessary to use repeated cycles of two etchants. For example, sacrificial material etching, followed by a surface treatment etching operation, followed by a sacrificial material etching operation, etc. until the entire structure has been released (it may be desirable to have rinse operations occur between the sacrificial and surface preparation etch cycles).

Various additional alternatives to the process of FIG. 21 are possible. In a first group of alternative embodiments, additional steps may be taken to eliminate seed layer material or conductive surface treatment material from between regions of dielectric material on successive layers. For example, prior to performing Operation (4), an etching operation may be performed that selectively attacks the seed layer material and removes it where the dielectric material is to be deposited. In other alternative embodiments, it may not be necessary for the etchant to selectively attack the seed layer material but instead it may attack the conductive structural material as well and/or the conductive sacrificial material but due to the fact that the seed layer material is much thinner than the structural and sacrificial materials, it may be possible to remove the seed layer material prior to doing significant damage to the other materials.

In a second group of alternative embodiments, or as an add-on to the first group of alternative embodiments, it may be possible to locate a different seed layer material between regions of structural material on successive layers and regions of sacrificial material on successive layers. In still further alternatives, it may be possible to achieve etch stop barriers or at least effective etch stop barriers in regions where structural material overlays structural material on successive layers. The techniques of these alternative embodiments may be useful in minimizing interlayer adhesion failure as a result of etching operations that unintentionally but excessively undercut seed layer or surface treatment material located between successive layers of conductive structural material during the removal of the seed layer material or surface treatment material located between successive layers of conductive sacrificial material.

To locate a different seed layer material between regions of conductive structural material on successive layers and regions of conductive sacrificial material on successively layers, two additional operations may be added between Operations (2) and (3) of FIG. 21. The first of these operations includes the etching away of seed layer or surface treatment material that is not overlaid by conductive structural material. Thus the seed layer material or surface treatment material of Operation (1), block 601, may use a seed layer that is desirable for use between regions of structural material located on successive layers but not regions of sacrificial material located on successive layers. The second of these operations includes depositing a seed layer material into the regions of the previous layer exposed by the etching operation (the seed layer may also overlay the already deposited structural material. After this second operation, the process may continue as outlined in FIG. 21.

Figure 23:
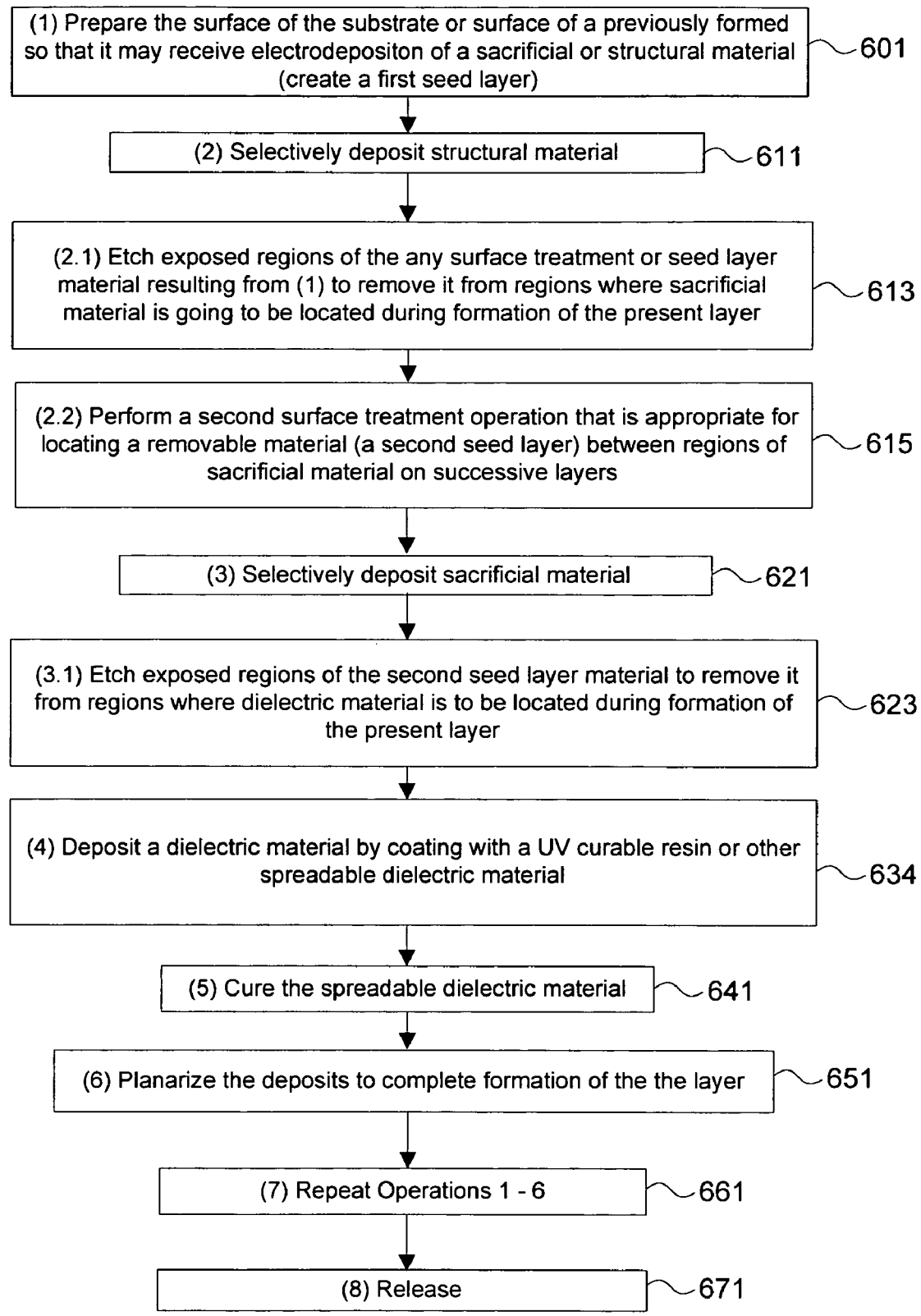
FIG. 23 provides a block diagram that sets forth primary operations associated with a process for forming a multi-layer structure according to an embodiment of the invention where seed layer materials are tailored for receiving specific building materials and where after deposition of the associated building material, exposed portions of the corresponding seed layer material is removed.

The added operations of the first and second groups of alternative embodiments are set forth in the block diagram of FIG. 23 where elements similar to those of FIG. 21 are indicated with like reference numerals. Blocks 613 and 615 specify operations (2.1) and (2.2) respectively. Operation (2.1) calls for etching away of the exposed portions of he seed layer or surface treatment material created in Operation (1). Operation (2.2) calls for the performance of a second surface treatment operation that applies an appropriate seed layer or surface treatment material to regions where sacrificial material is to be deposited (and possibly to regions where dielectric material is to be deposited). To implement the first group of alternative embodiments, an additional operation may be added to the above operations as indicated by Operation (3.1) of FIG. 23 (block 623) which calls for the etching of exposed regions of the second seed layer so that the seed layer material may be removed from regions of dielectric material that overlay one another on successive layers.

In a third group of alternative embodiments, the enhancements of the first and second group of alternative embodiments may be added, mutatis mutandis, to embodiments where the order of deposition of structural and sacrificial materials is reversed.

In a fourth group of alternative embodiments, the order of processing of the dielectric material, the conductive structural material, and conductive sacrificial material may be changed to have the dielectric material be the first or second material deposited with the other two materials being deposited as the first and third materials or as the second and third materials and in either order.

In a fifth group of alternative embodiments, the process of the first and second alternative embodiments may be added singly or together as enhancements to the fourth group of embodiments.

In still another group of alternative embodiments (i.e. the sixth such group) avoidance of unintended etching of seed layer material from between regions of structural conductive material deposited on successive layers may achieved without use of $2^{nd}$ seed layer materials. In some variations, the methods may be combined with the use of a $2^{nd}$ seed layer material particularly when the structural material is to be deposited after the sacrificial material. The enhancements of these alternative embodiments allow structural material associated with a given layer to overlay and directly contact structural material on a previous layer (over all or part of the common region or regions) or to allow structural material to be deposited onto a seed layer material that occupies only a portion of the region where conductive structural material is to exist on the present layer (if all of the region or regions where the structural material was to be deposited were to be occupied by the seed layer material then the build technique would fall within the first to fifth groups of alternative embodiments. This enhancement may be achieved in different ways depending on whether the conductive sacrificial material or conductive structural material is to be deposited first. In either case, a first seed layer material may be selectively deposited in a desired pattern or it may be blanket deposited and then later etched to form voids therein having the desired pattern. In some embodiments, a patterned mask used in depositing the seed layer material may be used in the selective deposition of the conductive sacrificial material while any mask used in the or etching of the seed layer material may be used in the selective deposition of the conductive structural material and/or in the selective deposition of any desired $2^{nd}$ seed layer material prior to depositing the conductive structural material. In variations of these alternatives, the selected pattern of openings in the seed layer may take a variety of forms that comprise:

1. A narrow region defining the boundary of the common region between structural material on the immediately preceding layer and structural material on the present layer;
2. A thin region defining an inwardly offset boundary of the common region between structural material on the immediately preceding layer and on the present layer;
3. The entire region or regions that are common to the intended location of structural material on the immediately preceding layer and structural material on the present layer;
4. The entire region or regions, with the exception of possibly a boundary region (that may be used to ensure conductive contact for all regions of the layer) that define the common region between structural material on the immediately preceding layer and on the present layer;
5. Any of patterns (1)-(4) with the exception that one or more relatively narrow seed layer fingers may extend over or through selected portions of the common regions (this helps ensure the existence of a legitimate conductive path to ensure that plating can occur everywhere.
6. Any desired pattern of openings in the seed layer in the common region that will allow direct bonding between regions of the conductive material located on separate layers
7. So long as all regions that are to receive sacrificial conductive material and conductive structural material have conductive material located below them (either as a result of conductive material on the previous layer or as a result of the seed layer deposited on the present layer) and so long as all such regions are connected by adequately conductive paths, the openings may also call for the removal of seed layer material from those portions of the present layer where dielectric material is to be located.

Once the desired pattern of openings is obtained, the structural material may be selectively or blanket deposited or if desired a second seed layer material may be deposited first.

In a seventh group of alternative embodiments, enhancements of the sixth group of embodiments may be applied, mutatis mutandis, to the removal of seed layer material that is located between regions of conductive sacrificial material on successive layers. Such removal may aid in effective release of the structure after it is formed.

In an eighth group of alternative embodiments, the conductive structural material, the conductive sacrificial material, or the dielectric material that is to be deposited first, may be deposited in a blanket manner as opposed to in a selective manner and then it may be selectively etched into to form patterned regions where one or both of the other materials will be deposited.

In a ninth group of alternative embodiments, more than one conductive structural material, more than one conductive sacrificial material, and/or more than one dielectric material may be used. Depending on the selective patterning method chosen, the 'minimum critical offset' may play a role in the types of structures that can be successfully formed.

In a tenth group of alternative embodiments, only two materials will be deposited on some layers (e.g. a conductive structural material and a conductive sacrificial material or a conductive sacrificial material and a dielectric material). Such embodiments may only require one selective masking operation per layer. Such embodiments may provide a cost effective approach for fabricating certain structures and would allow metal structures to be electrically isolated from the substrate.

In an eleventh group of alternative embodiments, an unpatterned dielectric deposition may be used to isolate metal structures from a conductive substrate.

In a twelfth group of alternative embodiments, structures that are extruded geometries in the Z-direction (i.e. the stacking direction of the layers, i.e. the direction perpendicular to the plane of layers) or which have a reduced cross-section in Z (i.e., no unsupported regions), the steps related to depositing a sacrificial material may be skipped.

In a thirteenth group of alternative embodiments, additional post layer formation operations may be performed. For example diffusion bonding may be performed to enhance interlayer adhesion.

Particular applications of some embodiments of the invention are illustrated in FIGS. 24A-24J, FIGS. 25A-25H, and FIGS. 26A-26J. In the illustration of FIGS. 24A-24J, the lower portion of a structure is formed from layers of a $1^{st}$ conductive material and a dielectric material while the upper portions of the structure are formed from layers of $1^{st}$ and $2^{nd}$ conductive materials where the $1^{st}$ conductive material in the lower portion of the structure will be a structural material and the $1^{st}$ conductive material in the upper portions will be removed as a sacrificial material. The $2^{nd}$ conductive material, in combination with the dielectric material will act as a cap to protect that portion of the $1^{st}$ conductive material that is to remain as part of the structure. Such processing may be used, for example, to form RF devices. Operations for forming the lower portion of the structure include:

1. Selectively depositing a metal (e.g. a metal desired for its electrical properties, such as copper, gold, or silver) using a patterned photoresist and, for example, electroplating.
2. Removing photoresist and thereafter filling spaces in the patterned metal with a dielectric material. The dielectric material may be a photoresist (if the same as the patterning resist-it did not need to be removed), polimide, glass, or any other dielectric material. One example is using Futurrex Protective Barrier Coating 3-6000. This material has a dielectric constant of 2.5 and can be cured at 150 deg C.
3. After the dielectric is hardened, planarizing both metal and the dielectric material. A variety of techniques can be used, including but not limited to fly-cutting, lapping, CMP, and mechanical polishing.
4. After the layer is planarized, depositing a seed layer. The seed layer can be, for example, evaporated or sputtered, and can be copper or any other platable metal.
5. Patterning the planarized layer with photoresist or a photosensitive polymer and then plating the desired metal.
6. Removing (e.g. stripping) the photoresist and thereafter removing the seed layer using a wet etch or anisotropic etch.
7. Repeating the operations of 1.-6. as necessary to form all layers to form a structure or partially completed structure that includes a desired metal and a dielectric. As it is intended that both the dielectric and metal form part of the structure no sacrificial etch is used to remove either.

This process has several advantages: (1) It can prevent the metal from oxidizing; (2) the dielectric helps support the metal and may make the structure more rigid, provide self packaging, and protection from shock and vibration, and (3) Use of the dielectric material may allow production of smaller electric devices, for example capacitors, RF devices, and the like.

After the parts (e.g. the lower layers of a structure) are encased, movable parts (e.g. the upper layers of a structure) can be fabricated on top. For example, some electric components can be encased within the lower layers and movable devices and/or other electric component can be fabricated in the upper layers. A cap of a $2^{nd}$ conductive material (e.g. nickel) may be used to protect the encased $1^{st}$ conductive material (e.g. copper) from an etchant that will be used to remove it from the upper layers. Of course in alternative embodiments, reversal of the order of forming metal/metal and dielectric/metal layers may reversed or even alternatingly used.

Figure 24A:
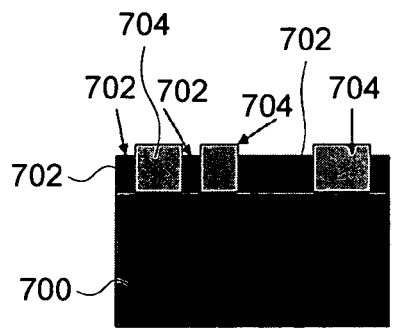
FIGS. 24A-24J illustrate an embodiment of the invention where the lower layers of a structure are formed with $1^{st}$ conductive material and a dielectric material while the upper layers of a structure are formed from $1^{st}$ and $2^{nd}$ conductive materials where the $1^{st}$ conductive material in the lower portion of the structure will be a structural material and the $1^{st}$ conductive material in the upper portions will be removed as a sacrificial material
Figure 24B:
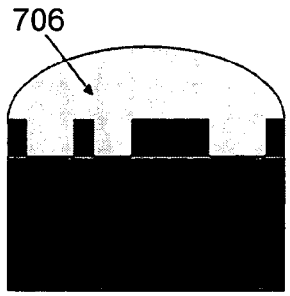
Figure 24C:
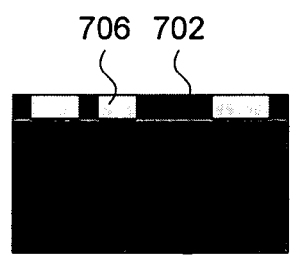
Figure 24D:
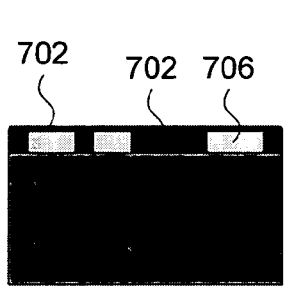
Figure 24E:
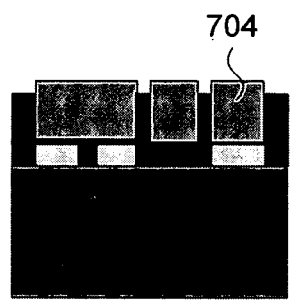
Figure 24F:
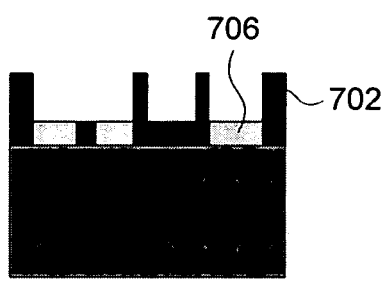
Figure 24G:
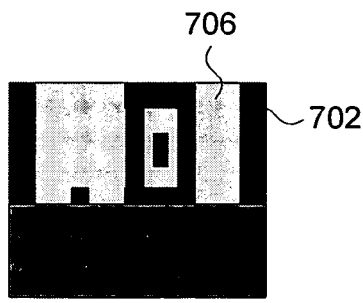
Figure 24H:
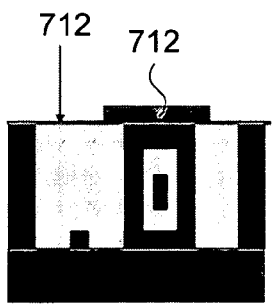
Figure 24I:
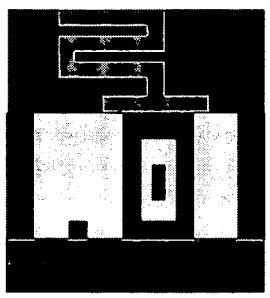
Figure 24J:
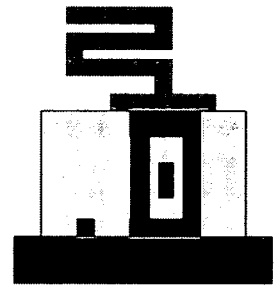
Figure 25A:
FIGS. 25A-25H and FIGS. 26A-26J depict process flow associated with two alternative embodiments of the invention for working with three mateials on a single layer
Figure 25B:
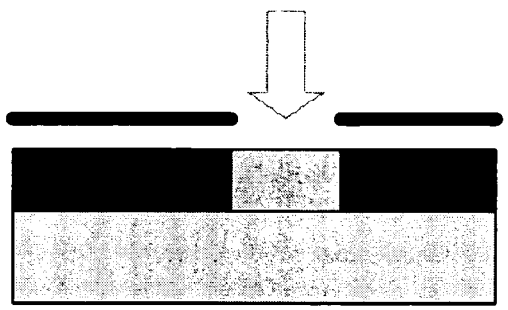
Figure 25C:
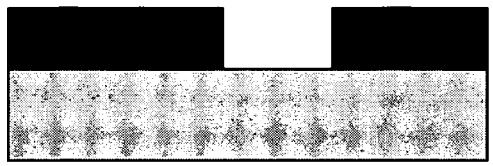
Figure 25D:
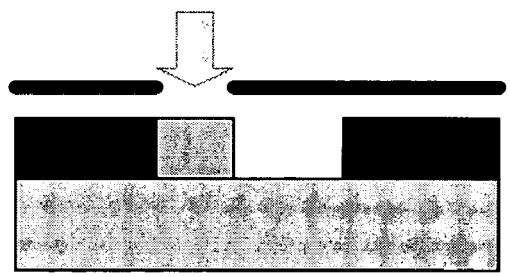
Figure 25E:
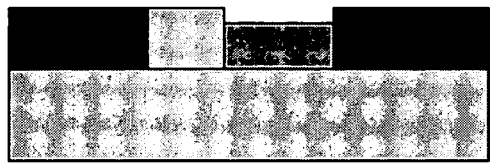
Figure 25F:
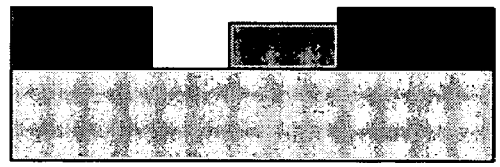
Figure 25G:
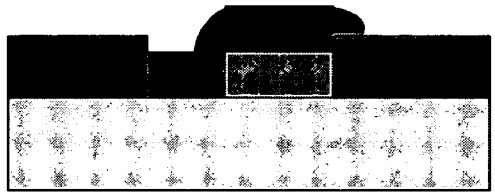
Figure 25H:
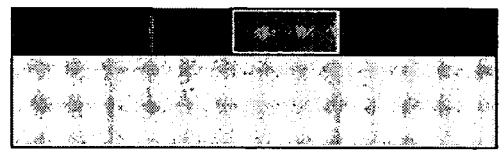
Figure 26A:
Figure 26B:
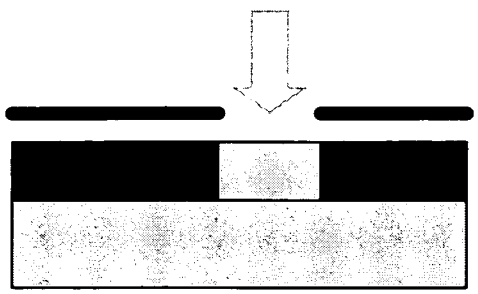
Figure 26C:
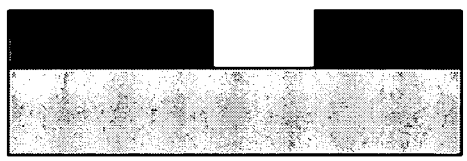
Figure 26D:
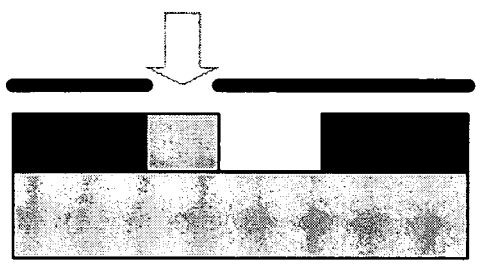
Figure 26E:
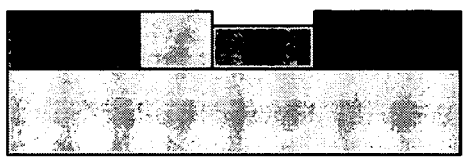
Figure 26F:
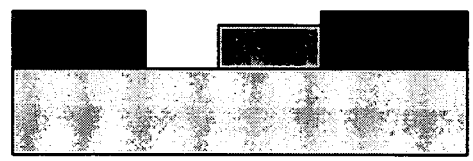
Figure 26G:
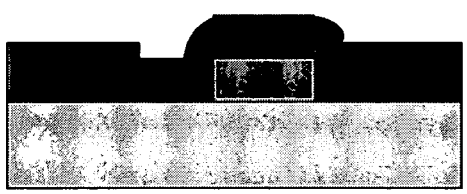
Figure 26H:
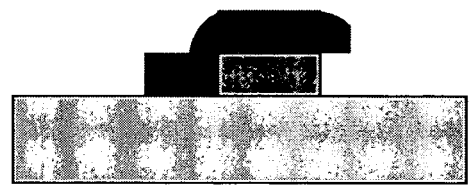
Figure 26I:
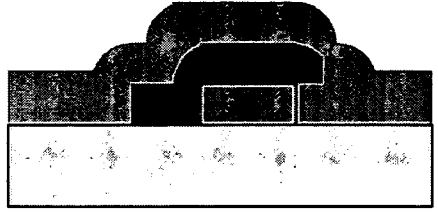
Figure 26J:
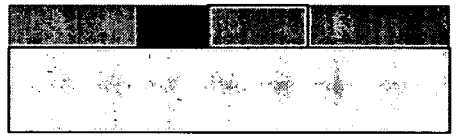

FIGS. 24A-24J depicts schematic side views various states of this dielectric/metal (e.g. dielectric/copper) and metal/metal (e.g. nickel/copper) fabrication process as applied to a specific structure. FIG. 24A depicts patterned copper 702 with photoresist 704 on a substrate 700. FIG. 24B depicts a coating of dielectric 706 filling voids in the copper where the photoresist was located. FIG. 24C depicts planarized dielectric 706 and copper 702. FIG. 24D depicts a deposited copper seed layer. FIG. 24E depicts a second layer of patterned copper with photoresist. FIG. 24F depicts that the photoresist has been removed and that exposed portions of the seed layer have been removed. FIG. 24G depicts the lower layers of a structure formed from copper and a dielectric (e.g. a passive RF component) after repeated operations have been performed to complete formation of the second layer and subsequent layers. FIG. 24H depicts formation of a capping pattern of a $2^{nd}$ metal, e.g. nickel, deposited (e.g. in a patterned photoresist) on a seed layer of the $2^{nd}$ metal. FIG. 24I depicts the state of the process after removal of the exposed portions of the seed layer, deposit of the $1^{st}$ conductive material, planarization and formation of subsequent layers of $1^{st}$ and $2^{nd}$ conductive materials (e.g. copper and nickel). FIG. 24J depicts the state of the process after the sacrificial portions of the $1^{st}$ conductive material have been removed (e.g by chemical etching).

FIGS. 25A-25H and FIGS. 26A-26J illustrate two methods for having three materials on the same layer. These processes avoid doing lithography on a layer with topography. These processes can be used for many applications. This process can be used, for example to make tips for spring probes using a different material for each or to make transformers or electronic components that require permalloy, a sacrificial metal and a structural another structural metal on the same layer, or in a process where a dielectric material and two metals are required on each layer. In alternative processes the procedures may be extended to allow four or more material to be placed on each layer. These methods may be used with positive resists and possibly with negative resists. The basic process operation, include: (1) Depositing photoresist, depicted in FIG. 25A and FIG. 26A, (2) exposing a first pattern for a first material to be deposited, depicted in FIG. 25B and FIG. 26B, (3) developing the first pattern to make openings in the photoresist for depositing the first material, depicted in FIG. 25C and FIG. 26C, (4) exposing the second pattern on the same resist layer defining locations where a first material is to be deposited, depicted in FIG. 25D and FIG. 26D, (5) depositing the first material, for example nickel, depicted in FIG. 25E and FIG. 26E, (6) developing the second pattern, depicted in FIG. 25F and FIG. 26F, (7) depositing the second material within the second pattern, depicted in FIG. 25G and FIG. 26G, and either (8A) Planarizing the photoresist, first material, and second material to complete formation of the layer, depicted in FIG. 25H, or (8B) removing the photoresist, depicted in FIG. 26H, then depositing a third material, depicted in FIG. 26I, and then planarizing, depicted in FIG. 26J.

In further alternative embodiments the processes of FIGS. 25A-25H and 26A-26J may be extended to the formation of additional layers. As necessary seed layer and removal operations may be added when dielectric substrates are used or when dielectric materials will be deposited during layer formation. Various other alternatives and modifications will be apparent to those of skill in the art upon review of the teachings herein.

Additional teachings, which may supplement the teaching set forth explicitly herein, concerning the formation of structures on dielectric substrates and/or the formation of structures that incorporate dielectric materials into the formation process and possibility into the final structures as formed are set forth in a number of additional patent applications. The first of these applications is U.S. Patent Application No. 60/534,184, filed Dec. 31, 2004, by Cohen, et al., which is entitled "Electrochemical Fabrication Methods Incorporating Dielectric Materials and/or Using Dielectric Substrates". The second of these applications is U.S. Patent Application No. 60/533,932, filed Dec. 31, 2004, by Cohen, et al., which is entitled "Electrochemical Fabrication Methods Using Dielectric Substrates". The third of these applications is U.S. Patent Application No. 60/533,891, filed Dec. 31, 2004, by Lockard, et al., which is entitled "Methods for Electrochemically Fabricating Structures Incorporating Dielectric Sheets and/or Seed layers That Are Partially Removed Via Planarization". A fourth such filing is U.S. Patent Application No. 60/533,895, filed Dec. 31, 2004, by Lembrikov, et al., which is entitled "Electrochemical Fabrication Method for Producing Multi-layer Three-Dimensional Structures on a Porous Dielectric" Each of these patent applications is hereby incorporated herein by reference as if set forth in full herein.

Further teachings about planarizing layers and setting layers thicknesses and the like are set forth in the following US Patent Applications: (1) U.S. Patent Application No. 60/534,159, filed Dec. 31, 2004, by Cohen et al. and which is entitled "Electrochemical Fabrication Methods for Producing Multi-layer Structures Including the use of Diamond Machining in the Planarization of Deposits of Material"; (2) U.S. Patent Application No. 60/534,183, filed Dec. 31, 2004, by Cohen et al. and which is entitled "Method and Apparatus for Maintaining Parallelism of Layers and/or Achieving Desired Thicknesses of Layers During the Electrochemical Fabrication of Structures"; (3) U.S. patent application Ser. No. 11/029220, filed concurrently herewith, by Jan. 3, 2005, and entitled "Method and apparatus for maintaining parallelism of layers and/or achieving desired thicknesses of layers during the electrochemical fabrication of structures". Each of these patent applications are hereby incorporated herein by reference as if set forth in full herein.

As noted herein above some embodiments may employ diffusion bonding or the like to enhance adhesion between successive layers of material. Various teachings concerning the use of diffusion bonding in electrochemical fabrication processes are set forth in U.S. patent application Ser. No. 10/841,834, filed May 7, 2004, by May 10, 2004, and which is entitled "System and method for rating documents comprising an image". The techniques disclosed in this referenced application may be combined with the techniques and alternatives set forth explicitly herein to derive additional alternative embodiments. This application is hereby incorporated herein by reference as if set forth in full.

As noted herein before, some embodiments may employ mask based selective etching operations in conjunction with blanket deposition operations. Some embodiments may form structures on a layer-by-layer basis but deviate from a strict planar layer on planar layer build up process in favor of a process that interlaces material between the layers. Such alternative build processes are disclosed in U.S. application Ser. No. 10/434,519, filed on May 7, 2003, entitled Methods of and Apparatus for Electrochemically Fabricating Structures Via Interlaced Layers or Via Selective Etching and Filling of Voids. The techniques disclosed in this referenced application may be combined with the techniques and alternatives set forth explicitly herein to derive additional alternative embodiments. This patent application is herein incorporated by reference as if set forth in full.

Further alternative embodiments are possible by combining the methods disclosed explicitly herein with the techniques disclosed in U.S. patent application Ser. No. 10/841,272, filed on May 7, 2004, by Adam Cohen et al., and entitled "Methods and Apparatus for Forming Multi-Layer Structures Using Adhered Masks". This referenced application is incorporated herein by reference as if set forth in full herein. This referenced application teaches various electrochemical fabrication methods and apparatus for producing multi-layer structures from a plurality of layers of deposited materials where some of the deposited materials are selectively deposited via an adhered mask that is temporarily contacted to the substrate or a previous formed layer or deposit of material.

Further alternative embodiments are possible by combining the methods disclosed explicitly herein with the techniques disclosed in any or all of the following patent applications: (1) U.S. patent application Ser. No. 10/697,597 filed on Oct. 29, 2003 by Michael. S. Lockard et al. and entitled "EFAB Methods and Apparatus Including Spray Metal or Powder Coating Processes"; (2) U.S. patent application Ser. No. 10/841,383 filed May 7, 2004 by Lockard, et al., and entitled "Electrochemical Fabrication Methods Using Transfer Plating of Masks" and/or with the techniques disclosed in U.S. patent application Ser. No. 10/607,931 filed on Jun. 27, 2003 by Elliot R. Brown et al. and entitled "Miniature RF and Microwave Components and Methods for Fabricating Such Components"; and (3) U.S. patent application Ser. No. 10/841,300, filed May 7, 2004 by Lockard, et al., and entitled "Methods for Electrochemically Fabricating Structures Using Adhered Masks, Incorporating Dielectric Sheets, and/or Seed layers That Are Partially Removed Via Planarization". These patent applications are hereby incorporated herein by reference as if set forth in full.

Various other embodiments of the present invention exist. Some of these embodiments may be based on a combination of the teachings set forth explicitly herein with various teachings incorporated herein by reference.

In view of the teachings herein, many further embodiments, alternatives in design and uses of the instant invention will be apparent to those of skill in the art. As such, it is not intended that the invention be limited to the particular illustrative embodiments, alternatives, and uses described above but instead that it be solely limited by the claims presented hereafter.

We claim:
1. A process for forming a multilayer three-dimensional structure on a dielectric substrate, comprising:
   (a) forming and adhering a first layer of material to a dielectric substrate or to a substrate containing at least one region of dielectric material;
   (b) forming and adhering at least one layer to a previously formed layer to build up a three-dimensional structure from a plurality of adhered layers;
   wherein the formation of the first layer of material comprises:
      (i) depositing a first seed layer material onto the substrate including at least some portions of the substrate that are not to receive a selected one of a structural material and sacrificial material;
      (ii) depositing a selected one of structural material and sacrificial material onto the first seed layer material over those portions of the substrate that are to receive the selected one of structural material and sacrificial material, wherein the portions that are to receive the selected one are less than all portions of the substrate;
      (iii) removing portions of the first seed layer material that are not located between the selected one and the substrate or located adjacent to the selected one;
      (iv) after removing portions of the first seed layer depositing a second seed layer material onto those portions of the substrate that are to receive a non-selected one of the structural material and sacrificial material;
      (v) depositing the non-selected one of the structural material and sacrificial material onto the second seed layer material over those portions of the substrate that are to receive the non-selected one of structural material and sacrificial material;
      (vi) planarizing the deposited selected one of the structural material and sacrificial material and the deposited non-selected one of the structural material and sacrificial material to a height corresponding to a desired thickness of the first layer.

2. The process of claim 1 additionally comprising the deposition of a first adhesion layer material onto at least those areas of the substrate that are to receive the selected one of the structural material and sacrificial material.

3. The process of claim 2 additionally comprising removing any first adhesion layer material, after removing the portions of the first seed layer material that are not covered by the selected one of the structural material and sacrificial material such that remaining portions of the first adhesion layer material are located only between the first seed layer material and the substrate.

4. The process of claim 1 additionally comprising the deposition of a second adhesion layer material, after removing the first seed layer material onto at least those areas of the substrate to receive the non-selected one of the structural material and sacrificial material.

5. The process of claim 4 additionally comprising removing any second adhesion layer material that is not covered by the non-selected one of the structural material and sacrificial material such that remaining portions of the second adhesion layer material are located only between the second seed layer material and the substrate.

6. The process of claim 4 additionally comprising the deposition of a first adhesion layer material onto at least those areas of the substrate to receive the selected one of the structural material and sacrificial material.

7. The process of claim 6 wherein the first adhesion layer material is substantially the same as the second adhesion layer material.

8. The process of claim 6 wherein the first adhesion layer material is different from the second adhesion layer material.

9. The process of claim 2 wherein the deposition of the first seed layer material locates the material on the first seed layer material on the substrate in regions extending beyond the regions to be occupied by the selected one of the structural material and sacrificial material.

10. A process for forming a multilayer three-dimensional structure on a dielectric substrate, comprising:
    (a) forming and adhering a first layer of material to a dielectric substrate or to a substrate containing at least one region of dielectric material;
    (b) forming and adhering at least one layer to a previously formed layer to build up a three-dimensional structure from a plurality of adhered layers;
    wherein the formation of the first layer of material comprises:
       (i) depositing a first seed layer material onto the substrate, wherein the deposition of the first seed layer material locates the first seed layer material on the substrate to only those regions to be occupied by a selected one of the structural material and sacrificial material and the deposition of the first seed layer material results in the first seed layer material overlaying a masking material that is located in regions where the selected one of the structural material and sacrificial material is not to be located:
       (ii) depositing a selected one of structural material and sacrificial material onto the first seed layer material over those portions of the substrate that are to receive the selected one of structural material and sacrificial material, wherein the portions that are to receive the selected one are less than all portions of the substrate;
       (iii) removing the masking material and removing portions of the first seed layer material that are not located between the selected one and the substrate;
       (iv) depositing a second seed layer material onto those portions of the substrate that are to receive a non-selected one of the structural material and sacrificial material;
       (v) depositing the non-selected one of the structural material and sacrificial material onto the second seed layer material over those portions of the substrate that are to receive the non-selected one of structural material and sacrificial material;
       (vi) planarizing the deposited selected one of the structural material and sacrificial material and the deposited non-selected one of the structural material and sacrificial material to a height corresponding to a desired thickness of the first layer.

11. The process of claim 3 wherein the deposition of the second seed layer material results in the second seed layer material overlaying regions occupied by the selected one of the structural material and sacrificial material.

12. The process of claim 3 wherein the deposition of the second seed layer material results in the second seed layer material being only located to those regions where the second material is to be located.

13. A process for forming and adhering a layer of material to a dielectric substrate or to a substrate having at least one region of dielectric material, comprising:
    (a) depositing a first seed layer material onto the substrate;
    (b) depositing the selected one of structural material and sacrificial material onto the first seed layer material over those portions of the substrate that are to receive the selected one of structural material and sacrificial material, wherein the portions that are to receive the selected one are less than all portions of the substrate;

(c) removing portions of the first seed layer material that are not located between the selected one and the substrate or located adjacent to the selected one;

(d) depositing a second seed layer material onto those portions of the substrate that are to receive a non-selected one of the structural material and sacrificial material;

(e) depositing a the non-selected one of the structural material and sacrificial material onto the second seed layer material over those portions of the substrate that are to receive the non-selected one of structural material and sacrificial material;

(f) planarizing the deposited selected one of the structural material and sacrificial material and the non-selected one of the structural material and sacrificial material to a height corresponding to a desired thickness of the first layer.

* * * * *